(12) United States Patent
Song et al.

(10) Patent No.: US 11,641,243 B2
(45) Date of Patent: May 2, 2023

(54) METHOD AND DEVICE FOR MEASURING CHARACTERISTICS OF RF CHAINS

(71) Applicant: POSTECH RESEARCH AND BUSINESS DEVELOPMENT FOUNDATION, Pohang-si (KR)

(72) Inventors: Hojin Song, Pohang-si (KR); Seunghoon Lee, Daegu (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 0 days.

(21) Appl. No.: 17/633,943

(22) PCT Filed: Aug. 10, 2020

(86) PCT No.: PCT/KR2020/010576
§ 371 (c)(1),
(2) Date: Feb. 8, 2022

(87) PCT Pub. No.: WO2021/025545
PCT Pub. Date: Feb. 11, 2021

(65) Prior Publication Data
US 2022/0294542 A1  Sep. 15, 2022

(30) Foreign Application Priority Data

Aug. 8, 2019  (KR) .......... 10-2019-0096947
Nov. 29, 2019  (KR) .......... 10-2019-0157518

(51) Int. Cl.
*H04B 17/15* (2015.01)
*H04B 17/11* (2015.01)
*H04B 17/00* (2015.01)

(52) U.S. Cl.
CPC ......... *H04B 17/15* (2015.01); *H04B 17/0085* (2013.01); *H04B 17/11* (2015.01)

(58) Field of Classification Search
CPC .... H04B 17/15; H04B 17/0085; H04B 17/11; H04B 17/14; G01R 27/06
(Continued)

(56) References Cited

U.S. PATENT DOCUMENTS

| 7,683,842 | B1 | 3/2010 | Engel | |
|---|---|---|---|---|
| 2009/0085586 | A1* | 4/2009 | Anderson | ............... H04L 12/10 324/705 |
| 2009/0153158 | A1 | 6/2009 | Dunn | |

(Continued)

FOREIGN PATENT DOCUMENTS

| KR | 10-2017-0113916 A | 10/2017 |
|---|---|---|
| KR | 10-2019-0043080 A | 4/2019 |
| KR | 10-2019-0052294 A | 5/2019 |

OTHER PUBLICATIONS

International Search Report for PCT/KR2020/010576, dated Nov. 25, 2020.

(Continued)

*Primary Examiner* — Don N Vo
(74) *Attorney, Agent, or Firm* — Morgan, Lewis & Bockius LLP

(57) ABSTRACT

A measuring device may include: a signal generator for generating a test signal; and a measurement control unit that inputs the generated test signal to a radio frequency (RF) chain including at least one circuit element, detects output signals of a first diode, a second diode, and a third diode which receive, as input signals, signals generated on the basis of a coupled signal for an input test signal of a circuit element of the at least one circuit element and a coupled signal for an output test signal of the circuit element, and measures an S-parameter for the circuit element on the basis of a component signal of the third frequency in the output signal of the first diode, a component signal of the third (Continued)

frequency in the output signal of the third diode, and the output signal of the second diode.

20 Claims, 16 Drawing Sheets

(58) Field of Classification Search
USPC ........................................ 455/226.1; 375/224
See application file for complete search history.

(56) References Cited

U.S. PATENT DOCUMENTS

| 2017/0307669 | A1* | 10/2017 | Forstner | ................. | G01R 27/28 |
| 2019/0140721 | A1 | 5/2019 | Lee | | |
| 2019/0369158 | A1* | 12/2019 | Murao | .................... | H03F 3/193 |
| 2020/0244294 | A1* | 7/2020 | Itkin | .................... | H04B 1/1027 |

OTHER PUBLICATIONS

Office Action issued in KR10-2019-0096947, dated Nov. 18, 2021, 5 pp.
Office Action Action issued in KR10-2019-0157518, dated Nov. 18, 2021, 5 pp.
Thalayasingam et al., "Narrow-Band Vector Intermodulation Measurements," Microwave Journal, Mar. 2010, vol. 54 Issue 3, p. 78-90. 7p.
Cakaj et al., "Modeling of Interference Caused by Uplink Signal for Low Earth Orbiting Satellite Ground Stations," 17th IASTED International Conference on Applied Simulation and Modelling, ASM 2008, pp. 187-191.
Scott, Jonathan B., et al., "A New Instrument Architecture for Millimetre-Wave Time-Domain Signal Analysis," In 63rd ARFTG Conference, 2004, 5 pages.

\* cited by examiner

METHOD AND DEVICE FOR MEASURING CHARACTERISTICS OF RF CHAINS

TECHNICAL FIELD

The disclosure relates to a method and a device for measuring characteristics of radio frequency (RF) chains, and more particularly, to a method and a device for measuring electrical characteristics of circuit elements included in an RF chain and adjusting a circuit element value.

BACKGROUND ART

A radio frequency (RF) chain in wireless communication may convert an intermediate frequency signal into a radio frequency signal, and may amplify an amplitude of a signal and then may transmit the amplified signal through an antenna. As transmitting signals by using beamforming technology in a high frequency band is recently considered, the number of RF chains included in each communication device may increase and circuit elements of the RF chains may be set to operate in a high frequency band. In order to operate the RF chains normally, it is necessary to measure electrical characteristics of each circuit element of the RF chains and to adjust a value of the circuit element appropriately.

DISCLOSURE OF INVENTION

Technical Problem

Accordingly, various embodiments provide a method and a device for measuring characteristics of a radio frequency (RF) chain.

In addition, various embodiments provide a method and a device for measuring electrical characteristics of an RF chain and circuit elements included in the RF chain.

In addition, various embodiments provide a method and a device for measuring a size of an S-parameter and a response speed of a circuit element by using a test signal (for example, a 2-tone test signal) including a plurality of frequency component signals.

In addition, various embodiments provide a method and a device for performing self-calibration based on an S-parameter.

Solution to Problem

According to various embodiments of the disclosure, a measurement device includes: a signal generator configured to generate a test signal including a component signal of a first frequency and a component signal of a second frequency; and a measurement controller configured to: input the generated test signal to a radio frequency (RF) chain including at least one circuit element; detect output signals of a first diode, a second diode, and a third diode which receive, as input signals, signals generated based on a coupled signal regarding an input test signal of a circuit element of the at least one circuit element, and based on a coupled signal regarding an output test signal of the circuit element; and measure an S-parameter regarding the circuit element, based on a component signal of a third frequency in the output signal of the first diode, a component signal of the third frequency in the output signal of the third diode, and the output signal of the second diode. The coupled signal regarding the input test signal of the circuit element may be divided into the input signal of the first diode and a first input signal by a first power divider, and the coupled signal regarding the output test signal of the circuit element may be divided into the input signal of the third diode and a second input signal by a second power divider, and the input signal of the second diode may be a combined signal that is generated by a power combiner based on the first input signal and the second input signal, and the third frequency may be a difference between the first frequency and the second frequency.

According to various embodiments of the disclosure, an operating method of a measurement device includes: generating a test signal including a component signal of a first frequency and a component signal of a second frequency; inputting the generated test signal to a radio frequency (RF) chain including at least one circuit element; detecting output signals of a first diode, a second diode, and a third diode which receive, as input signals, signals generated based on a coupled signal regarding an input test signal of a circuit element of the at least one circuit element, and based on a coupled signal regarding an output test signal of the circuit element; and measuring an S-parameter regarding the circuit element, based on a component signal of a third frequency in the output signal of the first diode, a component signal of the third frequency in the output signal of the third diode, and the output signal of the second diode. The coupled signal regarding the input test signal of the circuit element may be divided into the input signal of the first diode and a first input signal by a first power divider, and the coupled signal regarding the output test signal of the circuit element may be divided into the input signal of the third diode and a second input signal by a second power divider, and the input signal of the second diode may be a combined signal that is generated by a power combiner based on the first input signal and the second input signal, and the third frequency may be a difference between the first frequency and the second frequency.

According to various embodiments of the disclosure, a measurement device includes: a signal generator configured to generate a test signal including component signals of at least three frequencies which are different from one another; and a measurement controller configured to: input the generated test signal to a radio frequency (RF) chain including at least one circuit element; detect an output signal of a first diode which receives, as an input signal, at least part of a coupled signal regarding an input test signal of a circuit element of the at least one circuit element, and an output signal of a second diode which receives, as an input signal, at least part of a coupled signal regarding an output test signal of the circuit element; and measure an S-parameter regarding the circuit element, based on a frequency component signal in the output signal of the first diode and the frequency component signal in the output signal of the second diode.

According to various embodiments of the disclosure, an operating method of a measurement device includes: generating a test signal including component signals of at least three frequencies which are different from one another; inputting the generated test signal to a radio frequency (RF) chain including at least one circuit element; detecting an output signal of a first diode which receives, as an input signal, at least part of a coupled signal regarding an input test signal of a circuit element of the at least one circuit element, and an output signal of a second diode which receives, as an input signal, at least part of a coupled signal regarding an output test signal of the circuit element; and measuring an S-parameter regarding the circuit element, based on a frequency component signal in the output signal of the first diode and the frequency component signal in the output signal of the second diode.

Advantageous Effects of Invention

The device and the method according to various embodiments of the disclosure may measure electrical characteristics (for example, an S-parameter) of an individual circuit, which operates in a millimeter wave band, in a low-frequency band, by using an inter modulation phenomenon of a diode. Accordingly, according to various embodiments of the disclosure, functions necessary for measuring a circuit operating in a high frequency band may be included in a chip, and a cost required to measure and test may be noticeably reduced.

When a measurement circuit according to various embodiments of the disclosure is used for designing a multiple input, multiple output (MIMO) antenna system, a test using a probe may not be required for every channel, and a time required to measure and test may be noticeably reduced. In addition, since a plurality of channels are measured simultaneously according to various embodiments of the disclosure, the measurement device and/or the method according to various embodiments of the disclosure may be utilized as a self-calibration function for reducing a relative error between channels. For example, by reducing a relative error between channels, exact and precise analogue beamforming and/or beam tracing is possible, and a problem of nonuniformity of performance that a millimeter wave application system has may be solved.

The effect achieved in the disclosure is not limited to those mentioned above, and other effects that are not mentioned above may be clearly understood to those skilled in the art based on the description provided below.

BEST MODE FOR CARRYING OUT THE INVENTION

Terms used in the disclosure are used to describe specified embodiments and are not intended to limit the scope of other embodiments. The terms of a singular form may include plural forms unless otherwise specified. All of the terms used herein, which include technical or scientific terms, may have the same meaning that is generally understood by a person skilled in the art. It will be further understood that terms, which are defined in a dictionary, may be interpreted as having the same or similar meanings as or to contextual meanings of the relevant related art and not in an idealized or overly formal way, unless expressly so defined herein in the disclosure. In some cases, even if the terms are terms which are defined in the specification, they should not be interpreted as excluding embodiments of the present disclosure.

In various embodiments of the disclosure described below, hardware-wise approach methods will be described by way of an example. However, various embodiments of the disclosure include technology using both hardware and software, and thus do not exclude software-based approach methods.

The disclosure relates to a device and a method for measuring characteristics of a radio frequency (RF) chain. Specifically, the disclosure describes techniques for measuring characteristics of circuit elements included in each of RF chains in a wireless communication system, and for adjusting a circuit element value. Various embodiments of the disclosure may be applied to a field that utilizes an RF circuit (for example, an RF circuit utilizing array antenna-based analogue beamforming transmitter and receiver, and a method of operating an RF circuit.

Various embodiments of the disclosure may be applied to a field that utilizing an RF circuit (for example, an RF circuit utilizing array antenna-based analogue beamforming transmitter and receiver), and a method of operating an RF circuit.

As used herein, terms indicating signals, terms indicating circuit elements, terms indicating components of a device are merely examples for convenience of explanation. Accordingly, the disclosure is not limited to the terms described below, and other terms having the same technical meanings may be used.

In addition, in the disclosure, the expression "exceeding" or "being less than" may be used to determine whether a specific condition is satisfied, fulfilled, but these are just for expressing one example and do not exclude the expression "being greater than or equal to" or "being less than or equal to". The condition described by "being greater than or equal to" may be substituted with "exceeding", the condition described by "being less than or equal to" may be substituted with "being less than", and the condition described by "being greater than or equal to and less than" may be substituted with "exceeding and being less than or equal to".

Figure 1:
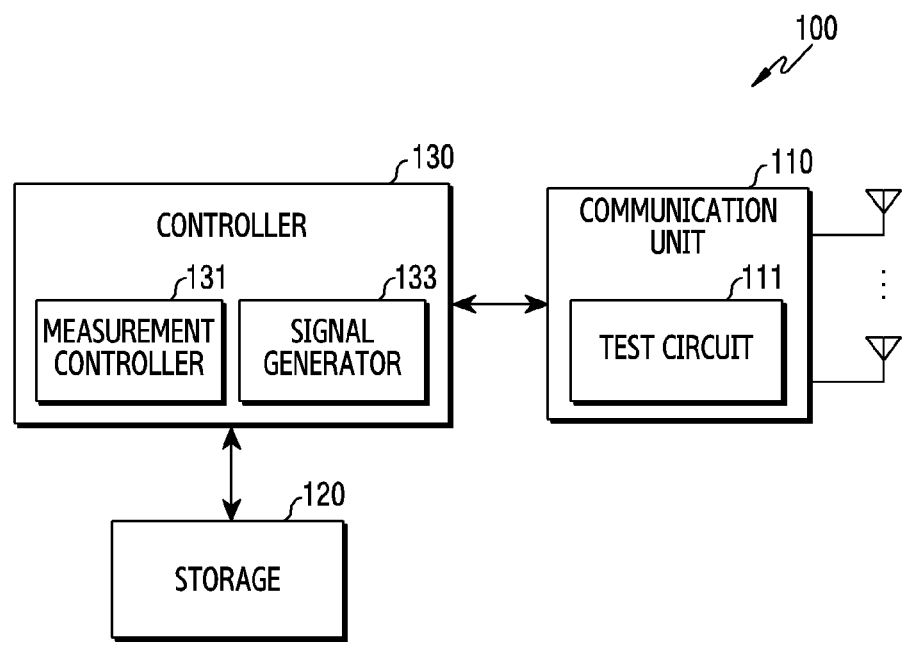
FIG. 1 is a view illustrating a configuration of a measurement device according to various embodiments.

FIG. 1 illustrates a configuration of a measurement device according to various embodiments. The configuration illustrated in FIG. 1 may be understood as a configuration of a measurement device 100. The term "unit" or terms ending with suffixes "-er," and "-or" used in the following descriptions refer to a unit processing at least one function or operation, and may be implemented by hardware, software, or a combination of hardware and software.

Referring to FIG. 1, the measurement device includes a communication unit 110, a storage 120, and a controller 130.

The communication unit 110 performs functions for transmitting and receiving signals through a wireless channel. For example, the communication unit 110 may perform a function of converting between a baseband signal and a bit stream according to a physical layer standard of a system. For example, when transmitting data, the communication unit 110 may generate complex symbols by encoding and modulating a transmission bit stream. In addition, when receiving data, the communication unit 110 may restore a reception bit stream by demodulating and decoding a baseband signal. In addition, the communication unit 110 may up-convert a baseband signal into an RF band signal, and then may transmit the signal via an antenna, and may down-convert an RF band signal received via an antenna into a baseband signal. For example, the communication unit 110 may include a transmission filter, a reception filter, an amplifier, a mixer, an oscillator, a digital-to-analogue converter (DAC), an analogue-to-digital converter (ADC), etc.

In addition, the communication unit 110 may include a plurality of transmission and reception paths. Furthermore, the communication unit 110 may include at least one antenna array including a plurality of antenna elements. In the hardware aspect, the communication unit 110 may be configured by a digital circuit and an analog circuit (for example, a radio frequency integrated circuit (RFIC)). Herein, the digital circuit and the analogue circuit may be implemented as a single package. In addition, the communication unit 110 may include a plurality of RF chains. Furthermore, the communication unit 110 may perform beamforming.

The communication unit 110 may transmit and receive signals as described above. Accordingly, an entirety or a portion of the communication unit 110 may be referred to as a "transmitter," "receiver," or "transceiver." In addition, in the following descriptions, transmitting and receiving via a wireless channel may be used as a meaning including processing by the communication unit 110 as described above.

In various embodiments, the communication unit 110 may include a test circuit 111. The test circuit 111 may be built-in at least one chip included in the communication unit 110. For example, the test circuit 111 may include at least one built-in tester. In various embodiments, the built-in tester may be referred to as a tester, a built-in tester circuit, a built-in self tester, or a built-in self tester circuit. Each built-in tester may include at least one of coupler(s), diode(s), resistor(s), power divider(s), or power combiner(s).

In various embodiments, each RF chain of the communication unit 110 may include a plurality of circuit elements (for example, an amplifier, a phase shifter, a mixer, and/or a local oscillator), and each circuit element may be disposed between two testers. The two testers may measure a signal related to characteristics of an input end and an output end of each circuit element, which is disposed therebetween, and may transmit the result of measurement to a measurement controller 131. In the disclosure, the term 'RF chain' may be used interchangeably with a 'channel' or 'module'.

The storage 120 may store data such as a basic program for the operation of the measurement device, an application program, configuration information, etc. The storage 120 may be configured by a volatile memory, a nonvolatile memory, or a combination of a volatile memory and a nonvolatile memory. In addition, the storage 120 may provide stored data according to a request of the controller 130.

The controller 130 may control overall operations of the measurement device. For example, the controller 130 may transmit and receive signals via the communication unit 110. In addition, the controller 130 may write and read out data on or from the storage 120. In addition, the controller 130 may perform functions of a protocol stack required by communication standards. To achieve this, the controller 130 may include at least one processor or micro processor, or may be a portion of a processor. In addition, a portion of the communication unit 110 and the controller 130 may be referred to as a communication processor (CP).

According to various embodiments, the controller 130 may include the measurement controller 131 and a signal generator 133. The measurement controller 131 may include at least one of: a detector (for example, a detector 730) to detect a result of measurement from the test circuit 111; a digital controller (for example, a digital controller 750) to receive the result of measurement from the detector, to determine electrical characteristics of each circuit element based on the result of measurement, and to generate a control value for each circuit element based on the measured electrical characteristics; and a serial peripheral interface (SPI) (for example, an SPI 740) to transmit the control value to each circuit element in order to apply the control value to each circuit element, although they are not illustrated.

In various embodiments, the measurement device (for example, the measurement device 100) may be an entity that performs wireless communication in a wireless communication system. For example, the measurement device may be a terminal or a base station. In various embodiments, the base station may be indicated by 'access point (AP),' 'eNodeB (eNB),' 'gNodeB (gNB),' '5$^{th}$ generation node (5G node),' 'wireless point,' 'transmission/reception point (TRP)' or other terms having the same technical meaning, in addition to 'base station.' In addition, the terminal may be indicated by 'user equipment (UE),' 'mobile station,' 'subscriber station,' 'remote terminal,' 'Nireless terminal,' or 'user device' or other terms having the same technical meaning, in addition to 'terminal.'

In various embodiments, the measurement device (for example, the measurement device 100) may be separate from an entity that performs wireless communication in a wireless communication system. For example, the measurement device may be a device for calibrating a circuit element in a factory which produces RF chips of a terminal and/or a base station. In this case, the measurement device may not include at least one of the communication unit 110 or the storage 120.

According to various embodiments, the controller 130 may control the measurement device to perform operations according to various embodiments, which will be described below.

Hereinafter, various techniques for measuring characteristics of an RF chain will be described. In various embodiments, measuring characteristics of an RF chain may include measuring electrical characteristics of individual circuit elements included in the RF chain.

According to an embodiment, characteristics of an RF chain may be measured by using a probe station. According to a measurement technique based on a probe station, electrical characteristics of a chip may be identified by bringing a probe into contact with a pad in a semiconductor chip or a board. According to the measurement technique based on the probe station, since electrical characteristics of a chip are measured on a position close to a measurement reference surface, electrical characteristics of a circuit (for example, a circuit operating in a millimeter wave (mmWave) band) may be well measured. The measurement technique based on the probe station may have an advantage of measuring an inter-channel crosstalk by using a plurality of probes in identifying electrical characteristics of a phase array antenna-based system such as a $5^{th}$ generation (5G) system (or a new radio (NR) system). However, the measurement technique based on the probe station may not guarantee precise measurement due to interference between circuit elements.

According to an embodiment, characteristics of an RF chain may be measured based on a measurement technique based on a loop-back structure. According to the measurement technique based on the loop-back structure, electrical characteristics of an RF chain may be measured based on a loop-back structure which is formed by directly connecting an RF chain of a transmitter and an RF chain of a receiver, and returns back to an intermediate frequency end through the RF chains of the transmitter and the receiver, which operate in a millimeter wave band at the intermediate frequency end. For example, according to the measurement technique based on the loop-back structure, electrical characteristics of an RF chain may be measured by controlling a frequency by using a digital-to-analogue converter (DAC)/analogue-to-digital converter (ADC) built-in a chip set, and by identifying a vector quantity of a loop-back signal.

According to an embodiment, characteristics of an RF chain may be measured by a measurement technique based on a vector network analyzer (VNA) structure. According to the VNA structure, a separate measurement circuit for measuring the RF chain may be built in the RF chain. According to the measurement technique based on the VNA structure, a test signal from a low power oscillator may be transmitted to an input end of a transmitter or a receiver through a coupler, and may pass only through a measurement target RF chain by using a plurality of RF switches. Furthermore, the characteristics (for example, amplitude and/or phase characteristics of a circuit) of the RF chain may be identified by measuring a signal passing through the measurement target RF chain by using an I/Q receiver.

As described above, the measurement technique based on the probe station is a technique for measuring a measurement target RF chain by using an external measurement device. In order to apply the measurement technique based on the probe station, a probe pad may be required to be disposed in the measurement target RF chain, and a probe corresponding to a distal end electrode of the external measurement device may be required to exactly contact the probe pad. In addition, according to the measurement technique based on the probe station, it may be possible to measure an inter-channel crosstalk by using a plurality of probes, but it may be difficult to precisely measure due to interference between circuit elements. When individual measurement is performed for each channel by using a single probe, the measurement technique based on the probe station may have technical limitations that make it difficult to measure inter-channel crosstalk characteristics. In addition, when iterative measurement is performed for measurement based on the probe station, a time loss such as degradation of productivity caused by the iterative measurement may occur. Furthermore, in a system of a millimeter wave band such as 5G, equipment and/or facilities which have low durability and are expensive, such as a high-performance ultrahigh frequency network analyzer, a probe, a cable, may be required to perform measurement based on the probe station.

As described above, the measurement technique based on the loop-back structure may include operations of inputting, by a low-priced probe device operating in a low frequency, a test signal of an intermediate frequency into a chip, and identifying whole electrical characteristics of a transmitter and a receiver connected in a loop-back structure. Herein, the test signal of the intermediate frequency may be converted into a millimeter wave band by a frequency converter in the transmitter and the receiver of the loop structure. However, the measurement technique based on the loop-back structure may have a disadvantage that it is difficult to identify electrical characteristics of individual circuit elements included in the transmitter and the receiver, such as a low noise amplifier (LNA), a mixer, a filter. In addition, when an output from an amplifier of the transmitter is directly inputted to an LNA of the receiver according to the loop-back structure, a signal having high power is inputted to the LNA, and accordingly, a result of measurement may be distorted.

According to the measurement technique based on the VNA structure as described above, a test circuit capable of performing functions of an external measurement device may be built in a measurement target RF chain in order to measure an individual circuit of a transmitter or a receiver, and electrical characteristics of the RF chain may be measured by using the test circuit. However, a plurality of RF switches may be required on each reference surface in order to measure a plurality of measurement target RF chains or circuit elements by using the test circuit included in the chip. Accordingly, complexity of the whole circuit may increase, and it may be difficult to identify exact characteristics of an individual circuit element such as a low noise amplifier, a mixer, a filter included in the transmitter and/or receiver. In particular, uncertainty of measurement may increase due to a characteristic deviation between RF switches, which are used to share a test circuit in a phase array antenna, and an elongated transmission line.

Accordingly, various embodiments of the disclosure provide a method and a device for measuring characteristics of an RF chain.

In addition, various embodiments provide a method and a device for measuring electrical characteristics of circuit elements included in an RF chain, and for adjusting a circuit element value.

In addition, various embodiments provide a method and a device for self-testing a circuit included in a transmitter and/or a receiver operating in a millimeter wave band.

In addition, various embodiments provide an integrated circuit in a chip for measuring electrical characteristics of an individual circuit element included in a transmitter or a receiver by using a self-test function, and for self-calibrating a defect and/or an error derived, based on the measured characteristics, and an operating method thereof.

In addition, various embodiments provide a method and a device for self-calibration for enhancing overall system performance by collectively measuring a plurality of RF chains in a phase array antenna, measuring a performance deviation between RF chains, and measuring a crosstalk between RF chains.

In addition, various embodiments provide a method and a device for measuring an S-parameter regarding each circuit element by using the advantage of the probe station technique which directly measures a test signal on a reference surface of a circuit, and an operation of transmitting and receiving a low-frequency band signal through a loop-back structure.

In addition, various embodiments provide a built-in tester (BiT) (for example, including a coupled-line directional coupler, a diode) in a chip, for measuring characteristics of an individual circuit of a measurement target transmitter and/or a receiver by using a low-frequency test signal (for example, a 2-tone test signal, a pulse) inputted from the outside, and an operating method thereof.

In addition, various embodiments provide a method and a device for measuring an S-parameter of an individual circuit element operating in a millimeter wave band.

In addition, various embodiments provide a self-calibration method and a device for operating an RF transceiver appropriately by measuring characteristics of each circuit element or RF chain, measuring an error of a circuit element value or an error between RF chains, and removing the error.

In addition, various embodiments provide a method and a device for self-testing an antenna beam pattern in an array antenna system including a transmitter or receiver chip based on a BiT technique, and calibrating the beam pattern according to a result of self-testing.

Figure 2:
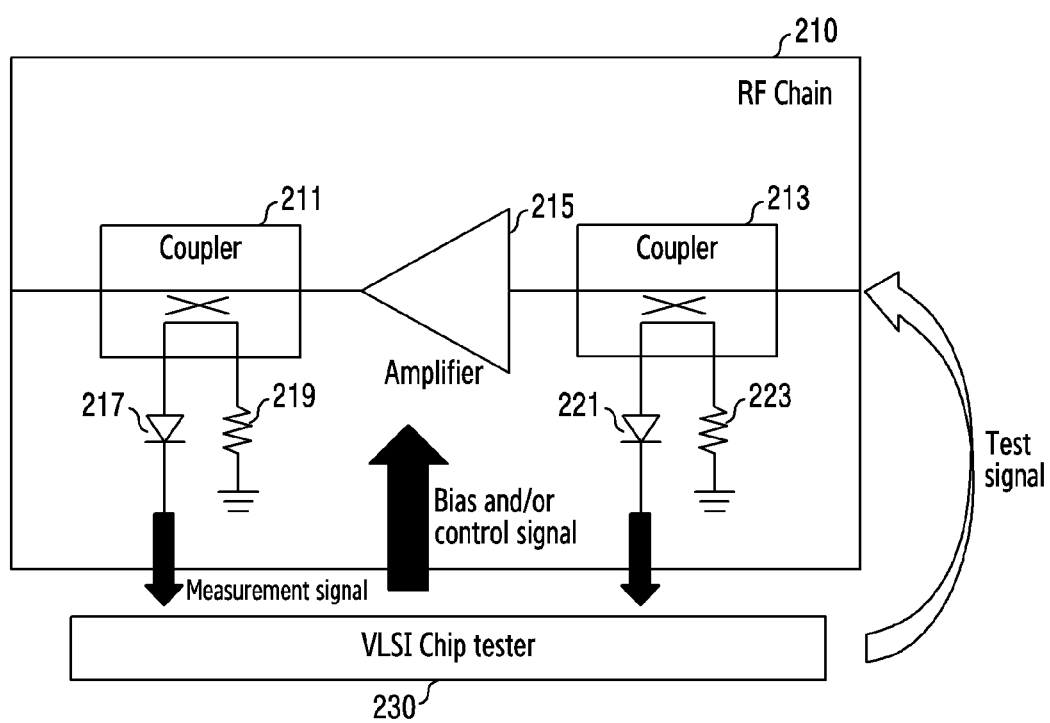
FIG. 2 is a view illustrating examples of configurations for measuring and controlling characteristics of a circuit element in a radio frequency (RF) chain according to various embodiments.

FIG. 2 illustrates examples of configurations for measuring and controlling characteristics of a circuit element in an RF chain according to various embodiments.

Referring to FIG. 2, the RF chain 210 may include an amplifier 215 and a tester, and the tester may include couplers 211, 213, diodes 217, 221, and resistors 219, 223. The coupler 211 may be connected to an output end of the amplifier 215, an anode of the diode 217, and the resistor 219. The coupler 213 may be connected to an input end of the amplifier 215, an anode of the diode 221, and the resistor 223. Cathodes of the diode 217 and the diode 221 may be connected to a very large scale integration (VLSI) chip tester 230, and the resistors 219 and 223 may be connected to the ground. In various embodiments, the RF chain 210 may be included in the communication unit 110, and the tester may be included in the test circuit 111.

The VLSI chip tester 230 may generate a test signal and may input the test signal to the RF chain 210. For example, the test signal may be inputted to the coupler 213. The VLSI chip tester 230 may provide a bias current or a bias voltage to the amplifier 215, and may transmit a control signal for adjusting the amplifier 215. In addition, the VLSI chip tester 230 may receive a measurement signal from the diode 217 and the diode 221, and may measure electrical characteristics of the amplifier 215 based on the measurement signal. Furthermore, the VLSI chip tester 230 may generate a control signal for controlling the amplifier 215 based on the measured electrical characteristics of the amplifier 215. In various embodiments, the VLSI chip tester 230 may include the measurement controller 131 and the signal generator 133, and may be included in the controller 130.

In general, the diode (for example, the diode 217 and the diode 221) may allow a current to flow only in one direction. For example, the diode may be used in a power source device which converts an alternating current into a direct current, and a light emitting diode. Furthermore, the diode may be used to implement an unbalanced mixer. In this case, the diode may output, to the cathode, a signal having a frequency corresponding to a sum of frequencies of signals inputted to the anode of the diode, and a signal having a frequency corresponding to a difference between frequencies. In various embodiments, outputting the signal having the frequency corresponding to the sum of the frequencies of the inputted signals, and the signal having the frequency corresponding to the difference between the frequencies may be referred to as 'inter-modulation.' In other words, inter-modulation of input signals may be performed by the diode.

A coupled-line directional coupler (for example, the couplers 211, 213) may be connected to an input end of an individual circuit element to extract an input signal, or may be connected to an output end of the individual circuit element to extract an output signal. When an input signal of a high frequency extracted by the coupler passes through the diode, an input signal of a low frequency may be obtained by inter-modulation, and, when an output signal of a high frequency extracted by the coupler passes through the diode, an output signal of a low frequency may be obtained by inter-modulation. Accordingly, the VLSI chip tester operating in a low frequency band may measure electrical characteristics of an individual circuit element operating in a high frequency, based on the obtained low frequency signals.

As described above, in various embodiments of the disclosure, a measurement device (for example, the VLSI chip tester 230) operating in a low frequency band (for example, 10 MHz to 3.5 GHz) may measure an S-parameter of an individual circuit element which operates in a high frequency band (for example, a millimeter wave band), based on inter-modulation.

Figure 3:
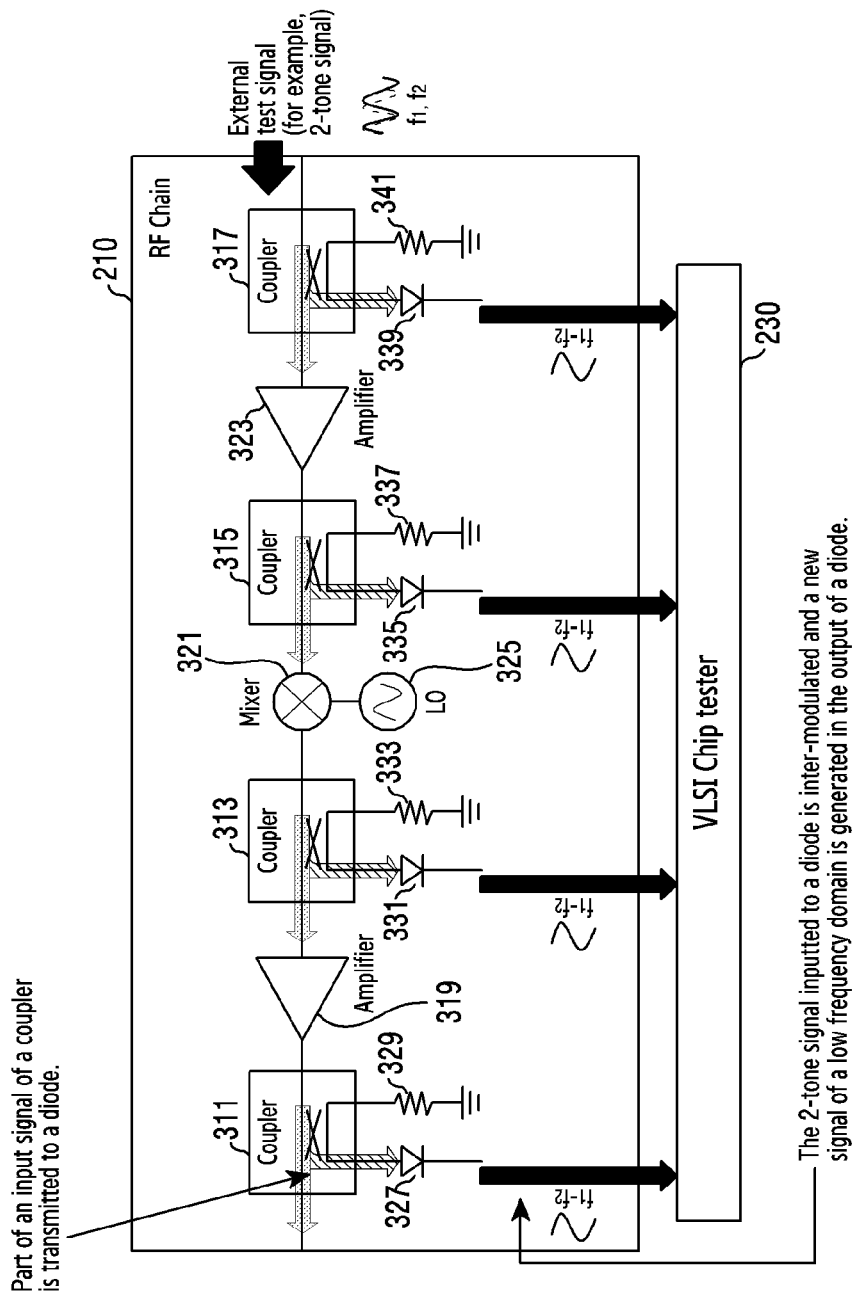
FIG. 3 is a view illustrating examples of configurations for measuring characteristics of circuit elements in an RF chain according to various embodiments.

FIG. 3 illustrates examples of configurations for measuring characteristics of circuit elements in an RF chain according to various embodiments.

Referring to FIG. 3, the RF chain 210 may include amplifiers 319, 323, a mixer 321, a local oscillator (LO) 325, and a tester. The tester may include couplers 311, 313, 315, 317, diodes 327, 331, 335, 339, resistors 329, 333, 337, 341. The coupler 311 may be connected to an output end of the amplifier 319, an anode of the diode 327, and the other side of the resistor 329 having one side connected to the ground. The coupler 313 may be connected to an input end of the amplifier 319, an output end of the mixer 321, an anode of the diode 331, and the other side of the resistor 333 having one side connected to the ground. The coupler 315 may be connected with an input end of the mixer 321, an output end of the amplifier 323, an anode of the diode 335, and the other side of the resistor 337 having one side connected to the ground. The coupler 317 may be connected to an input end of the amplifier 323, an anode of the diode 339, and the other side of the resistor 341 having one side connected to the ground. The mixer 321 may be connected to the LO 325. In various embodiments, the RF chain 210 may be included in the communication unit 110, and the tester may be included in the test circuit 111.

In various embodiments, the coupler may include a resistive or capacitive coupler that does not have directionality, and a coupled-line directional coupler that has high directionality. The coupled-line directional coupler may include a unidirectional coupled-line coupler and a bidirectional coupled-line coupler. When the coupled-line directional couplers are disposed at an input end and an output end of an individual circuit element, the respective coupled-line directional couplers may extract an input signal or an output signal of the individual circuit element. Herein, since the unidirectional coupled-line coupler extracts only a signal of one direction, an insertion loss regarding the circuit element may be identified based on the unidirectional coupled-line coupler. On the other hand, since the bidirectional coupled-line coupler extracts signals of both directions, not only an insertion loss but also a return loss regarding the circuit element may be identified based on the bidirectional coupled-line coupler. The couplers (for example, the couplers 311, 313, 315, 317) used in various embodiments of the disclosure may be unidirectional coupled-line couplers or bidirectional coupled-line couplers.

In various embodiments, the diode (for example, the diodes 327, 331, 335, 339) may be used to implement an RF mixer. For example, the diode may function as an RF mixer to generate a signal of a low frequency from a signal of a high frequency. Since the diode may be designed on the periphery of the coupled-line directional coupler as shown in the drawing, a signal transmitted from the coupler may be directly measured on a measurement reference surface, and accordingly, there is an effect that the total wire length is reduced. In addition, since the diode operates without separate power, power for generating a signal of a low frequency from a signal of a high frequency may be reduced.

A VLSI chip tester 230 may include a measurement controller 131 and a signal generator 133. The signal generator 133 may generate a 2-tone test signal (for example, including two test signals of a cosine waveform having frequencies $f_1$, $f_2$, respectively), and may input the generated 2-tone test signal to the RF chain 210 (for example, the coupler 317). A part of the 2-tone test signal inputted to the coupler 317 may be outputted to the diode 339, and a part thereof may be outputted to the input end of the amplifier 323 to become an input signal of the amplifier 323. A 2-tone test signal component outputted to the diode 339 may be inter-modulated by the diode 339 to generate a signal having a frequency of $(f_1-f_2)$ and a signal having a frequency of $(f_1+f_2)$, and the measurement controller 131 of the VLSI chip tester 230 may extract the signal having the frequency of $(f_1-f_2)$ among the inter-modulated signals. For example, the measurement controller 131 of the VLSI chip tester 230 may extract the signal having the frequency of $(f_1-f_2)$ among the inter-modulated signals by using a low pass filter (LPF) or a band pass filter (BPF).

In various embodiments, the coupled-line directional coupler (for example, the coupler 311, 313, 315, 317) may extract power for the diode without distorting an input signal or an output signal of a circuit element, and the signal having the frequency of $(f_1-f_2)$ among the signals passing through the diode may reflect characteristics of an input signal or an output signal. Accordingly, the VLSI chip tester 230 may acquire a signal of $(f_1-f_2)$ corresponding to an input signal of the amplifier 323 at the output end of the diode 339, and in a similar method, may acquire a signal of $(f_1-f_2)$ corresponding to an output signal of the amplifier 323 or an input signal of the mixer 315 at the output end of the diode 335, may acquire a signal of $(f_1-f_2)$ corresponding to an output signal of the mixer 315 or an input signal of the amplifier 319 at the output end of the diode 331, and may acquire a signal of $(f_1-f_2)$ corresponding to an output signal of the amplifier 319 at the output end of the diode 327. In the disclosure, the signal of $(f_1-f_2)$ may refer to a signal having a frequency of $(f_1-f_2)$.

In various embodiments, the VLSI chip tester 230 (the measurement controller 131 thereof) may measure electrical characteristics (for example, an S-parameter) of an individual circuit element by using signals of $(f_1-f_2)$ acquired at the output ends of the diodes. In various embodiments, the S-parameter is a parameter related to a transfer function of an input signal and an output signal, and may include a change in the amplitude, a phase difference and/or a response speed of the input signal and the output signal. For example, the VLSI chip tester 230 may determine an S-parameter of the amplifier 323, based on the signal of $(f_1-f_2)$ from the diode 339 and the signal of $(f_1-f_2)$ from the diode 335. In another example, the VLSI chip tester 230 may determine an S-parameter of the mixer 321, based on the signal of $(f_1-f_2)$ from the diode 335 and the signal of $(f_1-f_2)$ from the diode 331. In still another example, the VLSI chip tester 230 may determine an S-parameter of the amplifier 319, based on the signal $(f_1-f_2)$ from the diode 331 and the signal of $(f_1-f_2)$ from the diode 327.

Figure 4:
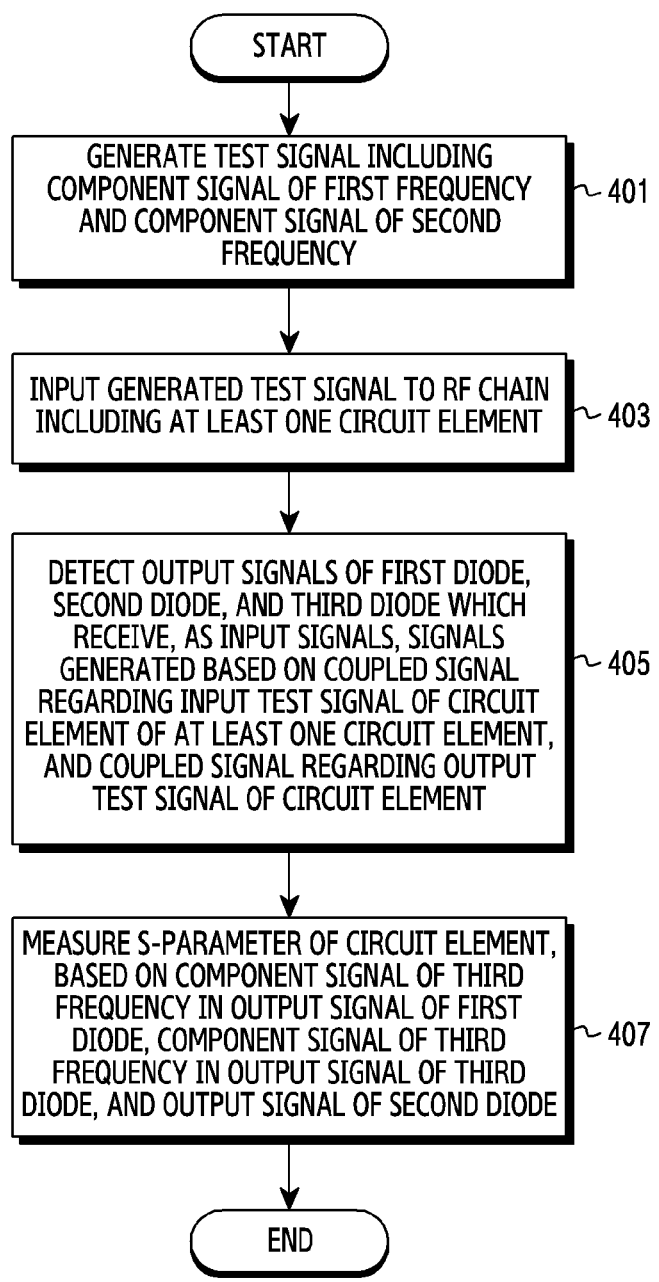
FIG. 4 is a flowchart of a measurement device according to various embodiments.

FIG. 4 illustrates a flowchart of a measurement device according to various embodiments. FIG. 4 illustrates an operating method of the measurement device 100.

Referring to FIG. 4, at step 401, the measurement device may generate a test signal including a component signal of a first frequency and a component signal of a second frequency. For example, the measurement device may generate a test signal (for example, a 2-tone test signal) including a component signal of a first frequency $f_1$ and a component signal of a second frequency $f_2$.

At step 430, the measurement device may input the generated test signal to an RF chain including at least one circuit element. The measurement device may input the test signal to the RF chain to allow the signal including the component signal of the first frequency and the component signal of the second frequency to pass through each circuit element included in the RF chain.

At step 405, the measurement device may detect output signals of a first diode, a second diode, and a third diode which receive, as input signals, signals generated based on a coupled signal regarding an input test signal of the circuit element, and a coupled signal regarding an output test signal of the circuit element. In various embodiments, a coupled signal $\widehat{z_n}$ regarding a signal $\widehat{y_n}$ refers to a signal that is detected at a coupling port of a coupler when $\widehat{y_n}$ is detected at an output port and/or an input port of the coupler. In various embodiments, the coupled signal regarding the input test signal of the circuit element may be divided into an input signal of the first diode and a first input signal by a first power divider, the coupled signal regarding the output signal of the circuit element may be divided into an input signal of the third diode and a second input signal by a second power divider, and an input signal of the second diode may be a combined signal which is generated by a power combiner based on the first input signal and the second input signal.

At step 407, the measurement device may measure an S-parameter regarding the circuit element, based on a component signal of a third frequency in the output signal of the first diode, a component signal of the third frequency in the output signal of the third diode, and the output signal of the second diode. Herein, the third frequency may be a difference between the first frequency and the second frequency. In various embodiments, the S-parameter may include at least one of a size of the S-parameter, a phase of the S-parameter.

In various embodiments, the measurement device may determine the size of the S-parameter regarding the circuit element, based on a ratio of a size of a component signal of the third frequency in the output signal of the third diode to a size of a component signal of the third frequency in the output signal of the first diode. For example, the measurement device may determine the size of the S-parameter regarding the circuit element according to <Equation 22>.

In various embodiments, the first input signal and the second input signal may be combined by the power combiner to form the input signal of the second diode. In this case, the measurement device may determine a phase of the component signal of the third frequency in the output signal of the first diode, and a phase of the component signal of the third frequency in the output signal of the third diode, may determine a ratio between a size of an in-phase component signal of the third frequency in the output signal of the second diode and a size of a quadrature-phase component signal of the third frequency, based on the size of the S-parameter regarding the circuit element, the phase of the component signal of the third frequency in the output signal of the first diode and the phase of the component signal of the third frequency in the output signal of the third diode, and may determine the phase of the S-parameter regarding the circuit element, based on the ratio between the size of the in-phase component signal of the third frequency in the output signal of the second diode and the size of the quadrature-phase component signal of the third frequency. For example, the measurement device may acquire the in-phase component signal of the third frequency in the output signal of the second diode and the quadrature-phase component signal of the third frequency according to <Equation 33> and <Equation 34>.

In various embodiments, the component signal of the first frequency in the first input signal and the component signal of the second frequency in the second input signal may be combined by the power combiner to form the input signal of the second diode. In this case, the measurement device may determine the phase of the component signal of the third frequency in the output signal of the first diode or the phase of the component signal of the third frequency in the output signal of the third diode, and may determine the phase of the S-parameter regarding the circuit element by subtracting the phase of the component signal of the third frequency in the output signal of the first diode or the phase of the component signal of the third frequency in the output signal of the third diode, from the phase of the component signal of the third frequency in the output signal of the second diode. For example, the measurement device may determine the phase of the S-parameter regarding the circuit element according to <Equation 37>. In various embodiments, the component signal of the first frequency in the first input signal may be acquired by a band pass filter (BPF), which allows the signal of the first frequency to pass therethrough and rejects the signal of the second frequency, and the component signal of the second frequency in the second input signal may be acquired by a band pass filter (BPF), which rejects the signal of the first frequency and allows the signal of the second frequency to pass therethrough.

In various embodiments, power of the coupled signal regarding the input test signal of the circuit element may be a sum of power of the input signal of the first diode and power of the first input signal, and power of the coupled signal regarding the output test signal of the circuit element may be a sum of power of the input signal of the third diode and power of the second input signal.

In various embodiments, each of the first diode, the second diode, and the third diode may generate an output signal including the component signal of the third frequency by inter-modulating the component signal of the first frequency and the component signal of the second frequency.

In various embodiments, the measurement device may further include an RF chain. In other words, the measurement device may be a device that includes an RF chain like a base station and a terminal. The measurement device may measure electrical characteristics of its own RF chain, and may self-calibrate the RF chain based on a result of measuring.

In various embodiments, the measurement device may adjust at least one bit value for calibrating the circuit element, based on the S-parameter regarding the circuit element. For example, the measurement device may calibrate the circuit element by adjusting a bit value of the circuit element to correspond to the S-parameter. In another example, the measurement device may calibrate the circuit element by adjusting the bit value of the circuit element to a value corresponding to the S-parameter.

In various embodiments, the first frequency and the second frequency may be frequencies in a millimeter wave band, and the third frequency may be a frequency in a low frequency band. For example, the first frequency $f_1$ may be 59.96 GHz, the second frequency $f_2$ may be 60.06 GHz, and the third frequency may satisfy $f_1-f_2=100$ MHz. In another example, the first frequency $f_1$ may be 69.95 GHz, the second frequency $f_2$ may be 70.05 GHz, and the third frequency may satisfy $f_1-f_2=100$ MHz. The above-described frequency values are merely examples and may be changeable.

Figure 5:
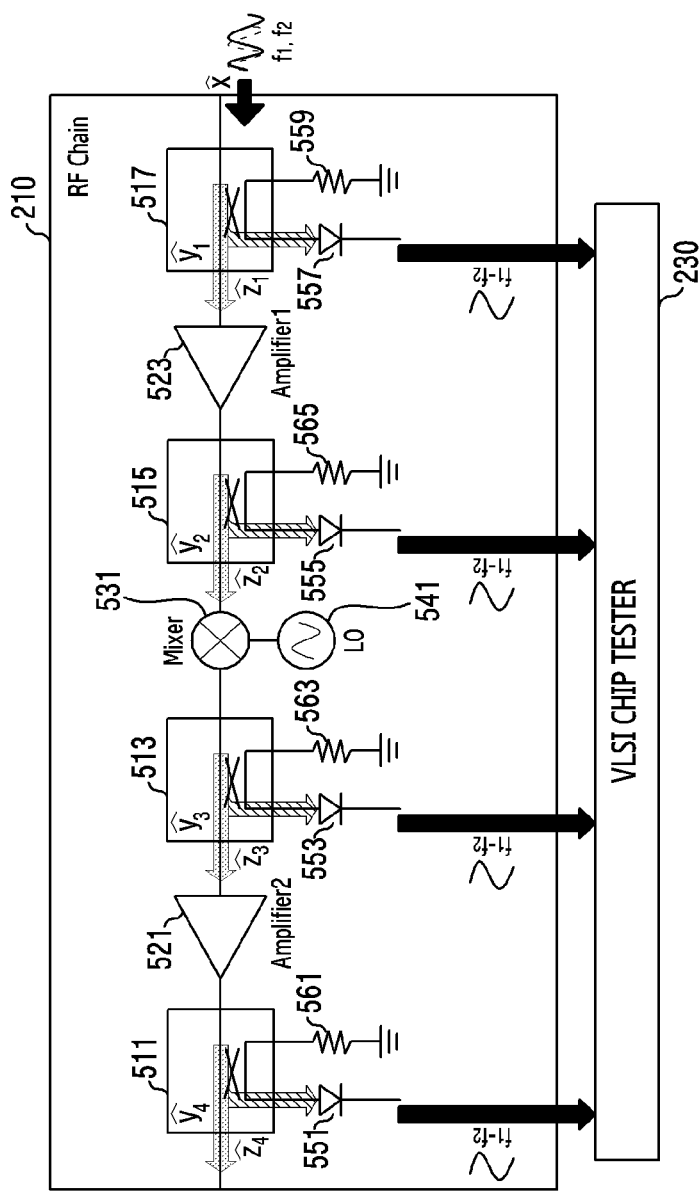
FIG. 5 is a view illustrating examples of configurations for measuring electrical characteristics of an RF chain by using a 2-tone test signal according to various embodiments.

FIG. 5 illustrates examples of configurations for measuring electrical characteristics of an RF chain by using a 2-tone test signal according to various embodiments. In the disclosure, an operation of measuring characteristics or electrical characteristics of the RF chain may include an operation of measuring characteristics or electrical characteristics of each circuit element constituting the RF chain.

Referring to FIG. 5, the RF chain 210 may include amplifiers 521, 523, a mixer 531, an LO 541, and a tester. The tester may include couplers 511, 513, 515, 517, diodes 551, 553, 555, 557, and resistors 561, 563, 565, 559. The coupler 511 may be connected to an output end of the amplifier 521, an anode of the diode 551, and the other side of the resistor 561 having one side connected to the ground. The coupler 513 may be connected to an input end of the amplifier 521, an output end of the mixer 531, and the other side of the resistor 563 having one side connected to the ground. The coupler 515 may be connected to an input end of the mixer 531, an output end of the amplifier 523, an anode of the diode 555, and the other side of the resistor 565 having one side connected to the ground. The coupler 517 may be connected to an input end of the amplifier 523, an anode of the diode 557, and the other side of the resistor 559 having one side connected to the ground. The mixer 531 may be connected to the LO 541.

In various embodiments, a signal generator 133 of a VLSI chip tester 230 may input a 2-tone test signal for measuring an S-parameter regarding each circuit element of the RF chain 210 to the RF chain 210. A circuit element which is a target for measuring the S-parameter may operate in a millimeter wave band, but an operating frequency is not limited to the millimeter wave band. Herein, a waveform of the 2-tone test signal may be a cosine waveform, and sizes and phases of signals constituting the 2-tone test signal may be the same as one another. The 2-tone test signal may be inputted to the coupler 517, first, and the 2-tone test signal $\hat{x}$ may be expressed by <Equation 1> presented below:

$$\hat{x} = \hat{V}_1 \cos(\omega_1 t) + \hat{V}_1 \cos(\omega_2 t) \qquad \text{Equation 1}$$

where $\hat{x}$ is a 2-tone test signal, $\hat{V}_1$ is a complex value of the 2-tone test signal $\hat{x}$, $\omega_1$, $\omega_2$ are frequencies of signals, and it is assumed that $\omega_1 > \omega_2$ and $\approx \omega_1 \approx \omega_2$.

Signals $\widehat{y_1}$, $\widehat{z_1}$ passing through the coupler 517 may satisfy <Equation 2> presented below:

$$P(\widehat{y_1})+P(\widehat{z_1})=P(\hat{x}) \qquad \text{Equation 2}$$

where P(a) is power of a signal a, $\widehat{y_1}$ is a signal inputted to the amplifier 523 among signals passing through the coupler 517, $\widehat{z_1}$ is a signal inputted to the diode 557 among signals passing through the coupler 517, and $\hat{x}$ is a 2-tone test signal. In addition, $\approx |\widehat{y_1}| \approx |\widehat{z_1}|$ and $|\widehat{y_1}| >> |\widehat{z_1}|$. Herein, it is assumed that an insertion loss of a coupler is similar to 0 dB for convenience of calculation.

Similarly, signals $\widehat{y_n}$, $\widehat{z_n}$ passing through the coupler 517, 515, 513 or 511 may be expressed by <Equation 3> presented below:

$$P(\widehat{y_n})+P(\widehat{z_n})=|S_{nm}|^2 P(\widehat{y_{n-1}}), (m=n-1) \qquad \text{Equation 3}$$

where P(a) is power of a signal a, $\widehat{y_{n-1}}$ is an input signal regarding the coupler 517, 511, 513 or 515, $S_{nm}$ is an S-parameter of the amplifier 521, 523 or the mixer 531, $\widehat{z_n}$ is a signal inputted to a diode among output signals of the coupler 517, 511, 513 or 515, and $\widehat{y_n}$ is the other signal components. The 2-tone test signal $\hat{x}$ may be expressed by $\widehat{y_0}$, and $\approx |\widehat{y_n}| \approx |S_{nm}| * |\widehat{y_{n-1}}|$ and $|\widehat{y_n}| >> |\widehat{z_n}|$.

When the 2-tone test signal x is inputted to the RF chain 210, the signal $\widehat{y_n}$ which passes through each circuit element or is reflected on each circuit element may be expressed by <Equation 4> presented below according to electrical characteristics of the circuit element:

$$\widehat{y_n} = \widehat{V_{yn}} \cos(\omega_1 t) + \widehat{V'_{yn}} \cos(\omega_2 t) \qquad \text{Equation 4}$$

where $\widehat{z_n}$ is a signal converted from the 2-tone test signal $\hat{x}$ by each circuit element, $\omega_1$, $\omega_2$ are respective frequencies, $\widehat{V_{yn}}$ is a complex value of a $\omega_1$ frequency signal in $\widehat{y_n}$, $\widehat{V'_{yn}}$ is a complex value of a $\omega_2$ signal in $\widehat{y_n}$, and t is a time variable.

In <Equation 4>, $\widehat{V_{yn}}$, $\widehat{V'_{yn}}$ may be expressed by <Equation 5> and <Equation 6> presented below, respectively:

$$\widehat{V_{yn}} = \hat{V}_1 * (1+\Delta_{yn}) \angle \theta_{yn} \qquad \text{Equation 5}$$

where $\widehat{V_{yn}}$ is a complex value of the $\omega_1$ frequency signal in the signal $\widehat{y_n}$ which is converted from the 2-tone test signal z by each circuit element, $\hat{V}_1$ is a complex value of the 2-tone test signal $\hat{x}$, $\Delta_{yn}$ is a change in the size of $\hat{V}_1$ at the $\omega_1$ frequency, and $\theta_{yn}$ is a change in the phase of $\hat{V}_1$ at the $\omega_1$ frequency.

$$\widehat{V'_{yn}} = \hat{V}_1 * (1+\Delta'_{yn}) \angle \theta'_{yn} \qquad \text{Equation 6}$$

where $\widehat{V'_{yn}}$ is a complex value of the $\omega_2$ frequency signal in the signal $\widehat{y_n}$ which is converted from the 2-tone test signal $\hat{x}$ by each circuit element, $\hat{V}_1$ is a complex value of the 2-tone test signal $\hat{x}$, $\Delta'_{yn}$ is a change in the size of $\hat{V}_1$ at the $\omega_2$ frequency, and $\theta'_{yn}$ is a change in the phase of $\hat{V}_1$ at the $\omega_2$ frequency.

Accordingly, an S-parameter of the amplifier 523 may be expressed by <Equation 7> presented below:

$$S_{21} = \begin{cases} \dfrac{(1+\Delta_{y2})}{(1+\Delta_{y1})} \angle (\theta_{y2} - \theta_{y1}) & \text{at } f_1 \\ \dfrac{(1+\Delta'_{y2})}{(1+\Delta'_{y1})} \angle (\theta'_{y2} - \theta'_{y1}) & \text{at } f_2 \end{cases} \qquad \text{Equation 7}$$

where $S_{21}$ is the S-parameter of the amplifier 523, $\Delta_{y2}$ is a change in the size of a signal passing through the amplifier 523 regarding $\hat{V}_1$ at $\omega_1$, $\Delta_{y1}$ is a change in the size of a signal inputted to the amplifier 523 regarding $\hat{V}_1$ at $\omega_1$, $\theta_{y2}$ is a change in the phase of the signal passing through the amplifier 523 regarding $\hat{V}_1$ at $\omega_1$, $\theta_{y1}$ is a change in the phase of the signal inputted into the amplifier 523 regarding $\hat{V}_1$ at $\omega_1$, $\Delta'_{y2}$ is a change in the size of the signal passing through the amplifier 523 regarding $\hat{V}_1$ at $\omega_2$, $\Delta'_{y1}$ is a change in the size of the signal inputted to the amplifier 523 regarding $\hat{V}_1$ at $\omega_2$, $\theta'_{y2}$ is a change in the phase of the signal passing through the amplifier 523 regarding $\hat{V}_1$ at $\omega_2$, $\theta'_{y1}$ is a change in the phase of the signal inputted into the amplifier 523 regarding $\hat{V}_1$ at $\omega_2$, $f_1$ is a frequency satisfying $$f_1 = \frac{w_1}{2\pi},$$

and $f_2$ is a frequency satisfying $$f_2 = \frac{w_2}{2\pi}.$$

Similarly, an S-parameter of the mixer 531 may be expressed by <Equation 8> presented below:

$$S_{32} = \begin{cases} \dfrac{(1+\Delta_{y3})}{(1+\Delta_{y2})} \angle (\theta_{y3} - \theta_{y2}) & \text{at } f_1 \\ \dfrac{(1+\Delta'_{y3})}{(1+\Delta'_{y2})} \angle (\theta'_{y3} - \theta'_{y2}) & \text{at } f_2 \end{cases} \qquad \text{Equation 8}$$

where $S_{32}$ is the S-parameter of the mixer 531, $\Delta_{y3}$ is a change in the size of a signal passing through the mixer 531 regarding $\hat{V}_1$ at $\omega_1$, $\Delta_{y2}$ is a change in the size of a signal inputted to the mixer 531 regarding $\hat{V}_1$ at $\omega_1$, $\theta_{y3}$ is a change in the phase of the signal passing through the mixer 531 regarding $\hat{V}_1$ at $\omega_1$, $\theta_{y2}$ is a change in the phase of the signal inputted into the mixer 531 regarding $\hat{V}_1$ at $\omega_1$, $\Delta'_{y3}$ is a change in the size of the signal passing through the mixer 531 regarding $\hat{V}_1$ at $\omega_2$, $\Delta'_{y2}$ is a change in the size of the signal inputted to the mixer 531 regarding $\hat{V}_1$ at $\omega_2$, $\theta'_{y3}$ is a change in the phase of the signal passing through the mixer 531 regarding $\hat{V}_1$ at $\omega_2$, $\theta'_{y2}$ is a change in the phase of the signal inputted to the mixer 531 regarding $V_1$ at $\omega_2$, $f_1$ is a frequency satisfying $$f_1 = \frac{w_1}{2\pi},$$

and $f_2$ is a frequency satisfying $$f_2 = \frac{w_2}{2\pi}.$$

Similarly, an S-parameter of the amplifier 521 may be expressed by <Equation 9> presented below:

$$S_{43} = \begin{cases} \dfrac{(1+\Delta_{y4})}{(1+\Delta_{y3})} \angle (\theta_{y4} - \theta_{y3}) & \text{at } f_1 \\ \dfrac{(1+\Delta'_{y4})}{(1+\Delta'_{y3})} \angle (\theta'_{y4} - \theta'_{y3}) & \text{at } f_2 \end{cases} \qquad \text{Equation 9}$$

where $S_{43}$ is the S-parameter of the amplifier 521, $\Delta_{y4}$ is a change in the size of a signal passing through the amplifier 521 regarding $\hat{V}_1$ at $\omega_1$, $\Delta_{y3}$ is a change in the size of a signal inputted to the amplifier 521 regarding $\hat{V}_1$ at $\omega_1$, $\theta_{y4}$ is a change in the phase of the signal passing through the amplifier 521 regarding $\hat{V}_1$ at $\omega_1$, $\theta_{y3}$ is a change in the phase of the signal inputted into the amplifier 521 regarding $\hat{V}_1$ at $\omega_1$, $\Delta'_{y4}$ is a change in the size of the signal passing through the amplifier 521 regarding $\hat{V}_1$ at $\omega_2$, $\Delta'_{y3}$ is a change in the size of the signal inputted to the amplifier 521 regarding $\hat{V}_1$ at $\omega_2$, $\theta'_{y4}$ is a change in the phase of the signal passing through the amplifier 521 regarding $\hat{V}_1$ at $\omega_2$, $\theta'_{y3}$ is a change in the phase of the signal inputted into the amplifier 521 regarding $\hat{V}_1$ at $\omega_2$, $f_1$ is a frequency satisfying $$f_1 = \frac{w_1}{2\pi},$$

and $f_2$ is a frequency satisfying $$f_2 = \frac{w_2}{2\pi}.$$

A signal component $\widehat{z_n}$ inputted to a diode in a signal passing through a coupler may satisfy <Equation 10> presented below according to a response speed and a combining actor of the coupler:

$$\widehat{z_n} = \widehat{V_{zn}} \cos(\omega_1 t) + \widehat{V'_{zn}} \cos(\omega_2 t) \qquad \text{Equation 10}$$

where $\widehat{z_n}$ is a signal inputted to each diode, $\omega_1$, $\omega_2$ are respective frequencies, $\widehat{V_{zn}}$ is a complex value of a $\omega_1$ frequency signal in $\widehat{z_n}$, $\widehat{V'_{zn}}$ is a complex value of a $\omega_2$ frequency signal in $\widehat{z_n}$, and t is a time variable.

In <Equation 10>, $\widehat{V_{zn}}$, $\widehat{V'_{zn}}$ may be expressed by <Equation 11> and <Equation 12> presented below, respectively:

$$\widehat{V_{zn}} = \widehat{V_{yn}}(1+\Delta_{zn}) \angle \theta_{zn} \qquad \text{Equation 11}$$

where $\widehat{V_{zn}}$ is a complex value of the $\omega_1$ frequency signal in the signal $\widehat{z_n}$ which is inputted to each diode, $\widehat{V_{yn}}$ is a complex value of the $\omega_1$ frequency signal in a signal which is outputted from another port of the coupler connected to the diode, $\Delta_{zn}$ is a change in the size of $\widehat{z_n}$ regarding $\widehat{V_{yn}}$ at $\omega_1$, and $\theta_{zn}$ is a change in the phase of $\widehat{z_n}$ regarding $\widehat{V_{yn}}$ at $\omega_1$.

$$\widehat{V'_{zn}} = \widehat{V'_{yn}}\ \widehat{V'_{yn}} *(1+\Delta'_{zn}) \angle \theta'_{zn} \qquad \text{Equation 12}$$

where $\widehat{V'_{zn}}$ is a complex value of the $\omega_2$ frequency signal in the signal $\widehat{z_n}$ which is inputted to each diode, $\widehat{V'_{yn}}$ is a complex value of the $\omega_2$ frequency signal in the signal which is outputted from another port of the coupler connected to the diode, $\Delta'_{zn}$ is a change in the size of $\widehat{z_n}$ regarding $\widehat{V'_{yn}}$ at $\omega_2$, and $\theta'_{zn}$ is a change in the phase of $\widehat{z_n}$ regarding $\widehat{V'_{yn}}$ at $\omega_2$.

Meanwhile, current-voltage characteristics of each diode may satisfy <Equation 13> presented below:

$$y(x) = e^{\frac{x}{c}} - 1 \qquad \text{Equation 13}$$

where y is an output current of a diode, x is an input voltage of a diode, and c is a calibration coefficient.

The Maclaurin series expression of <Equation 13> may be expressed by <Equation 14> presented below:

$$y(x) = e^{\frac{x}{c}} - 1 \approx \frac{x}{c} + \frac{x^2}{2c^2} + \ldots \quad (x < c) \qquad \text{Equation 14}$$

where y is an output current of a diode, x is an input voltage of a diode, and c is a calibration coefficient.

Accordingly, a signal passing through a diode may be expressed by <Equation 15> presented below:

$$y(\widehat{z_n}) \approx \frac{\widehat{V_{zn}} \cos(\omega_1 t) + \widehat{V'_{zn}} \cos(\omega_2 t)}{c} +$$
$$\frac{1}{2c^2} * \left(\widehat{V_{zn}}^2 \cos(2\omega_1 t) + \widehat{V'_{zn}}^2 \cos(2\omega_2 t)\right) +$$
$$\frac{1}{2c^2} * ((\widehat{V_{zn}} * \widehat{V'_{zn}} \cos((\omega_1 + \omega_2)t) + \widehat{V_{zn}} * \widehat{V'_{zn}}^* \cos((\omega_1 - \omega_2)t)) \qquad \text{Equation 15}$$

where $\widehat{z_n}$ is a signal (voltage) inputted to each diode, $y(\widehat{z_n})$ is a current passing through each diode, $\omega_1$, $\omega_2$ are respective frequencies, $\widehat{V_{zn}}$ is a complex value of a $\omega_1$ frequency signal in $\widehat{z_n}$, $\widehat{V'_{zn}}$ is a complex value of a $\omega_2$ signal in $\widehat{z_n}$, t is a time variable, and c is a calibration coefficient of a diode.

According to <Equation 15>, the signal passing through the diode may include signals including $\omega_1$, $\omega_2$ and other frequency components due to an inter-modulation phenomenon.

Comparing <Equation 10> and <Equation 15>, a complex value $\widehat{V_{zn}} * \widehat{V'_{zn}}^*$ of each frequency ($\omega_1-\omega_2$) signal of the signal $y(\widehat{z_n})$ passing through the diode may be expressed by a product of the complex value $\widehat{V_{zn}}$ of each frequency $\omega_1$ signal and the complex value $\widehat{V'_{zn}}$ of each frequency $\omega_2$ signal in the signal $\widehat{z_n}$ before passing through the diode. Accordingly, electrical characteristics (that is, an S-parameter) of each circuit element may be measured by using signal components having each frequency ($\omega_1-\omega_2$) among signals passing through the diode.

A complex value $$\frac{1}{2c^2} * \widehat{V_{zn}} * \widehat{V'_{zn}}^*$$

of a signal the frequency of which is ($\omega_1-\omega_2$) in the signal passing through the diode may be expressed by <Equation 16> presented below:

$$\frac{1}{2c^2} * \widehat{V_{zn}} * \widehat{V'_{zn}}^* = \frac{1}{2c^2} * \hat{V}_1^2 * (1 + \Delta_n)(1 + \Delta'_n) \angle (\theta_n - \theta'_n) \qquad \text{Equation 16}$$

where $\widehat{V'_{zn}}$ is a complex value of a $\omega_1$ frequency signal in the signal $\widehat{z_n}$ inputted to each diode, $\widehat{V_{zn}}$ is a complex value of a $\omega_2$ signal in $\widehat{z_n}$, c is a calibration coefficient of a diode, $\hat{V}_1$ is a complex value of the 2-tone test signal $\hat{x}$, $\Delta_n$ is a variable satisfying $(1+\Delta_n)=(1+\Delta_{yn})(1+\Delta_{zn})$, $\Delta_{yn}$ is a change in the size of $\widehat{y_n}$ regarding $\hat{V}_1$ at $\omega_1$, $\widehat{y_n}$ is a signal outputted from another port of the coupler connected to the diode, $\Delta_{zn}$ is a change in the size of $\widehat{z_n}$ regarding a component $\widehat{V_{yn}}$ of $\widehat{y_n}$ at $\omega_1$, $\Delta'_n$ is a variable satisfying $(1+\Delta'_n)=(1+\Delta'_{yn})(1+\Delta'_{zn})$, $\Delta'_{yn}$ is a change in the size of $\widehat{y_n}$ regarding $\hat{V}_1$ at $\omega_2$, $\Delta'_{zn}$ is a change in the size of $\widehat{z_n}$ regarding a component $\widehat{V'_{yn}}$ of $\widehat{z_n}$ at $\omega_2$, $\theta_n$ is a variable satisfying $\measuredangle \theta_n = \measuredangle \theta_{yn} + \measuredangle \theta_{zn}$, $\theta_{yn}$ is a change in the phase of $\widehat{y_n}$ regarding $\hat{V}_1$ at the $\omega_1$ frequency, $\theta_{zn}$ is a change in the phase of $\widehat{z_n}$ regarding $\widehat{V_{yn}}$ at $\omega_1$, $\theta'_n$ is a variable satisfying $\measuredangle \theta'_n = \measuredangle \theta'_{yn} + \measuredangle \theta'_{zn}$, $\theta'_{yn}$ is a change in the phase of $\widehat{y_n}$ regarding $\hat{V}_1$ at the $\omega_2$ frequency, and $\theta'_{zn}$ is a change in the phase of $\widehat{z_n}$ regarding $\widehat{V'_{yn}}$ at $\omega_2$.

According to <Equation 16>, $$\frac{1+\Delta_2}{1+\Delta_1}$$

may be defined as shown in <Equation 17> presented below:

$$\frac{1+\Delta_2}{1+\Delta_1} = \frac{(1+\Delta_{y2})(1+\Delta_{z2})}{(1+\Delta_{y1})(1+\Delta_{z1})} \quad \text{Equation 17}$$

where $\Delta_1$ is a variable satisfying $(1+\Delta_1)=(1+\Delta_{y1})(1+\Delta_{z1})$, $\Delta_{y1}$ is a change in the size of $\widehat{y_1}$ regarding $\hat{V}_1$ at $\omega_1$, $\widehat{y_1}$ is an input signal of the amplifier 523, $\Delta_{z1}$ is a change in the size of $\widehat{z_1}$ regarding a component $\widehat{V_{y1}}$ of $\widehat{y_1}$ at $\omega_1$, $\widehat{z_1}$ is an input signal of the diode 557, $\Delta_2$ is a variable satisfying $(1+\Delta_2)=(1+\Delta_{y2})(1+\Delta_{z2})$, $\Delta_{y2}$ is a change in the size of $\widehat{y_2}$ regarding $\hat{V}_1$ at $\omega_1$, $\widehat{y_2}$ is an input signal of the mixer 531, $\Delta_{z2}$ is a change in the size of $\widehat{z}$ regarding a component $\widehat{V_{y2}}$ of $\widehat{y_2}$ at $\omega_1$, $\widehat{z_2}$ is an input signal of the diode 555.

If the couplers 511, 513, 515, and 517 are the same as one another, the change in the size $\Delta_{zn}$ and the change in the phase $\theta_{zn}$ of signals passing through the couplers are all the same, and accordingly, <Equation 18> and <Equation 19> may be established.

$$(1+\Delta_{z1})=(1+\Delta_{z2})=(1+\Delta_{z3})=(1+\Delta_{z4}) \quad \text{Equation 18}$$

where $\Delta_{z1}$ is a change in the size of a signal passing through the coupler 517, $\Delta_{z2}$ is a change in the size of a signal passing through the coupler 515, $\Delta_{z3}$ is a change in the size of a signal passing through the coupler 513, and $\Delta_{z4}$ is a change in the size of a signal passing through the coupler 511.

$$\theta_{z1}=\theta_{z2}=\theta_{z3}=\theta_{z4} \quad \text{Equation 19}$$

where $\theta_{z1}$ is a change in the phase of the signal passing through the coupler 517, $\theta_{z2}$ is a change in the phase of the signal passing through the coupler 515, $\theta_{z3}$ is a change in the phase of the signal passing through the coupler 513, and $\theta_{z4}$ is a change in the phase of the signal passing through the coupler 511.

Accordingly, <Equation 17> may be expressed by <Equation 20> presented below:

$$\frac{1+\Delta_2}{1+\Delta_1} = \frac{(1+\Delta_{y2})(1+\Delta_{z2})}{(1+\Delta_{y1})(1+\Delta_{z1})} = \frac{(1+\Delta_{y2})}{(1+\Delta_{y1})} = |S_{21}| \text{ at } f_1 \quad \text{Equation 20}$$

where $\Delta_1$ is a variable satisfying $(1+\Delta_1)=(1+\Delta_{y1})(1+\Delta_{z1})$, $\Delta_{y1}$ is a change in the size of $\widehat{y_1}$ regarding $\hat{V}_1$ at $\omega_1$, $\widehat{y_1}$ is an input signal of the amplifier 523, $\Delta_2$ is a variable satisfying $(1+\Delta_2)=(1+\Delta_{y2})(1+\Delta_{z2})$, $\Delta_{y2}$ is a change in the size of $\widehat{y_2}$ regarding $\hat{V}_1$ at $\omega_1$, $\widehat{y_2}$ is an input signal of the mixer 531, and $|S_{21}|$ at $f_1$ is a size of the S-parameter regarding the amplifier 523 at a frequency $$f_1 = \frac{w_1}{2\pi}.$$

Similarly, $$\frac{1+\Delta'_2}{1+\Delta'_1}$$

may be expressed by <Equation 21> presented below:

$$\frac{1+\Delta'_2}{1+\Delta'_1} = \frac{(1+\Delta'_{y2})(1+\Delta'_{z2})}{(1+\Delta'_{y1})(1+\Delta'_{z1})} = \frac{(1+\Delta'_{y2})}{(1+\Delta'_{y1})} = |S_{21}| \text{ at } f_2 \quad \text{Equation 21}$$

where $\Delta'_1$ is a variable satisfying $(1+\Delta'_1)=(1+\Delta'_{y1})(1+\Delta'_{z1})$, $\Delta'_{y1}$ is a change in the size of $\widehat{y_1}$ regarding $\hat{V}_1$ at $\omega_2$, $\widehat{y_1}$ is an input signal of the amplifier 523, $\Delta'_2$ is a variable satisfying $(1+\Delta'_2)=(1+\Delta'_{y2})(1+\Delta'_{z2})$, $\Delta'_{y2}$ is a change in the size of $\widehat{y_2}$ regarding $\hat{V}_1$ at $\omega_2$, $\widehat{y_2}$ is an input signal of the mixer 531, and $|S_{21}|$ at $f_2$ is a size of the S-parameter regarding the amplifier 523 at a frequency $$f_2 = \frac{w_2}{2\pi}.$$

According to <Equation 20> and <Equation 21>, on the assumption that $$\frac{(1+\Delta_z)(1+\Delta'_2)}{(1+\Delta_1)(1+\Delta'_1)}$$

is a product of sizes of $S_{21}$ at $f_1$, $f_2$ and $\approx f_1 \approx f_2$ (that is, $\approx \omega_1 \approx \omega_2$), S-parameter characteristics may indicate a continuous function regarding frequencies. Accordingly, the size of the S-parameter regarding the amplifier 523, $|S_{21}|$, may be expressed by <Equation 22> presented below:

$$|S_{21}| \approx \sqrt{\frac{(1+\Delta_2)(1+\Delta'_2)}{(1+\Delta_1)(1+\Delta'_1)}} = \quad \text{Equation 22}$$

$$\frac{\text{size of } (\omega_1 - \omega_2) \text{ frequency signal component}}{\text{in output signal } y(\widehat{z_2}) \text{ of diode 555}}$$
$$\frac{}{\text{size of } (\omega_1 - \omega_2) \text{ frequency signal component}}$$
$$\text{in output signal } y(\widehat{z_1}) \text{ of diode 557}$$

Similarly, the size of the S-parameter regarding the mixer 531 and the size of the S-parameter regarding the amplifier 521 may also be measured.

As a result, according to various embodiments, the VLSI chip tester 230 may measure the size of the S-parameter of each circuit element, by measuring the size of a signal the frequency of which is $\omega_1-\omega_2$ in the output signal of a diode.

In addition, according to various embodiments, the VLSI chip tester 230 may measure the phase of the S-parameter of each circuit element, by measuring the phase of a signal the frequency of which is $\omega_1-\omega_2$ in the output signal of a diode.

For example, when the response speed of the amplifier 523 is $\tau_1$, <Equation 23> presented below may be satisfied.

$$(\theta_2-\theta'_2)-(\theta_1-\theta'_1)=-(\omega_1-\omega_2)\tau_1 \quad \text{Equation 23}$$

where $\theta_2$ is a variable satisfying $\angle \theta_2 = \angle \theta_{y2} + \angle_{z2}$, $\theta_{y2}$ is a change in the phase of an input signal $\hat{y_2}$ of the mixer 531 regarding $\hat{V}_1$ at a $\omega_1$ frequency, $\theta_{z2}$ is a change in the phase of an input signal $\hat{z_2}$ of the diode 555 regarding the input signal $\hat{y_2}$ of the mixer 531 at the $\omega_1$ frequency, $\theta'_2$ is a variable satisfying $\angle \theta'_2 = \angle \theta'_{y2} + \angle \theta'_{z2}$, $\theta'_{y2}$ is a change in the phase of the input signal $\hat{y_2}$ of the mixer 531 regarding $\hat{V}_1$ at a $\omega_2$ frequency, $\theta'_{z2}$ is a change in the phase of the input signal $\hat{z_2}$ of the diode 555 regarding the input signal $\hat{y_2}$ of the mixer 531 at the $\omega_2$ frequency, and $\tau_1$ is the response speed of the amplifier 523.

According to <Equation 23>, the response speed of the amplifier 523, $\tau_1$, may be expressed by <Equation 24> presented below:

$$\tau_1 = -\frac{(\theta_2 - \theta'_2) - (\theta_1 - \theta'_1)}{\omega_1 - \omega_2} \quad \text{Equation 24}$$

where $\theta_2$ is a variable satisfying $\angle \theta_2 = \angle \theta_{y2} + \angle \theta_{z2}$, $\theta_{y2}$ is a change in the phase of the input signal $\hat{y_2}$ of the mixer 531 regarding $\hat{V}_1$ at the $\omega_1$ frequency, $\theta_{z2}$ is a change in the phase of the input signal $\hat{z_2}$ of the diode 555 regarding the input signal $\hat{y_2}$ of the mixer 531 at the $\omega_1$ frequency, $\theta'_2$ is a variable satisfying $\angle \theta'_2 = \angle \theta'_{y2} + \angle \theta'_{z2}$, $\theta'_{y2}$ is a change in the phase of the input signal $\hat{y_2}$ of the mixer 531 regarding $\hat{V}_1$ at the $\omega_2$ frequency, $\theta'_{z2}$ is a change in the phase of the input signal $\hat{z_2}$ of the diode 555 regarding the input signal $\hat{y_2}$ of the mixer 531 at the $\omega_2$ frequency, and $\tau_1$ is the response speed of the amplifier 523.

In <Equation 24>, $\theta_2 - \theta'_2$ is a phase of the $(\omega_1-\omega_2)$ frequency signal component in the output signal $y(\hat{z_2})$ of the diode 555, and $\theta_1 - \theta'_1$ is a phase of the $(\omega_1-\omega_2)$ frequency signal component in the output signal $y(\hat{z_1})$ of the diode 557. Accordingly, the VLSI chip tester 230 may measure the response speed of the amplifier 523 by measuring the phase of a signal the frequency of which is $(\omega_1-\omega_2)$ in the output signal of the diode 555 and the output signal of the diode 557. Similarly, the VLSI chip tester 230 may measure the response speed of the mixer 531 and/or the amplifier 521 by measuring the phase of a signal the frequency of which is $(\omega_1-\omega_2)$ in the output signal of the diode.

Figure 6:
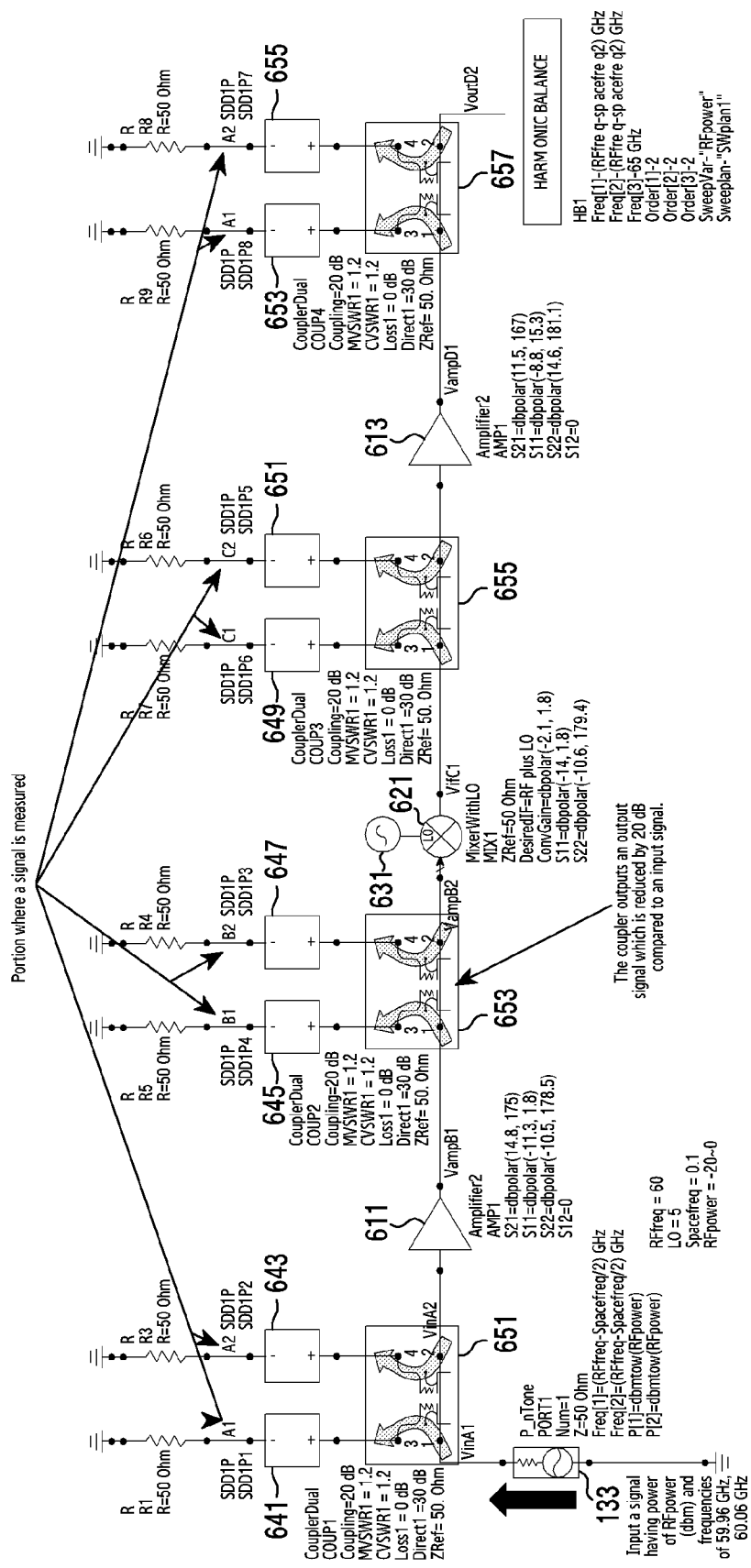
FIG. 6 is a view illustrating a simulation circuit for measuring electrical characteristics of an RF chain according to various embodiments.

FIG. 6 illustrates a simulation circuit for measuring electrical characteristics of an RF chain according to various embodiments.

Referring to FIG. 6, a signal generator 133 may input a 2-tone test signal to an amplifier 611 for the sake of a harmonic balance simulation. Power of the 2-tone test signal may be RFpower (dbm), and the 2-tone test signal may include signal components frequencies of which are 59.95 GHz, 60.05 GHz, respectively. In the disclosure, the RFpower may be a value within a range from −20 dBm to 0 dBm. The 2-tone test signal may be inputted to a circuit element and/or a diode through couplers 651, 653, 655, and 657. A VLSI chip tester 230 may determine an S-parameter of the amplifier 611 by using a signal component the frequency of which is 60.05-59.95=0.1 GHz=100 MHz in an output signal (that is, a signal detected from a cathode) of a diode 641, and a signal component the frequency of which is 100 MHz at an output signal of a diode 645. The VLSI chip tester 230 may determine an S-parameter of a mixer 621, which is connected with an LO 631, by using a signal component the frequency of which is 100 MHz in the output signal of the diode 645, and a signal component the frequency of which is 100 MHz in an output signal of a diode 649. The VLSI chip tester 230 may determine an S-parameter of an amplifier 613 by using a signal component the frequency of which is 100 MHz in the output signal of the diode 649, and a signal component the frequency of which is 100 MHz in an output signal of a diode 653.

In the above-described examples, the S-parameter measured regarding each circuit element may be an insertion loss of each circuit element. However, the 2-tone test signal may be reflected on each circuit element, and the VLSI chip tester 230 may also measure a return loss on each circuit element. For example, the VLSI chip tester 230 may determine the S-parameter (return loss) of the amplifier 611 by using the signal component the frequency of which is 100 MHz in the output signal of the diode 641, and a signal component the frequency of which is 100 MHz in an output signal of a diode 643. The VLSI chip tester 230 may determine the S-parameter (return loss) of the mixer 621, which is connected with the LO 631, by using the signal component the frequency of which is 100 MHz in the output signal of the diode 645, and a signal component the frequency of which is 100 MHz in an output signal of a diode 647. The VLSI chip tester 230 may determine the S-parameter (return loss) of the amplifier 613 by using the signal component the frequency of which is 100 MHz in the output signal of the diode 649, and a signal component the frequency of which is 100 MHz in an output signal of a diode 651.

The return loss on each circuit element according to the result of the harmonic balance simulation described above may be expressed as shown in <Table 1> presented below:

TABLE 1

| |S11| (Input Power = −20 dBm) | Real S-parameter [dB] | Simulation Value [dB] |
|---|---|---|
| AMP1 | −11.3 | −11.135 |
| AMP2 | −8.8 | −8.863 |
| MIX1 | −14.1 | −14.243 |

Herein, |S11| refers to a return loss o each circuit element, AMP1 refers to the amplifier 611, AMP2 refers to the amplifier 613, and MIX1 refers to the mixer 621.

The simulation value of the return loss regarding AMP1, −11.135 dB, was calculated according to <Equation 25> presented below:

$$\text{AMP1\_S11} = \frac{dBm(A2[::,1]) - dBm(A1[::,1])}{2} \quad \text{Equation 25}$$

where AMP1_S11 is the return loss of AMP1, dBm(A2[::,1]) refers to a size of the dBm unit of the signal component the frequency of which is 100 MHz in the output signal of the diode 643, and dBm(A1[::,1]) refers to a size of the dBm unit of the signal component the frequency of which is 100 MHz in the output signal of the diode 641.

The simulation value of the return loss regarding AMP2, −8.863 dB, was calculated according to <Equation 26> presented below:

$$\text{AMP2\_S11} = \frac{dBm(C2[::,1]) - dBm(C1[::,1])}{2} \quad \text{Equation 26}$$

where AMP2_S11 is the return loss of AMP2, dBm(C2[::,1]) refers to a size of the dBm unit of the signal component the frequency of which is 100 MHz in the output signal of the diode 651, and dBm(C1[::,1]) refers to a size of the dBm unit of the signal component the frequency of which is 100 MHz in the output signal of the diode 649.

The simulation value of the return loss regarding MIX1, −14.243, was calculated according to <Equation 27> presented below:

$$\text{Mixer\_S11} = \frac{dBm(B2[::,1]) - dBm(B1[::,1])}{2} \quad \text{Equation 27}$$

where Mixer_S11 is the return loss of MIX1, dBm(B2[::,1]) refers to a size of the dBm unit of the signal component the frequency of which is 100 MHz in the output signal of the diode 647, and dBm(B1[::,1]) refers to a size of the dBm unit of the signal component the frequency of which is 100 MHz in the output signal of the diode 645.

The insertion loss on each circuit element according to the result of the harmonic balance simulation described above may be expressed as shown in <Table 2> presented below:

TABLE 2

| |S21|<br>(Input Powerr = −20 dBm) | Real<br>S-parameter [dB] | Simulation<br>Value [dB] |
|---|---|---|
| AMP1 | 14.8 | 14, 13 |
| AMP2 | 11.5 | 13.6 |
| MIX1 | −2.1 | −0.087 |

Herein, |S21| refers to an insertion loss on each circuit element, AMP1 refers to the amplifier 611, AMP2 refers to the amplifier 613, and MIX1 refers to the mixer 621. The simulation value of the insertion loss regarding AMP1, 14.13 dB, was calculated according to <Equation 28> presented below:

$$\text{AMP1\_S21} = \frac{dBm(B1[::,1]) - dBm(A1[::,1])}{2} \quad \text{Equation 28}$$

where AMP1_S21 is the insertion loss of AMP1, dBm(B1[::,1]) refers to a size of the dBm unit of the signal component the frequency of which is 100 MHz in the output signal of the diode 645, and dBm(A1[::,1]) refers to a size of the dBm unit of the signal component the frequency of which is 100 MHz in the output signal of the diode 641.

The simulation value of the insertion loss regarding AMP2, 13.6 dB, was calculated according to <Equation 29> presented below:

$$\text{AMP2\_S21} = \frac{dBm(D1[::,1]) - dBm(C1[::,1])}{2} \quad \text{Equation 29}$$

where AMP2_S21 is the insertion loss of AMP2, dBm(D1[::,1]) refers to a size of the dBm unit of the signal component the frequency of which is 100 MHz in the output signal of the diode 653, and dBm(C1[::,1]) refers to a size of the dBm unit of the signal component the frequency of which is 100 MHz in the output signal of the diode 649.

The simulation value of the insertion loss regarding MIX1, −0.087, was calculated according to <Equation 30> presented below:

$$\text{Mixer\_S21} = \frac{dBm(C1[::,1]) - dBm(B1[::,1])}{2} \quad \text{Equation 30}$$

where Mixer_S21 is the insertion loss of MIX1, dBm(C1[::,1]) refers to a size of the dBm unit of the signal component the frequency of which is 100 MHz in the output signal of the diode 649, and dBm(B1[::,1]) refers to a size of the dBm unit of the signal component the frequency of which is 100 MHz in the output signal of the diode 645.

Referring to <Table 1> and <Table 2> presented above, an error between the simulation value of the S-parameter and the rear measurement value of the S-parameter may be within 2.1 dB.

Figure 7:
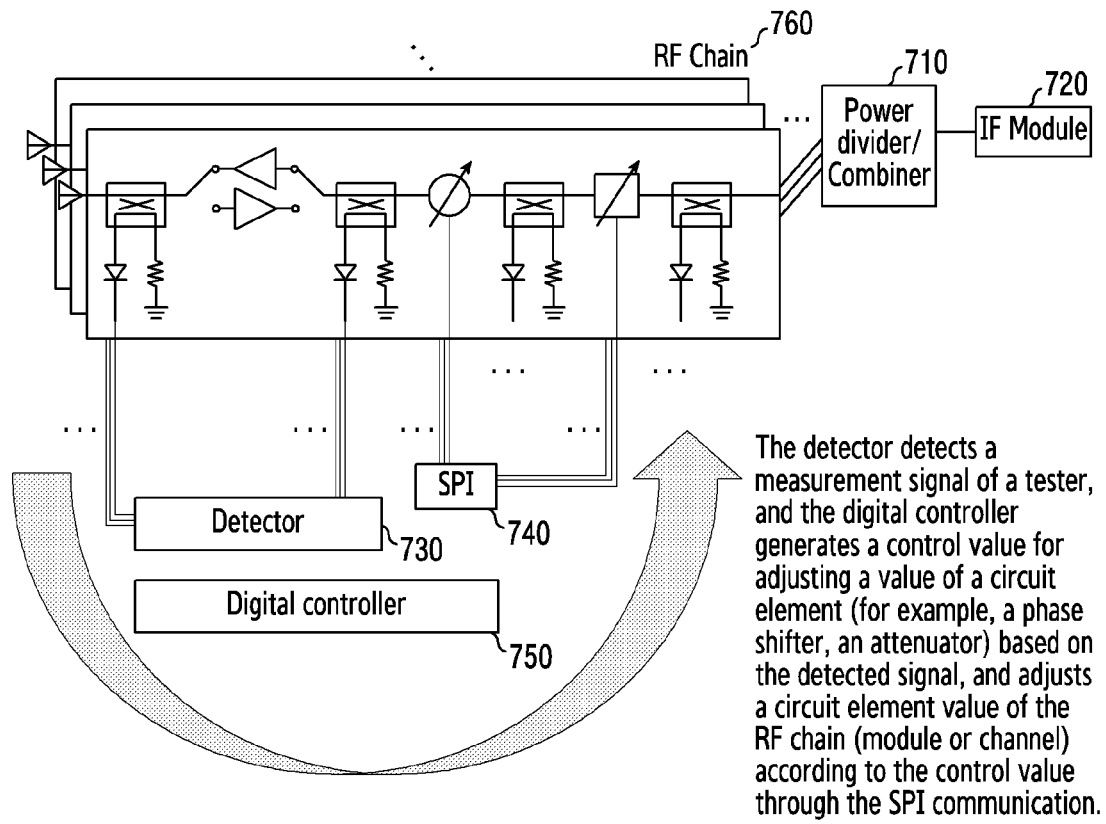
FIG. 7 is a view illustrating a circuit structure for self-calibration according to various embodiments.

FIG. 7 illustrates a circuit structure for self-calibration according to various embodiments.

Referring to FIG. 7, the circuit for self-calibration may include a power divider/combiner 710, an IF module 720, a detector 730, an SPI 740, a digital controller 750, and RF chains 760. In various embodiments, the power divider/combiner 710, the IF module 720, the detector 730, the SPI 740, the digital controller 750, and the RF chains 760 may be included in the measurement device 100. For example, the detector 730, the SPI 740, the digital controller 750 may be included in the measurement controller 131, and the power divider/combiner 710, the IF module 720, and the RF chains 760 may be included in the communication unit 110. The power divider/combiner 710 may be included in the test circuit 111.

In various embodiments, the detector 740 may detect a measurement signal of a tester of the RF chains 760 and/or the power divider/combiner 710. The digital controller 750 may generate a control value for adjusting a value of a circuit element (for example, a phase shifter, an attenuator) based on the detected signal. Furthermore, the digital controller 750 may adjust a circuit element value of the RF chains 760 (a module or a channel) through the SPI 740 according to the control value.

In other words, in an active analogue beamforming structure as shown in FIG. 7, a self-calibration function may be implemented to reduce a relative error between channels (that is, the RF chains). For example, the digital controller 750 may perform the self-calibration function by measuring an S-parameter between channels, and controlling a value of the phase shifter and/or the attenuator on a bit basis in order to reduce an error between channels.

In various embodiments, a frequency modulated continuous wave (FMCW) signal may be inputted to the RF chain instead of a 2-tone test signal in order to measure an S-parameter on each circuit element. Hereinafter, an abstract shape of an FMCW signal will be described with reference to FIG. 8.

Figure 8:
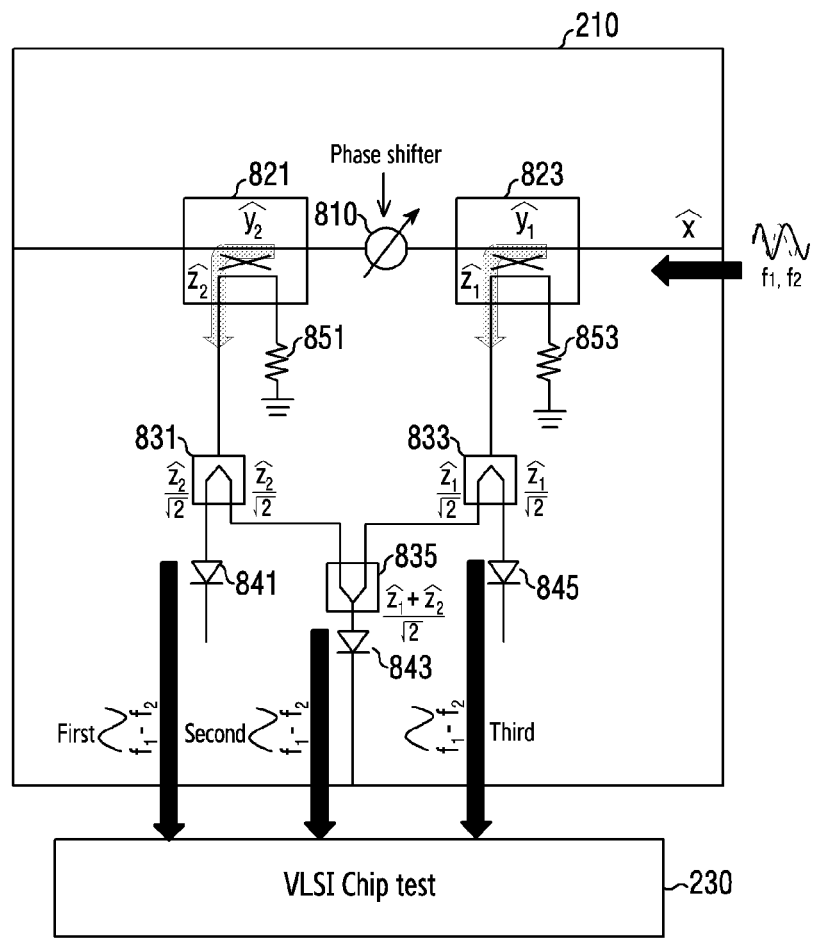
FIG. 8 is a view illustrating examples of configurations for measuring an S-parameter of a circuit element by using a 2-tone test signal according to various embodiments.

FIG. 8 illustrates examples of configurations for measuring an S-parameter of a circuit element by using a 2-tone test signal according to various embodiments.

Referring to FIG. 8, the RF chain 210 may include a phase shifter 810, couplers 821, 823, power dividers 831, 833, a power combiner 835, resistors 851, 853, and diodes 841, 843, 845. The coupler 821 may be connected with an output end of the phase shifter 810, the power divider 831, and the other side of the resistor 851 having one side connected to the ground. The coupler 823 may be connected with an input end of the phase shifter 810, the power divider 833, and the other side of the resistor 853 having one side connected to the ground. The power combiner 835 may be connected with the diode 843, the power divider 831 connected with the diode 841, and the power divider 833 connected with the diode 845.

In various embodiments, when a 2-tone test signal $\hat{x}$ is inputted to the RF chain 210, an input signal $\hat{y_1}$ regarding the phase shifter 810 may be detected at an output port of the coupler 823, and the signal $\hat{y_1}$ and a coupled signal $\hat{z_1}$ regarding the signal $\hat{y_1}$ may satisfy <Equation 10> (n=1). Herein, the signals $\hat{x}$, $\hat{y_1}$ and $\hat{z_1}$ may satisfy <Equation 2>, and the 2-tone test signal $\hat{x}$ may include a component signal of a $f_1$ frequency and a component signal of a $f_2$ frequency. Similarly, when the 2-tone test signal 2 is inputted to the RF chain 210, an output signal $\hat{y_2}$ of the phase shifter 810 may be detected at an input port of the coupler 821, and a coupled signal $\hat{z_2}$ regarding the signal $\hat{y_2}$ may satisfy <Equation 10> (n=2). When the signal $\hat{z_1}$ is inputted to the power divider 833, the power divider 833 may output two signals $$\frac{\hat{z_2}}{\sqrt{2}}$$

having halves of power of an input signal to the power combiner 835 and the diode 845, respectively. Similarly, when the signal $\hat{z_2}$ is inputted to the power divider 831, the power divider 831 may output two signals $$\frac{\hat{z_2}}{\sqrt{2}}$$

having halves of power of an input signal to the power combiner 835 and the diode 841, respectively. The signals $$\frac{\hat{z_1}}{\sqrt{2}} \text{ and } \frac{\hat{z_2}}{\sqrt{2}}$$

and inputted to the power combiner 835 may be combined by the power combiner 835, and the power combiner 835 may output a combined signal $$\frac{\hat{z_1}+\hat{z_2}}{\sqrt{2}}.$$

In other words, the power combiner 835 may combine the coupled signal $\hat{z_1}$ outputted by the coupler 823 and the coupled signal $\hat{z_2}$ outputted by the coupler 821, the respective sizes of which are reduced by $1/\sqrt{2}$ times, and may output the combined signal.

When the output signal $$\frac{\hat{z_1}+\hat{z_2}}{\sqrt{2}}$$

of the power combiner 835 passes through the diode 843, a component signal the frequency of which is $\omega_1-\omega_2$ in the output signal of the diode 843 may be expressed by <Equation 31> presented below:

$$y\left(\frac{\hat{z_1}+\hat{z_2}}{\sqrt{2}}\right) \approx \ldots + \frac{1}{4c^2} * (\hat{V_{z1}} * \hat{V_{z1}}^* + \hat{V_{z1}} * \hat{V_{z2}}^* + \hat{V_{z2}} * \hat{V_{z1}}^* + \hat{V_{z2}} * \hat{V_{z2}}^*) \quad \text{Equation 31}$$

$$\cos((\omega_1-\omega_2)t) + \ldots$$

where $\hat{z_1}$ is a coupled signal regarding an input signal $\hat{y_1}$ of the phase shifter 810, $\hat{z_2}$ is a coupled signal regarding an output signal $\hat{y_2}$ of the phase shifter 810, $$y\left(\frac{\hat{z_1}+\hat{z_2}}{\sqrt{2}}\right)$$

is an output signal of the diode 843 regarding an input signal $$\frac{\hat{z_1}+\hat{z_2}}{\sqrt{2}}$$

the diode 843, c is a calibration coefficient, $\hat{V_{z1}}$ is a complex value of a $\omega_1$ frequency signal in $\hat{z_1}$, $\hat{V'_{z1}}$ is a complex value of a $\omega_2$ frequency signal in $\hat{z_1}$, $\hat{V_{z2}}$ is a complex value of the $\omega_1$ frequency signal in $\hat{z_2}$, $\hat{V'_{z2}}$ is a complex value of the $\omega_2$ frequency signal in $\hat{z_2}$, $\omega_1$ and $\omega_2$ are frequencies satisfying $\omega_1=2\pi f_1$, $\omega_2=2\pi f_2$, respectively, and t is a time variable.

When a response speed of the phase shifter 810 is $\tau$ and a relative phase size of the phase shifter 801 is $\Theta$, a component signal the frequency of which is $\omega_1-\omega_2$ in the output signal of the diode 843 may be expressed by <Equation 32> presented below:

$$y\left(\frac{\hat{z_1}+\hat{z_2}}{\sqrt{2}}\right) \approx \quad \text{Equation 32}$$

$$\ldots + \frac{1}{4c^2} * \hat{V_L}^2 * (1+\Delta_1)(1+\Delta'_1)\big(+ \angle(\theta_1-\theta'_1) + |S_{21}|\angle(\Theta+\theta_2 - \theta'_2) + |S_{21}|\angle(-\Theta+\theta_1-\theta'_1) + |S_{21}|^2\angle(\theta_2-\theta'_2)\big)\cos((\omega_1-\omega_2)t$$

where $\hat{z_1}$ is a coupled signal regarding an input signal $\hat{y_1}$ of the phase shifter 810, $\hat{z_2}$ is a coupled signal regarding an output signal $\hat{y_2}$ of the phase shifter 810, $$y\left(\frac{\hat{z_1}+\hat{z_2}}{\sqrt{2}}\right)$$

is an output signal of the diode 843 regarding an input signal $$\frac{\hat{z_1}+\hat{z_2}}{\sqrt{2}}$$

of the diode 843, c is a calibration coefficient, $\hat{V}_1$ is a complex value of the 2-tone test signal $\hat{x}$, $\Delta_n$ is a variable satisfying $(1+\Delta_n)=(1+\Delta_{yn})(1+\Delta_n)$, $\Delta_{yn}$ is a change in the size of $\hat{y_n}$ regarding $\hat{V}_1$ at $\omega_1$, $\Delta_{zn}$ is a change in the size of $\hat{z_n}$ regarding a component $\hat{V_{yn}}$ of $\hat{y_n}$ at $\omega_1$, $\Delta'_n$ is a variable satisfying $1+\Delta'_n=(1+\Delta'_{yn})(1+\Delta'_{zn})$, $\Delta'_{yn}$ is a change in the size of $\hat{y_n}$ regarding $\hat{V}_1$ at $\omega_2$, $\Delta'_{zn}$ is a change in the size of $\widehat{z_n}$ regarding a component $\overline{V'_{yn}}$ of $\widehat{y_n}$ at $\omega_2$, $\theta_n$ is a variable satisfying $\angle \theta_n = \angle \theta_{yn} + \angle_{zn}$, $\theta_{yn}$ is a change in the phase of $\widehat{y_n}$ regarding $\hat{V}_1$ at a $\omega_1$ frequency, $\theta_{zn}$ is a change in the phase of $\widehat{z_n}$ regarding $\overline{V_{yn}}$ at $\omega_1$, $\theta'_n$ is a variable satisfying $\angle \theta'_n = \angle \theta'_{yn} + \angle \theta'_{zn}$, $\theta'_{yn}$ is a change in the phase of $\widehat{y_n}$ regarding $\hat{V}_1$ at a $\omega_2$ frequency, and $\theta'_{zn}$ is a change in the phase of $\widehat{z_n}$ regarding $\overline{V'_{yn}}$ at $\omega_2$, $\Theta$ is a relative phase size of the phase shifter 810, S21 is an S-parameter of the phase shifter, 810, $\omega_1$ and $\omega_2$ are frequencies satisfying $\omega_1 = 2\pi f_1$, $\omega_2 = 2\pi f_2$, respectively, and t is a time variable.

If the output signal of the diode 843 is divided into an in-phase (hereafter, referred to as I-phase) component signal and a quadrature phase (hereinafter, referred to as Q-phase) component signal in <Equation 32>, the respective I-phase signal component (hereinafter, referred to as I-signal) and Q-phase signal component (hereinafter, referred as Q-signal) may be expressed by <Equation 33> and <Equation 33> presented below:

$I\text{-signal} \approx \ldots (\cos(\theta_1-\theta'_1)+|S_{21}|\cos(\Theta+\theta_2-\theta'_2)+|S_{21}|$
$\cos(-\Theta+\theta_1-\theta'_1)+|S_{21}|^2 \cos(\theta_2-\theta'_2))\cos((\omega_1-\omega_2)t$  Equation 33 where $\theta_n$ is a variable satisfying $\angle \theta_n = \angle \theta_{yn} + \angle \theta_{zn}$, $\theta_{yn}$ is a change in the phase of $\widehat{y_n}$ regarding a complex value $\hat{V}_1$ of the 2-tone test signal $\hat{x}$ at the $\omega_1$ frequency, $\theta_{zn}$ is a change in the phase of $\widehat{z_n}$ regarding $\overline{V_{yn}}$ at $\omega_1$, $\theta'_n$ is a variable satisfying $\angle \theta'_n = \angle \theta'_{yn} + \angle \theta'_{zn}$, $\theta'_{yn}$ is a change in the phase of $\widehat{y_n}$ regarding $\hat{V}_1$ at the $\omega_2$ frequency, $\theta'_{zn}$ is a change in the phase of $\widehat{z_n}$ regarding $\overline{V'_{yn}}$ at $\omega_2$, $\overline{V_{yn}}$ is a complex value of a $\omega_1$ frequency signal at $\widehat{y_n}$, $\overline{V'_{yn}}$ is a complex value of a $\omega_2$ signal in $\widehat{y_n}$, $\widehat{y_1}$ is an input signal of the phase shifter 810, $\widehat{V_{y2}}$ is an output signal of the phase shifter 810, $\widehat{z_1}$ is a coupled signal regarding $\widehat{y_1}$, $\widehat{z_2}$ is a coupled signal regarding $\widehat{y_2}$, $S_{21}$ is an S-parameter of the phase shifter 810, $\Theta$ is a relative phase size of the phase shifter 810, $\omega_1$ and $\omega_2$ are frequencies satisfying $\omega_1 = 2\pi f_1$, $\omega_2 = 2\pi f_2$, respectively, and t is a time variable.

$Q\text{-signal} \approx \ldots (-\sin(\theta_1-\theta'_1)-|S_{21}|\sin(\Theta+\theta_2-\theta'_2)-$
$|S_{21}|\sin(-\Theta+\theta_1-\theta'_1)-|S_{21}|^2 \sin(\theta_2-\theta'_2))\sin((\omega_1-\omega_2)t)$  Equation 34 where $\theta_n$ is a variable satisfying $\overline{V'_{yn}} \theta_n = \overline{V'_{yn}} \theta_{yn} + \angle \theta_{zn}$, $\theta_{yn}$ is a change in the phase of $\widehat{y_n}$ regarding a complex value $\hat{V}_1$ of the 2-tone test signal $\hat{x}$ at the $\omega_1$ frequency, $\theta_{zn}$ is a change in the phase of $\widehat{z_n}$ regarding $\overline{V_{yn}}$ at $\omega_1$, $\theta'_n$ is a variable satisfying $\overline{V'_{yn}} \theta'_n = \angle '_{yn} + \angle '_{zn}$, $\theta'_{yn}$ is a change in the phase of $\widehat{y_n}$ regarding $\hat{V}_1$ at the $\omega_2$ frequency, $\theta'_{zn}$ is a change in the phase of $\widehat{z_n}$ regarding $\overline{V'_{yn}}$ at $\omega_2$, $\overline{V_{yn}}$ is a complex value of a $\omega_1$ frequency signal in $\widehat{y_n}$, $\overline{V'_{yn}}$ is a complex value of a $\omega_2$ signal in $\widehat{y_n}$, $\widehat{y_1}$ is an input signal of the phase shifter 810, $\widehat{y_2}$ is an output signal of the phase shifter 810, $\widehat{z_1}$ is a coupled signal regarding $\widehat{y_1}$, $\widehat{z_2}$ is a coupled signal regarding $\widehat{y_2}$, $S_{21}$ is an S-parameter of the phase shifter 810, $\Theta$ is a relative phase size of the phase shifter 810, $\omega_1$ and $\omega_2$ are frequencies satisfying $\omega_1 = 2\pi f_1$, $\omega_2 = 2\pi f_2$, respectively, and t is a time variable.

A VLSI chip tester 230 may determine the size $|S_{21}|$ of the S-parameter of the phase shifter 810, based on a size of the $(\omega_1-\omega_2)$ frequency signal component in the output signal of the diode 845, and a size of the $(\omega_1-\omega_2)$ frequency signal component in the output signal of the diode 841, according to <Equation 22>. In addition, the VSLI chip tester 230 may determine a phase $\theta_1 - \theta'_1$ of the $(\omega_1-\omega_2)$ frequency signal component in the output signal of the diode 845, and a phase $\theta_2 - \theta'_2$ of the $(\omega_1-\omega_2)$ frequency signal component in the output signal of the diode 841. Accordingly, according to <Equation 33> and <Equation 34>, the VLSI chip tester 230 may determine the relative phase size $\Theta$ of the phase shifter 810, based on a ratio between the size of the I signal and the size of the Q-signal in the output signal of the diode 843, with values of $|S_{21}|$, $\theta_1-\theta'_1$ and $\theta_2-\theta'_2$ being given.

Although FIG. 8 illustrates the method for measuring the S-parameter of the phase shifter 810, the method described in FIG. 8 may be applied to measuring S-parameters of other circuit elements, in addition to the S-parameter of the phase shifter 810.

Figure 9:
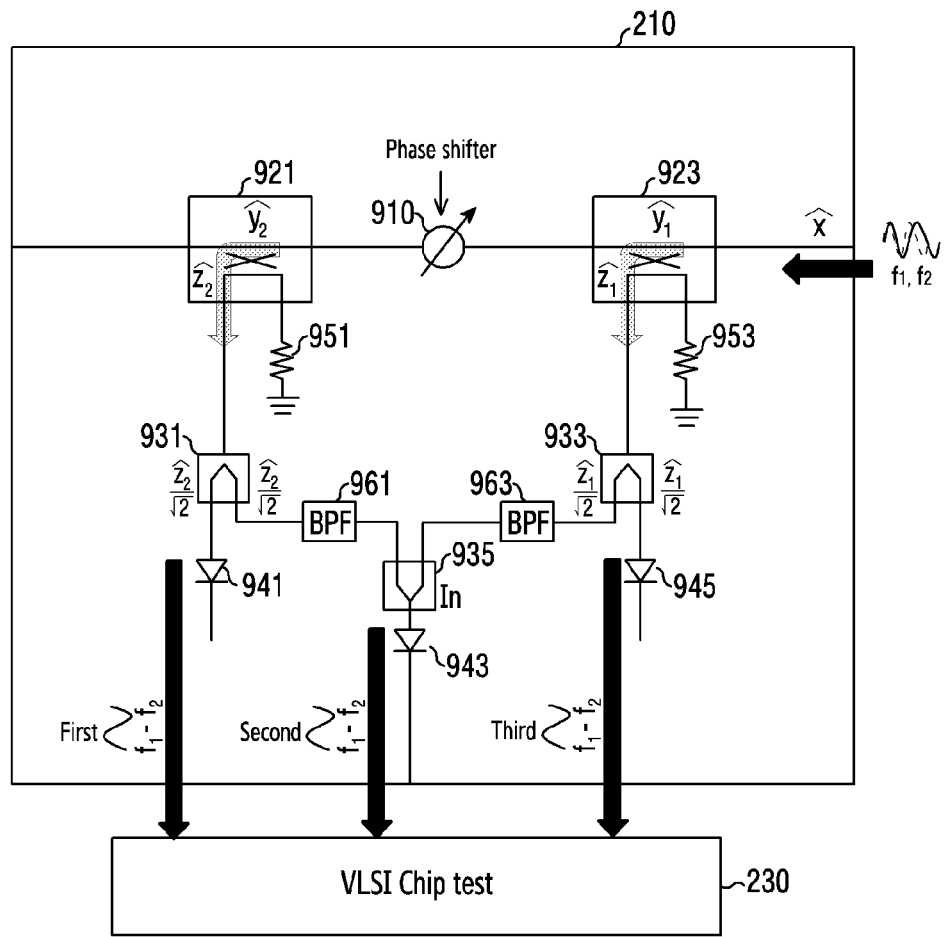
FIG. 9 is a view illustrating examples of configurations for measuring an S-parameter of a circuit element by using a band pass filter (BPF) according to various embodiments.

FIG. 9 illustrates examples of configurations for measuring an S-parameter of a circuit element by using a band pass filter (BPF) according to various embodiments.

Referring to FIG. 9, an RF chain 210 may include a phase shifter 910, couplers 921, 923, power dividers 931, 933, a power combiner 935, resistors 951, 953, diodes 941, 943, 945, and BPFs 961, 963. The coupler 921 may be connected with an output end of the phase shifter 910, the power divider 931, and the other side of the resistor 951 having one side connected to the ground. The coupler 923 may be connected with an input end of the phase shifter 910, the power divider 933, and the other side of the resistor 953 having one side connected to the ground. The power combiner 935 may be connected with the diode 943, an output end of the BPF 961, and an output end of the BPF 963. An input end of the BPF 961 may be connected to the power divider 931 connected to the diode 941, and an input end of the BPF 963 may be connected to the power divider 933 connected to the diode 945.

In various embodiments, when a 2-tone test signal z is inputted to the RF chain 210, an input signal $\widehat{y_1}$ regarding the phase shifter 910 may be detected at an output port of the coupler 923, and the signal $\widehat{y_1}$ and a coupled signal $\widehat{z_1}$ regarding the signal $\widehat{y_1}$ may satisfy <Equation 10> (n=1). Herein, the signals $\hat{x}$, $\widehat{y_1}$ and $\widehat{z_1}$ may satisfy <Equation 2>, and the 2-tone test signal $\hat{x}$ may include a component signal of a $f_1$ frequency and a component signal of a $f_2$ frequency. Similarly, when the 2-tone test signal $\hat{x}$ is inputted to the RF chain 210, an output signal $\widehat{y_2}$ of the phase shifter 910 may be detected at an input port of the coupler 921, and a coupled signal $\widehat{z_2}$ regarding the signal $\widehat{y_2}$ may satisfy <Equation 10> (n=2). When the signal $\widehat{z_2}$ is inputted to the power divider 933, the power divider 933 may output two signals $$\frac{\widehat{z_1}}{\sqrt{2}}$$

having halves of power of the input signal to the BPF 963 and the diode 945, respectively. Similarly, when the signal $\widehat{z_2}$ is inputted to the power divider 931, the power divider 931 may output two signals $$\frac{\widehat{z_2}}{\sqrt{2}}$$

having halves of power of the input signal to the BPF 961 and the diode 941, respectively.

In various embodiments, the BPF 961 may allow a signal the frequency of which is $f_1$ to pass therethrough, and may reject a signal having a different frequency (for example, a signal the frequency of which is $f_2$). In addition, the BPF 963 may allow a signal the frequency of which is $f_2$ to pass therethrough, and may allow a signal having a different frequency (for example, a signal the frequency of which is $f_1$) to pass therethrough. Accordingly, the output signal of the BPF 961 may include a component signal (hereinafter, referred to a $$\frac{(\widetilde{x} \ @ \ f_1)}{\sqrt{2}})$$

the frequency of which is $f_1$ in the signal $$\frac{\widetilde{x}}{\sqrt{2}},$$

and the output signal of the BPF 963 may include a component signal (hereinafter, referred to as $$\frac{(\widetilde{x} \ @ \ f_2)}{\sqrt{2}})$$

the frequency of which is $f_2$ in the signal $$\frac{\widetilde{x}}{\sqrt{2}}.$$

The signals $$\frac{(\widetilde{x} \ @ \ f_1)}{\sqrt{2}} \text{ and } \frac{(\widetilde{x} \ @ \ f_2)}{\sqrt{2}}$$

inputted to the power combiner 935 may be combined by the power combiner 935, and the power combiner 935 may output the combined signal $$\frac{(\widetilde{x} \ @ \ f_1) + (\widetilde{x} \ @ \ f_2)}{\sqrt{2}}$$

(hereinafter, referred to as In). The output signal of the power combiner 935 may be inputted to the diode 943, and the diode 943 may output a signal for determining a phase size of the phase shifter 910.

The signal In combined by the power combiner 935 may be expressed by <Equation 35> presented below, according to <Equation 16>:

$$\text{In} = (1/\sqrt{2}) * \hat{V}_1((1+\Delta_2)\angle\theta_2 + (1+\Delta'_1)\angle\theta'_1) \quad \text{Equation 35}$$

where In is a signal combined by the power combiner 935 or an output signal of the power combiner 935, $\hat{V}_1$ is a complex value of the 2-tone test signal $\hat{x}$, $\Delta_n$ is a variable satisfying $(1+\Delta_n)=(1+\Delta_{yn})(1+\Delta_{zn})$, $\Delta_{yn}$ is a change in the size of $\widehat{y_n}$ regarding $\hat{V}_1$ at $\omega_1$, $\Delta_{zn}$ is a change in the size of $\widehat{z_n}$ regarding a component $\widehat{V_{yn}}$ of $\widehat{y_n}$ at $\omega_1$, $\Delta'_n$ is a variable satisfying $(1+\Delta'_n)=(1+\Delta'_{yn})(1+\Delta'_{zn})$, $\Delta'_{yn}$ is a change in the size of $\widehat{y_n}$ regarding $\hat{V}_1$ at $\omega_2$, $\Delta'_{zn}$ is a change in the size of $\widehat{z_n}$ regarding a component $\widehat{V'_{yn}}$ of $\widehat{y_n}$ at $\omega_2$, $\theta_n$ is a variable satisfying $\angle\theta_n = \angle\theta_{yn} + \angle\theta_{zn}$, $\theta_{yn}$ is a change in the phase of $\widehat{y_n}$ regarding $\hat{V}_1$ at the $\omega_1$ frequency, $\theta_{zn}$ is a change in the phase of $\widehat{z_n}$ regarding $\widehat{V_{yn}}$ at $\omega_1$, $\theta'_n$ is a variable satisfying $\angle\theta'_n = \angle\theta'_{yn} + \angle\theta'_{zn}$, $\theta'_{yn}$ is a change in the phase of $\widehat{y_n}$ regarding $\hat{V}_1$ at the $\omega_2$ frequency, $\theta'_{zn}$ is a change in the phase of $\widehat{z_n}$ regarding $\widehat{V'_{yn}}$ at $\omega_2$, $\omega_1$ and $\omega_2$ are frequencies satisfying $\omega_1=2\pi f_1$, $\omega_2=2\pi f_2$, respectively, $\widehat{y_1}$ is an input signal of the phase shifter 910, $\widehat{y_2}$ is an output signal of the phase shifter 910, $\widehat{z_1}$ is a coupled signal regarding $\widehat{y_1}$, and $\widehat{z_2}$ is a coupled signal regarding $\widehat{y_2}$.

When the signal In passes through the diode 943, a phase size of a component signal the frequency of which is $\omega_1-\omega_2$ in the output signal of the diode 943 may be expressed by <Equation 36> presented below:

$$\angle\text{Out} = \angle(\theta_2 - \theta'_1) \quad \text{Equation 36}$$

where $\angle$Out is a phase size of a component signal the frequency of which is $\omega_1-\omega_2$ in the output signal of the diode 943, $\theta_n$ is a variable satisfying $\angle\theta_n = \angle_{yn} + \angle_{zn}$, $\theta_{yn}$ is a change in the phase of $\widehat{y_n}$ regarding $\hat{V}_1$ at the $\omega_1$ frequency, $\theta_{zn}$ is a change in the phase of $\widehat{z_n}$ regarding $\widehat{V_{yn}}$ at $\omega_1$, $\theta'_n$ is a variable satisfying $\angle\theta'_n = \angle'_{yn} + \angle'_{zn}$, $\theta'_{yn}$ is a change in the phase of $\widehat{y_n}$ regarding $\hat{V}_1$ at the $\omega_2$ frequency, $\theta'_{zn}$ is a change in the phase of $\widehat{z_n}$ regarding $\widehat{V'_{yn}}$ at $\omega_2$, $\omega_1$ and $\omega_2$ are frequencies satisfying $\omega_1=2\pi f_1$, $\omega_2=2\pi f_2$, respectively, $\widehat{y_1}$ is an input signal of the phase shifter 910, $\widehat{y_2}$ is an output signal of the phase shifter 910, $\widehat{z_1}$ is a coupled signal regarding $\widehat{y_1}$, $\widehat{z_2}$ is a coupled signal regarding $\widehat{y_2}$, $\widehat{V_{yn}}$ is a component signal of $\widehat{y_n}$ at $\omega_1$, and $\widehat{V'_{yn}}$ is a component signal of $\widehat{y_n}$ at $\omega_2$.

Accordingly, as shown in <Equation 37> presented below, a VLSI chip tester 230 may acquire a phase size $\angle S_{21}$ of the phase shifter 910, by subtracting the phase size of the component signal the frequency of which is ($\omega_1-\omega_2$) in the output signal of the diode 945 from the phase size of the component signal the frequency of which is $\omega_1-\omega_2$ in the output signal of the diode 943:

$$\angle S_{21} = \angle(\theta_1-\theta_2) = \angle(\theta_2-\theta'_1) - \angle(\theta_1-\theta'_1) \quad \text{Equation 37}$$

where $\angle S_{21}$ is a phase size of the phase shifter 910 (that is, a phase of an S-parameter of the phase shifter 910), $\theta_n$ is a variable satisfying $\angle\theta_n = \angle\theta_{yn} + \angle_{zn}$, $\theta_{yn}$ is a change in the phase of $\widehat{y_n}$ regarding $\hat{V}_1$ at the $\omega_1$ frequency, $\theta_{zn}$ is a change in the phase of $\widehat{z_n}$ regarding $\widehat{V_{yn}}$ at $\omega_1$, $\omega_1$ and $\omega_2$ are frequencies satisfying $\omega_1=2\pi f_1$, $\omega_2=2\pi f_2$, respectively, $\widehat{y_1}$ is an input signal of the phase shifter 910, $\widehat{y_2}$ is an output signal of the phase shifter 910, $\widehat{z_1}$ is a coupled signal regarding $\widehat{y_1}$, $\widehat{z_2}$ is a coupled signal regarding $\widehat{z_2}$, $\widehat{V_{yn}}$ is a component signal of $\widehat{y_n}$ at $\omega_1$, $\widehat{V'_{yn}}$ is a component signal of $\widehat{y_n}$ at $\omega_2$, $\angle(\theta_2-\theta'_1)$ is a phase size of the component signal the frequency of which is $\omega_1-\omega_2$ in the output signal of the diode 943, and $\angle(\theta_1-\theta'_1)$ is a phase size of the component signal the frequency of which is ($\omega_1-\omega_2$) in the output signal of the diode 945.

Furthermore, the VSLI chip tester 230 may determine a size $|S_{21}|$ of the S-parameter of the phase shifter 910, based on the size of the ($\omega_1-\omega_2$) frequency signal component in the output signal of the diode 945, and the size of the ($\omega_1-\omega_2$) frequency signal component in the output signal of the diode 941, according to <Equation 22>.

Although FIG. 9 illustrates the method for measuring the S-parameter of the phase shifter 910, the method described in FIG. 9 may be applied to measuring S-parameters of other circuit elements, in addition to the S-parameter of the phase shifter 910.

Figure 10:
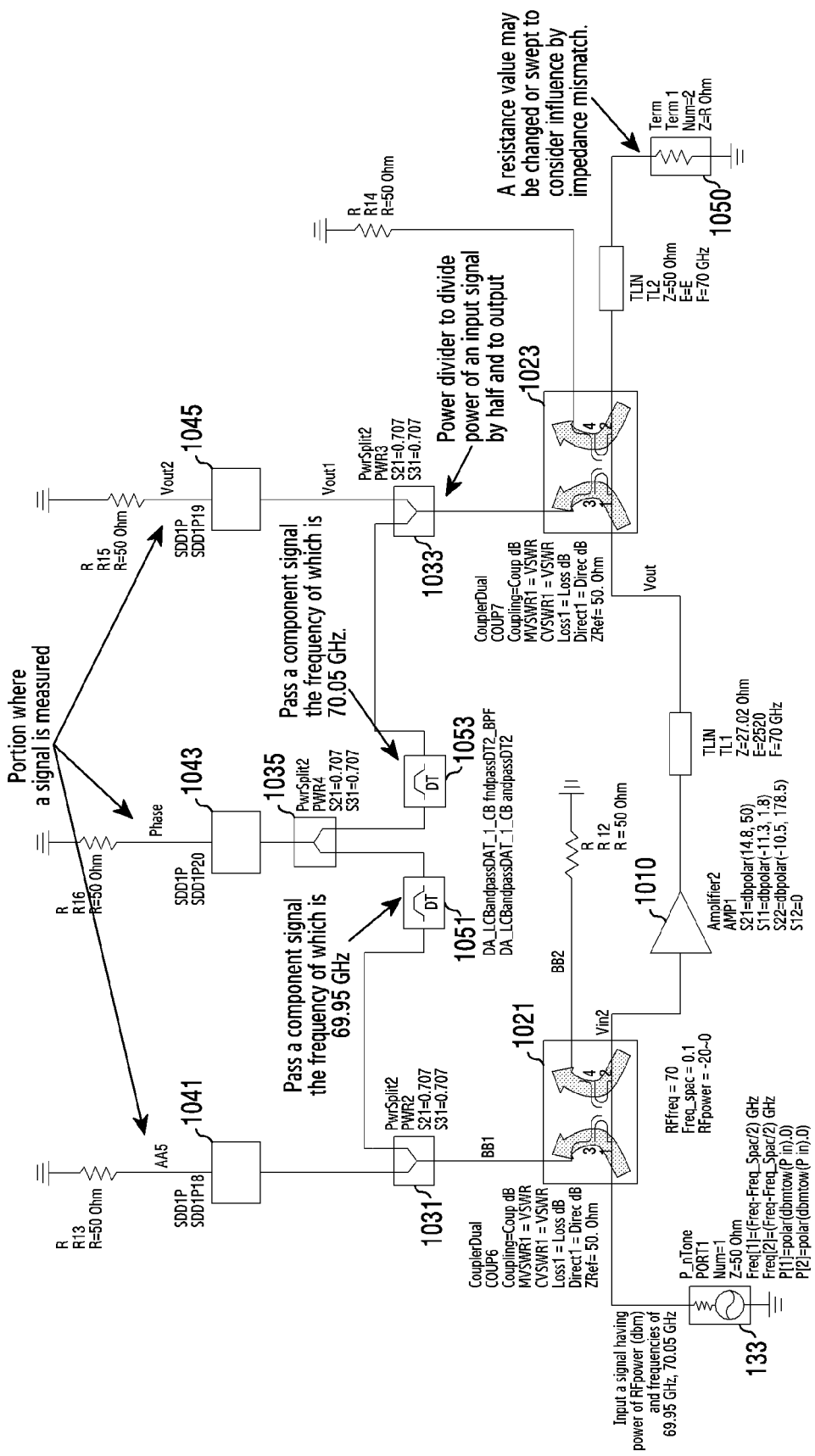
FIG. 10 is a view illustrating a simulation circuit for measuring electrical characteristics of an RF chain by using a BPF according to various embodiments.

FIG. 10 illustrates a simulation circuit for measuring electrical characteristics of an RF chain by using a BPF according to various embodiments.

Referring to FIG. 10, a signal generator 133 may input a 2-tone test signal to an amplifier 1010 for the sake of a harmonic balance simulation. Power of the 2-tone test signal may be RFpower (dbm), and the 2-tone test signal may include signal components frequencies of which are 69.95 GHz, 70.05 GHz, respectively. In the disclosure, RFpower may be a value within a range from −20 dBm to 0 dBm. The 2-tone test signal may be inputted to a coupler 1021, and the coupler 1021 may output the input signal of the amplifier 1010 to the amplifier 1010, and may output a coupled signal regarding the input signal of the amplifier 1010 to a power divider 1031. The output signal of the amplifier 1010 may be inputted to a coupler 1023, and the coupler 1023 may output a coupled signal regarding the output signal of the amplifier 1010 to a power divider 1033, and may output a signal to a resistor 1050. A resistance value of the resistor 1050 may be changed and/or swept to consider influence by impedance mismatch (for example, the resistance value may change from 10Ω to 90Ω). The power divider 1031 may output two signals having halves of power of the input signal from the coupler 1021 to a BPF 1051 and a diode 1041. Similarly, the power divider 1033 may output two signals having halves of power of the input signal from the coupler 1023 to a BPF 1053 and a diode 1045.

The BPF 1051 may allow a component signal the frequency of which is 69.95 GHz among the input signals from the power divider 1031, and may reject a component signal having a different frequency (for example, a component signal the frequency of which is 70.05 GHz). The BPF 1051 may input, to a power combiner 1035, the component signal the frequency of which is 69.95 GHz among the input signals from the power divider 1031. The BPF 1053 may allow the component signal the frequency of which is 70.05 GHz among the input signals from the power divider 1033 to pass therethrough, and may reject a component signal having a different frequency (for example, a component signal the frequency of which is 69.95 GHz). The BPF 1053 may input, to the power combiner 1035, the component signal the frequency of which is 70.05 GHz among the input signals from the power divider 1033. The power combiner 1035 may combine the signal the frequency of which is 69.95 GHz from the BPF 1051, and the signal the frequency of which is 70.05 GHz from the BPF 1053, and may output the combined signal to a diode 1043. Herein, signals inputted to the power combiner 1035 may be combined by the power combiner 1035.

A VLSI chip tester 230 may determine a size of an S-parameter of the amplifier 1010, based on a size of the signal component of the frequency of (70.05-69.95) GHz=100 MHz in the output signal of the diode 1045, and a size of the signal component of the frequency of 100 MHz in the output signal of the diode 1041. In addition, the VLSI chip tester 230 may determine a phase size of the amplifier 1010, by subtracting a phase size of the 100 MHz frequency signal component in the output signal of the diode 1041 from a phase size of the 100 MHz frequency signal component in the output signal of the diode 1043.

The size of the S-parameter regarding the amplifier 1010 according to a result of the harmonic balance simulation as shown in FIG. 10 may be expressed as shown in <Table 3> presented below:

TABLE 3

| |S21| (Input Power = −20 dBm) | Real S-parameter [dB] | Simulation Value [dB] |
|---|---|---|
| AMP1 | 14.8 | 13.7-15.7 |

Herein, |S21| refers to the size of the S-parameter of the amplifier 1010, and AMP1 refers to the amplifier 1010. A simulation value of the size of the S-parameter regarding AMP1 was calculated according to <Equation 38> presented below:

$$|S_{21}| = \frac{dBm(Vout2[::,1]) - dBm(AA5[::,1])}{2} \quad \text{Equation 38}$$

where |S21| is the size of the S-parameter of AMP1, dBm(Vout2[::,1]) is a size of the dBm unit of the signal component the frequency of which is 100 MHz in the output signal of the diode 1045, and dBm(AA5[::,1]) is a size of the dBm unit of the signal component the frequency of which is 100 MHz in the output signal of the diode 1041.

Meanwhile, the phase of the S-parameter regarding the amplifier 1010 according to a result of the harmonic balance simulation may be expressed as shown in <Table 4> presented below:

TABLE 4

| ∠S21 (Input Power = −20 dBm) | Real S-parameter [degree] | Simulation Value [degree] |
|---|---|---|
| AMP1 | 50 | 42.5-60 |

Herein, ∠S21 refers to the phase of the S-parameter of the amplifier 1010, and AMP1 refers to the amplifier 1010. A simulation value of the phase of the S-parameter regarding AMP1 was calculated according to <Equation 39> presented below:

$$\angle S21 = \frac{dBm(B1[::,1]) - dBm(A1[::,1]) - \text{phase change by filter}}{2} \quad \text{Equation 39}$$

Referring to <Table 3> and <Table 4> described above, an error between a simulation value regarding the size of the S-parameter and a real measurement value of the size of the S-parameter may be within 1.1 dB, and an error between a simulation value regarding the phase of the parameter and a real measurement value regarding the phase of the S-parameter may be within 10 degrees.

The device and the method according to various embodiments of the disclosure may measure electrical characteristics (for example, an S-parameter) of an individual circuit, which operates in a millimeter wave band, in a low-frequency band, by using an inter modulation phenomenon of a diode. Accordingly, according to various embodiments of the disclosure, functions necessary for measuring a circuit operating in a high frequency band may be included in a chip, and a cost required to measure and test may be noticeably reduced.

When a measurement circuit according to various embodiments of the disclosure is used for designing a multiple input, multiple output (MIMO) antenna system, a test using a probe may not be required for every channel, and a time required to measure and test may be noticeably reduced. In addition, since a plurality of channels are measured simultaneously according to various embodiments of the disclosure, the measurement device and/or the method according to various embodiments of the disclosure may be utilized as a self-calibration function for reducing a relative error between channels. For example, by reducing a relative error between channels, exact and precise analogue beamforming and/or beam tracing is possible, and a problem of nonuniformity of performance that a millimeter wave application system has may be solved.

Figure 11:
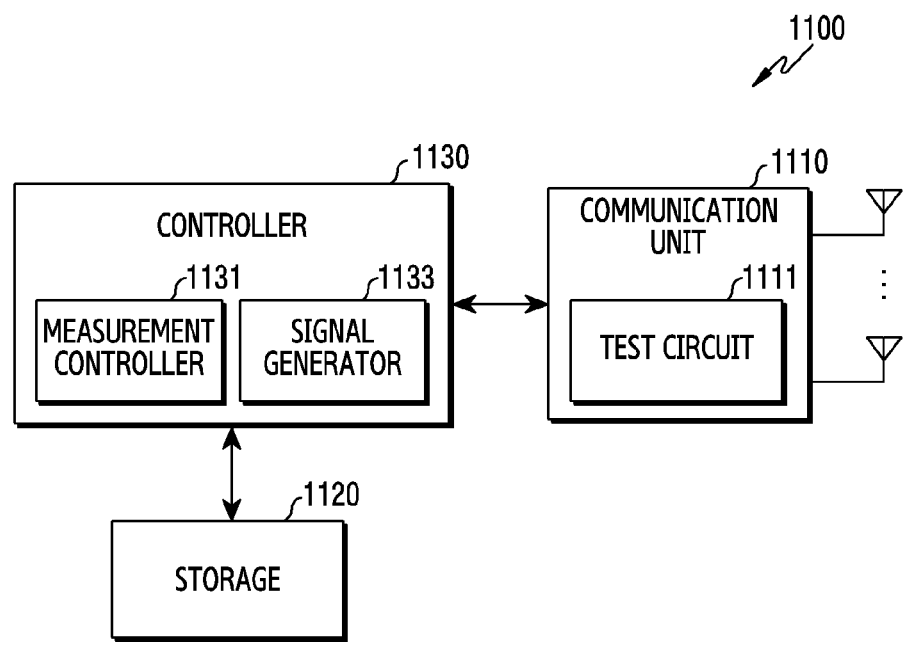
FIG. 11 is a view illustrating a configuration of a measurement device according to various embodiments.

FIG. 11 illustrates a configuration of a measurement device according to various embodiments. The configuration illustrated in FIG. 11 may be understood as a configuration of a measurement device 1100. The term "unit" or terms ending with suffixes "-er," and "-or" used in the following descriptions refer to a unit processing at least one function or operation, and may be implemented by hardware, software, or a combination of hardware and software.

Referring to FIG. 11, the measurement device includes a communication unit 1110, a storage 1120, and a controller 1130.

The communication unit 1110 performs functions for transmitting and receiving signals through a wireless channel. For example, the communication unit 1110 may perform a function of converting between a baseband signal and a bit stream according to a physical layer standard of a system. For example, when transmitting data, the communication unit 1110 may generate complex symbols by encoding and modulating a transmission bit stream. In addition, when receiving data, the communication unit 1110 may restore a reception bit stream by demodulating and decoding a baseband signal. In addition, the communication unit 1110 may up-convert a baseband signal into an RF band signal, and then may transmit the signal via an antenna, and may down-convert an RF band signal received via an antenna into a baseband signal. For example, the communication unit 1110 may include a transmission filter, a reception filter, an amplifier, a mixer, an oscillator, a digital-to-analogue converter (DAC), an analogue-to-digital converter (ADC), etc.

In addition, the communication unit 1110 may include a plurality of transmission and reception paths. Furthermore, the communication unit 1110 may include at least one antenna array including a plurality of antenna elements. In the hardware aspect, the communication unit 1110 may be configured by a digital circuit and an analog circuit (for example, a radio frequency integrated circuit (RFIC)). Herein, the digital circuit and the analogue circuit may be implemented as a single package. In addition, the communication unit 1110 may include a plurality of RF chains. Furthermore, the communication unit 1110 may perform beamforming.

The communication unit 1110 may transmit and receive signals as described above. Accordingly, an entirety or a portion of the communication unit 1110 may be referred to as a "transmitter," "receiver," or "transceiver." In addition, in the following descriptions, transmitting and receiving via a wireless channel may be used as a meaning including processing by the communication unit 1110 as described above.

In various embodiments, the communication unit 1110 may include a test circuit 1111. The test circuit 1111 may be built-in at least one chip included in the communication unit 1110. For example, the test circuit 1111 may include at least one built-in tester. In various embodiments, the built-in tester may be referred to as a tester, a built-in tester circuit, a built-in self tester, or a built-in self tester circuit. Each built-in tester may include at least one of coupler(s), diode(s), resistor(s), power divider(s), or power combiner(s).

In various embodiments, each RF chain of the communication unit 1110 may include a plurality of circuit elements (for example, an amplifier, a phase shifter, a mixer, and/or a local oscillator), and each circuit element may be disposed between two testers. The two testers may measure a signal related to characteristics of an input end and an output end of each circuit element, which is disposed therebetween, and may transmit the result of measurement to a measurement controller 1131. In the disclosure, the term 'RF chain' may be used interchangeably with a 'channel' or 'module'.

The storage 1120 may store data such as a basic program for the operation of the measurement device, an application program, configuration information, etc. The storage 1120 may be configured by a volatile memory, a nonvolatile memory, or a combination of a volatile memory and a nonvolatile memory. In addition, the storage 1120 may provide stored data according to a request of the controller 1130.

The controller 1130 may control overall operations of the measurement device. For example, the controller 1130 may transmit and receive signals via the communication unit 1110. In addition, the controller 1130 may write and read out data on or from the storage 1120. In addition, the controller 1130 may perform functions of a protocol stack required by communication standards. To achieve this, the controller 1130 may include at least one processor or micro processor, or may be a portion of a processor. In addition, a portion of the communication unit 1110 and the controller 130 may be referred to as a communication processor (CP).

According to various embodiments, the controller 1130 may include the measurement controller 1131 and a signal generator 1133. The measurement controller 1131 may include at least one of: a detector (for example, a detector 1630) to detect a result of measurement from the test circuit 1111; a digital controller (for example, a digital controller 1650) to receive the result of measurement from the detector, to determine electrical characteristics of each circuit element based on the result of measurement, and to generate a control value for each circuit element based on the measured electrical characteristics; and a serial peripheral interface (SPI) (for example, an SPI 1640) to transmit the control value to each circuit element in order to apply the control value to each circuit element, although they are not illustrated.

In various embodiments, the measurement device (for example, the measurement device 1100) may be an entity that performs wireless communication in a wireless communication system. For example, the measurement device may be a terminal or a base station. In various embodiments, the base station may be indicated by 'access point (AP),' 'eNodeB (eNB),' 'gNodeB (gNB),' '$5^{th}$ generation node (5G node),' 'wireless point,' 'transmission/reception point (TRP)' or other terms having the same technical meaning, in addition to 'base station.' In addition, the terminal may be indicated by 'user equipment (UE),' 'mobile station,' 'subscriber station,' 'remote terminal,' 'wireless terminal,' or 'user device' or other terms having the same technical meaning, in addition to 'terminal.'

In various embodiments, the measurement device (for example, the measurement device 1100) may be separate from an entity that performs wireless communication in a wireless communication system. For example, the measurement device may be a device for calibrating a circuit element in a factory which produces RF chips of a terminal and/or a base station. In this case, the measurement device may not include at least one of the communication unit 1110 or the storage 1120.

According to various embodiments, the controller 1130 may control the measurement device to perform operations according to various embodiments, which will be described below.

Hereinafter, various techniques for measuring characteristics of an RF chain will be described. In various embodiments, measuring characteristics of an RF chain may include measuring electrical characteristics of individual circuit elements included in the RF chain.

According to an embodiment, characteristics of an RF chain may be measured by using a probe station. According to a measurement technique based on a probe station, electrical characteristics of a chip may be identified by bringing a probe into contact with a pad in a semiconductor chip or a board. According to the measurement technique based on the probe station, since electrical characteristics of a chip are measured on a position close to a measurement reference surface, electrical characteristics of a circuit (for example, a circuit operating in a millimeter wave (mmWave) band) may be well measured. The measurement technique based on the probe station may have an advantage of measuring an inter-channel crosstalk by using a plurality of probes in identifying electrical characteristics of a phase array antenna-based system such as a $5^{th}$ generation (5G) system (or a new radio (NR) system). However, the measurement technique based on the probe station may not guarantee precise measurement due to interference between circuit elements.

According to an embodiment, characteristics of an RF chain may be measured based on a measurement technique based on a loop-back structure. According to the measurement technique based on the loop-back structure, electrical characteristics of an RF chain may be measured based on a loop-back structure which is formed by directly connecting an RF chain of a transmitter and an RF chain of a receiver, and returns back to an intermediate frequency end through the RF chains of the transmitter and the receiver, which operate in a millimeter wave band at the intermediate frequency end. For example, according to the measurement technique based on the loop-back structure, electrical characteristics of an RF chain may be measured by controlling a frequency by using a digital-to-analogue converter (DAC)/analogue-to-digital converter (ADC) built-in a chip set, and by identifying a vector quantity of a loop-back signal.

According to an embodiment, characteristics of an RF chain may be measured by a measurement technique based on a vector network analyzer (VNA) structure. According to the VNA structure, a separate measurement circuit for measuring the RF chain may be built in the RF chain. According to the measurement technique based on the VNA structure, a test signal from a low power oscillator may be transmitted to an input end of a transmitter or a receiver through a coupler, and may pass only through a measurement target RF chain by using a plurality of RF switches. Furthermore, the characteristics (for example, amplitude and/or phase characteristics of a circuit) of the RF chain may be identified by measuring a signal passing through the measurement target RF chain by using an I/Q receiver.

As described above, the measurement technique based on the probe station is a technique for measuring a measurement target RF chain by using an external measurement device. In order to apply the measurement technique based on the probe station, a probe pad may be required to be disposed in the measurement target RF chain, and a probe corresponding to a distal end electrode of the external measurement device may be required to exactly contact the probe pad. In addition, according to the measurement technique based on the probe station, it may be possible to measure an inter-channel crosstalk by using a plurality of probes, but it may be difficult to precisely measure due to interference between circuit elements. When individual measurement is performed for each channel by using a single probe, the measurement technique based on the probe station may have technical limitations that make it difficult to measure inter-channel crosstalk characteristics. In addition, when iterative measurement is performed for measurement based on the probe station, a time loss such as degradation of productivity caused by the iterative measurement may occur. Furthermore, in a system of a millimeter wave band such as 5G, equipment and/or facilities which have low durability and are expensive, such as a high-performance ultrahigh frequency network analyzer, a probe, a cable, may be required to perform measurement based on the probe station.

As described above, the measurement technique based on the loop-back structure may include operations of inputting, by a low-priced probe device operating in a low frequency, a test signal of an intermediate frequency into a chip, and identifying whole electrical characteristics of a transmitter and a receiver connected in a loop-back structure. Herein, the test signal of the intermediate frequency may be converted into a millimeter wave band by a frequency converter in the transmitter and the receiver of the loop structure. However, the measurement technique based on the loop-back structure may have a disadvantage that it is difficult to identify electrical characteristics of individual circuit elements included in the transmitter and the receiver, such as a low noise amplifier (LNA), a mixer, a filter. In addition, when an output from an amplifier of the transmitter is directly inputted to an LNA of the receiver according to the loop-back structure, a signal having high power is inputted to the LNA, and accordingly, a result of measurement may be distorted.

According to the measurement technique based on the VNA structure as described above, a test circuit capable of performing functions of an external measurement device may be built in a measurement target RF chain in order to measure an individual circuit of a transmitter or a receiver, and electrical characteristics of the RF chain may be measured by using the test circuit. However, a plurality of RF switches may be required on each reference surface in order to measure a plurality of measurement target RF chains or circuit elements by using the test circuit included in the chip. Accordingly, complexity of the whole circuit may increase, and it may be difficult to identify exact characteristics of an individual circuit element such as a low noise amplifier, a mixer, a filter included in the transmitter and/or receiver. In particular, uncertainty of measurement may increase due to a characteristic deviation between RF switches, which are used to share a test circuit in a phase array antenna, and an elongated transmission line.

Accordingly, various embodiments of the disclosure provide a method and a device for measuring characteristics of an RF chain.

In addition, various embodiments provide a method and a device for measuring electrical characteristics of circuit elements included in an RF chain, and for adjusting a circuit element value.

In addition, various embodiments provide a method and a device for self-testing a circuit included in a transmitter and/or a receiver operating in a millimeter wave band.

In addition, various embodiments provide an integrated circuit in a chip for measuring electrical characteristics of an individual circuit element included in a transmitter or a receiver by using a self-test function, and for self-calibrating a defect and/or an error derived, based on the measured characteristics, and an operating method thereof.

In addition, various embodiments provide a method and a device for self-calibration for enhancing overall system performance by collectively measuring a plurality of RF chains in a phase array antenna, measuring a performance deviation between RF chains, and measuring a crosstalk between RF chains.

In addition, various embodiments provide a method and a device for measuring an S-parameter regarding each circuit element by using the advantage of the probe station technique which directly measures a test signal on a reference surface of a circuit, and an operation of transmitting and receiving a low-frequency band signal through a loop-back structure.

In addition, various embodiments provide a built-in tester (BiT) (for example, including a coupled-line directional coupler, a diode) in a chip, for measuring characteristics of an individual circuit of a measurement target transmitter and/or a receiver by using a low-frequency test signal (for example, an N-tone test signal, a pulse, a frequency modulated continuous wave (FMCW) signal) inputted from the outside, and an operating method thereof.

In addition, various embodiments provide a method and a device for measuring an S-parameter of an individual circuit element operating in a millimeter wave band.

In addition, various embodiments provide a self-calibration method and a device for operating an RF transceiver appropriately by measuring characteristics of each circuit element or RF chain, measuring an error of a circuit element value or an error between RF chains, and removing the error.

In addition, various embodiments provide a method and a device for self-testing an antenna beam pattern in an array antenna system including a transmitter or receiver chip based on a BiT technique, and calibrating the beam pattern according to a result of self-testing.

Figure 12:
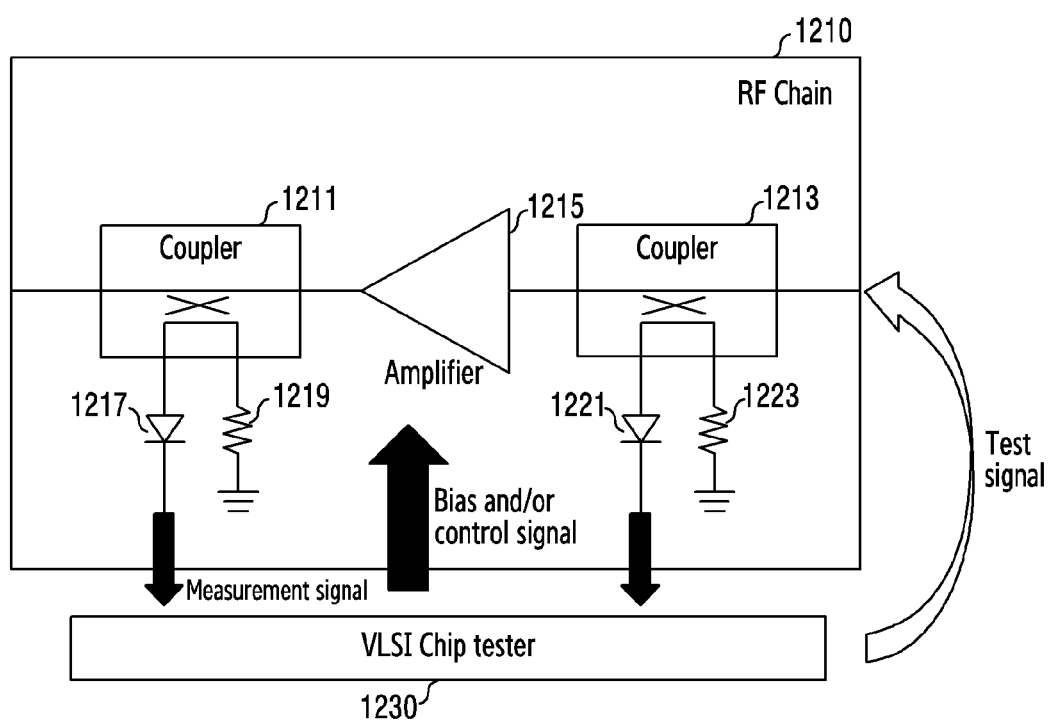
FIG. 12 is a view illustrating examples of configurations for measuring and controlling characteristics of a circuit element in a radio frequency (RF) chain according to various embodiments.

FIG. 12 illustrates examples of configurations for measuring and controlling characteristics of a circuit element in an RF chain according to various embodiments.

Referring to FIG. 2, the RF chain 1210 may include an amplifier 1215 and a tester, and the tester may include couplers 1211, 1213, diodes 1217, 1221, and resistors 1219, 1223. The coupler 1211 may be connected to an output end of the amplifier 1215, an anode of the diode 1217, and the resistor 1219. The coupler 1213 may be connected to an input end of the amplifier 1215, an anode of the diode 1221, and the resistor 1223. Cathodes of the diode 1217 and the diode 1221 may be connected to a very large scale integration (VLSI) chip tester 1230, and the resistors 1219 and 1223 may be connected to the ground. In various embodiments, the RF chain 1210 may be included in the communication unit 1110, and the tester may be included in the test circuit 1111.

The VLSI chip tester 1230 may generate a test signal and may input the test signal to the RF chain 1210. For example, the test signal may be inputted to the coupler 1213. The VLSI chip tester 1230 may provide a bias current or a bias voltage to the amplifier 1215, and may transmit a control signal for adjusting the amplifier 1215. In addition, the VLSI chip tester 1230 may receive a measurement signal from the diode 1217 and the diode 1221, and may measure electrical characteristics of the amplifier 1215 based on the measurement signal. Furthermore, the VLSI chip tester 1230 may generate a control signal for controlling the amplifier 1215 based on the measured electrical characteristics of the amplifier 1215. In various embodiments, the VLSI chip tester 1230 may include the measurement controller 1131 and the signal generator 1133, and may be included in the controller 1130.

In general, the diode (for example, the diode 1217 and the diode 1221) may allow a current to flow only in one direction. For example, the diode may be used in a power source device which converts an alternating current into a direct current, and a light emitting diode. Furthermore, the diode may be used to implement an unbalanced mixer. In this case, the diode may output, to the cathode, a signal having a frequency corresponding to a sum of frequencies of signals inputted to the anode of the diode, and a signal having a frequency corresponding to a difference between frequencies. In various embodiments, outputting the signal having the frequency corresponding to the sum of the frequencies of the inputted signals, and the signal having the frequency corresponding to the difference between the frequencies may be referred to as 'inter-modulation.' In other words, inter-modulation of input signals may be performed by the diode.

A coupled-line directional coupler (for example, the couplers 1211, 1213) may be connected to an input end of an individual circuit element to extract an input signal, or may be connected to an output end of the individual circuit element to extract an output signal. When an input signal of a high frequency extracted by the coupler passes through the diode, an input signal of a low frequency may be obtained by inter-modulation, and, when an output signal of a high frequency extracted by the coupler passes through the diode, an output signal of a low frequency may be obtained by inter-modulation. Accordingly, the VLSI chip tester operating in a low frequency band may measure electrical characteristics of an individual circuit element operating in a high frequency, based on the obtained low frequency signals.

As described above, in various embodiments of the disclosure, a measurement device (for example, the VLSI chip tester 230) operating in a low frequency band (for example, 10 MHz to 3.5 GHz) may measure an S-parameter of an individual circuit element which operates in a high frequency band (for example, a millimeter wave band), based on inter-modulation.

Figure 13:
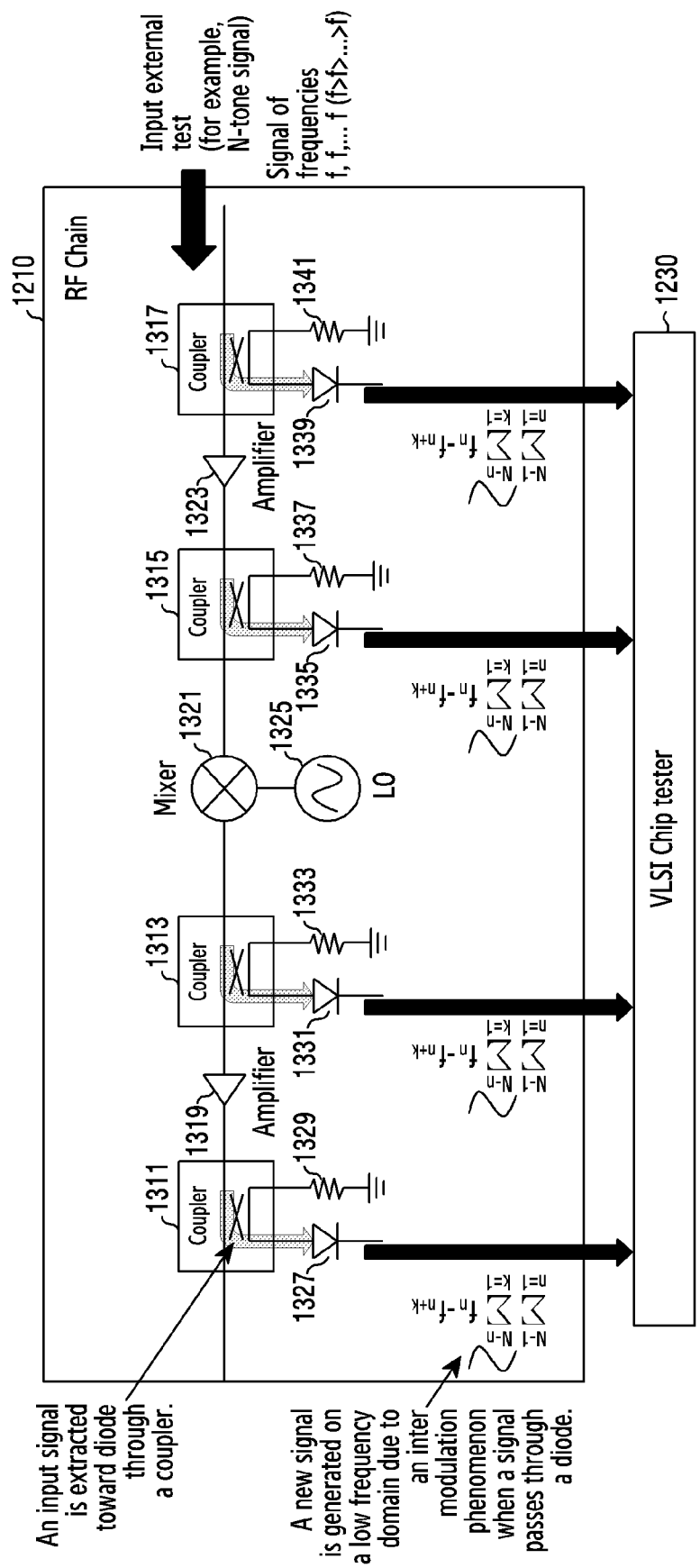
FIG. 13 is a view illustrating examples of configurations for measuring characteristics of circuit elements in an RF chain according to various embodiments.

FIG. 13 illustrates examples of configurations for measuring characteristics of circuit elements in an RF chain according to various embodiments.

Referring to FIG. 13, the RF chain 210 may include amplifiers 1319, 1323, a mixer 1321, a local oscillator (LO) 1325, and a tester. The tester may include couplers 1311, 1313, 1315, 1317, diodes 1327, 1331, 1335, 1339, resistors 1329, 1333, 1337, 1341. The coupler 1311 may be connected to an output end of the amplifier 1319, an anode of the diode 1327, and the other side of the resistor 1329 having one side connected to the ground. The coupler 1313 may be connected to an input end of the amplifier 1319, an output end of the mixer 1321, an anode of the diode 1331, and the other side of the resistor 1333 having one side connected to the ground. The coupler 1315 may be connected with an input end of the mixer 1321, an output end of the amplifier 1323, an anode of the diode 1335, and the other side of the resistor 1337 having one side connected to the ground. The coupler 1317 may be connected to an input end of the amplifier 1323, an anode of the diode 1339, and the other side of the resistor 1341 having one side connected to the ground. The mixer 1321 may be connected to the LO 1325. In various embodiments, the RF chain 1210 may be included in the communication unit 110, and the tester may be included in the test circuit 111.

In various embodiments, the coupler may include a resistive or capacitive coupler that does not have directionality, and a coupled-line directional coupler that has high directionality. The coupled-line directional coupler may include a unidirectional coupled-line coupler and a bidirectional coupled-line coupler. When the coupled-line directional couplers are disposed at an input end and an output end of an individual circuit element, the respective coupled-line directional couplers may extract an input signal or an output signal of the individual circuit element. Herein, since the unidirectional coupled-line coupler extracts only a signal of one direction, an insertion loss regarding the circuit element may be identified based on the unidirectional coupled-line coupler. On the other hand, since the bidirectional coupled-line coupler extracts signals of both directions, not only an insertion loss but also a return loss regarding the circuit element may be identified based on the bidirectional coupled-line coupler. The couplers (for example, the couplers 1311, 1313, 1315, 1317) used in various embodiments of the disclosure may be unidirectional coupled-line couplers or bidirectional coupled-line couplers.

In various embodiments, the diode (for example, the diodes 1327, 1331, 1335, 1339) may be used to implement an RF mixer. For example, the diode may function as an RF mixer to generate a signal of a low frequency from a signal of a high frequency. Since the diode may be designed on the periphery of the coupled-line directional coupler as shown in the drawing, a signal transmitted from the coupler may be directly measured on a measurement reference surface, and accordingly, there is an effect that the total wire length is reduced. In addition, since the diode operates without separate power, power for generating a signal of a low frequency from a signal of a high frequency may be reduced.

A VLSI chip tester 1230 may include a measurement controller 131 and a signal generator 133. The signal generator 133 may generate an N-tone test signal (for example, including N test signals of a cosine waveform having frequencies $f_1, f_2, f_3, \ldots, f_N$, respectively), and may input the generated N-tone test signal to the RF chain 1210 (for example, the coupler 1317). Herein, the frequencies of the N test signals satisfy a relationship of $f_1 > f_2 > f_3 > \ldots > f_N$. A part of the N-tone test signal inputted to the coupler 1317 may be outputted to the diode 1339, and a part thereof may be outputted to the input end of the amplifier 1323 to become an input signal of the amplifier 1323. A N-tone test signal component outputted to the diode 1339 may be inter-modulated by the diode 1339 to generate a signal having a frequency of $(f_n + f_{n+k})$ and a signal having a frequency of $(f_n - f_{n+k})$, and the measurement controller 131 of the VLSI chip tester 1230 may extract the signal having the frequency of $(f_n - f_{n+k})$ among the inter-modulated signals. For example, the measurement controller 131 of the VLSI chip tester 1230 may extract the signal having the frequency of $(f_n - f_{n+k})$ among the inter-modulated signals by using a low pass filter (LPF) or a band pass filter (BPF).

In various embodiments, the coupled-line directional coupler (for example, the couplers 1311, 1313, 1315, 1317) may extract power for the diode without distorting an input signal or an output signal of the circuit element, and the signal having the frequency of $(f_n - f_{n+k})$ among signals passing through the diode may reflect characteristics of an input signal or an output signal. Accordingly, the VLSI chip tester 1230 may acquire a ( ) signal corresponding to the input signal of the amplifier 1323 at the output end of the diode 1339, and in a similar method, may acquire a $$\left(\sum\nolimits_{n=1}^{N-1} \sum\nolimits_{k=1}^{N-n} f_n - f_{n+k}\right)$$

signal corresponding to the output signal of the amplifier 1323 or the input signal of the mixer 1315 at the output end of the diode 1335, a $$\left(\sum\nolimits_{n=1}^{N-1} \sum\nolimits_{k=1}^{N-n} f_n - f_{n+k}\right)$$

signal corresponding to the output signal of the mixer 1315 or the input signal of the amplifier 1319 at the output end of the diode 1331, and a $$\left(\sum\nolimits_{n=1}^{N-1} \sum\nolimits_{k=1}^{N-n} f_n - f_{n+k}\right)$$

signal corresponding to the output signal of the amplifier 1319 at the output end of the diode 1327. In the disclosure, the $$\left(\sum\nolimits_{n=1}^{N-1} \sum\nolimits_{k=1}^{N-n} f_n - f_{n+k}\right)$$

signal refers to a signal having a frequency of $$\left(\sum\nolimits_{n=1}^{N-1} \sum\nolimits_{k=1}^{N-n} f_n - f_{n+k}\right).$$

In various embodiments, the VLSI chip tester 1230 (the measurement controller 131 thereof) may measure electrical characteristics (for example, an S-parameter) of an individual circuit element by using the $$\left(\sum\nolimits_{n=1}^{N-1} \sum\nolimits_{k=1}^{N-n} f_n - f_{n+k}\right)$$

signals acquired at the output end of the diode. In various embodiments, the S-parameter is a parameter related to a transfer function of an input signal and an output signal, and may include a change in the amplitude of the input signal and the output signal, a phase difference and/or a response speed. For example, the VLSI chip tester 1230 may determine an S-parameter of the amplifier 1323, based on the $$\left(\sum\nolimits_{n=1}^{N-1} \sum\nolimits_{k=1}^{N-n} f_n - f_{n+k}\right)$$

signal from the diode 1339 and the $$\left(\sum_{n=1}^{N-1}\sum_{k=1}^{N-n} f_n - f_{n+k}\right)$$

signal from the diode 1335. In another example, the VLSI chip tester 1230 may determine an S-parameter of the mixer 1321, based on the $$\left(\sum_{n=1}^{N-1}\sum_{k=1}^{N-n} f_n - f_{n+k}\right)$$

signal from the diode 1335 and the $$\left(\sum_{n=1}^{N-1}\sum_{k=1}^{N-n} f_n - f_{n+k}\right)$$

signal from the diode 1331. In another example, the VLSI chip tester 1230 may determine an S-parameter of the amplifier 1319, based on $$\left(\sum_{n=1}^{N-1}\sum_{k=1}^{N-n} f_n - f_{n+k}\right)$$

signal from the diode 1331 and the $$\left(\sum_{n=1}^{N-1}\sum_{k=1}^{N-n} f_n - f_{n+k}\right)$$

signal from the diode 1327.

Figure 14:
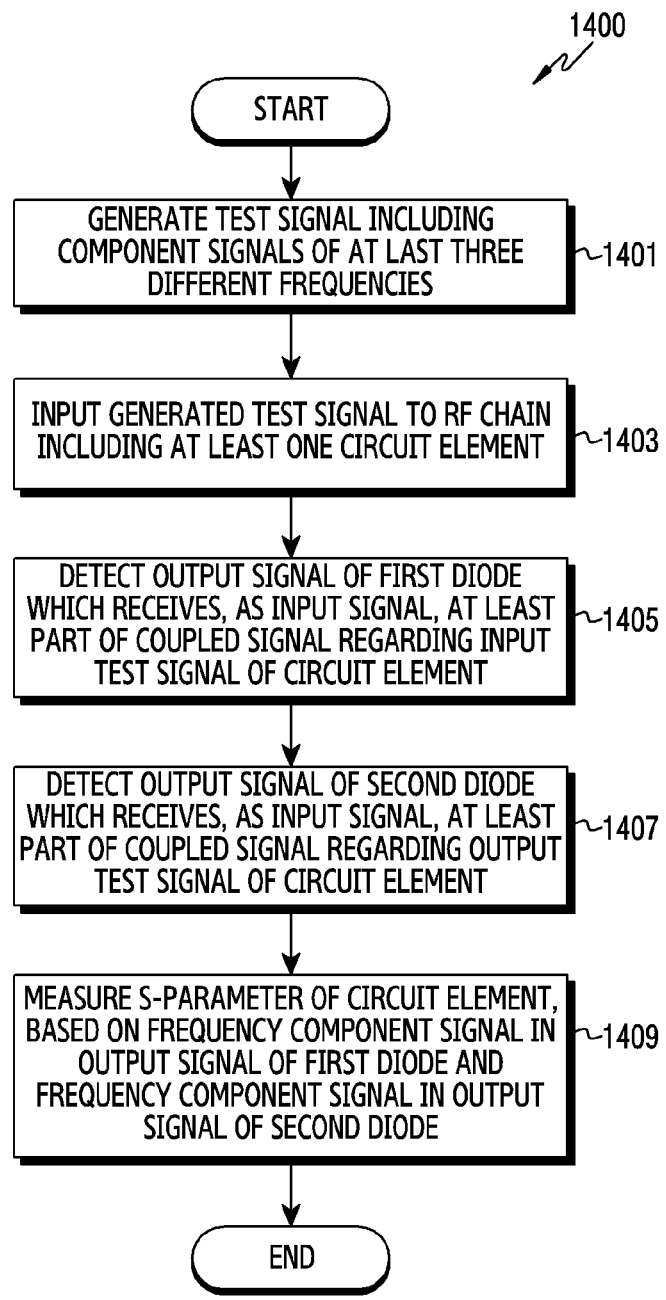
FIG. 14 is a flowchart of a measurement device according to various embodiments.

FIG. 14 illustrates a flowchart of a measurement device according to various embodiments. FIG. 14 illustrates an operating method of the measurement device 1100.

Referring to FIG. 14, at step 1401, the measurement device may generate a test signal including at least three frequency component signals which are different from one another. For example, the measurement device may generate N test signals (for example, an N-tone test signal) including at least a component signal of a first frequency $f_1$, a component signal of a second frequency $f_2$, and a component signal of a third frequency $f_3$.

At step 1403, the measurement device may input the generated test signal to an RF chain including at least one circuit element. The measurement device may input the test signal to the RF chain to allow N frequency component signals, which include the component signal of the first frequency, the component signal of the second frequency, and the component signal of the third frequency, to pass through each circuit element included in the RF chain.

At step 1405, the measurement device may detect an output signal of a first diode which receives at last part of a coupled signal regarding an input test signal of the circuit element as an input signal. In various embodiments, a coupled signal $\widehat{z_n}$ regarding a signal $\widehat{y_n}$ refers to a signal that is detected at a coupling port of a coupler when $\widehat{y_n}$ is detected at an output port and/or an input port of the coupler. According to an embodiment, the first diode may receive the coupled signal $\widehat{z_n}$ regarding the input test signal $\widehat{y_n}$ of the circuit element as an input signal.

At step 1407, the measurement device may detect an output signal of a second diode which receives at last part of a coupled signal regarding an output test signal of the circuit element as an input signal. According to an embodiment, the second diode may receive the coupled signal $\widehat{z_{n+1}}$ regarding the output test signal $\widehat{y_{n+1}}$ of the circuit element as an input signal.

FIG. 14 illustrates that step 1407 is performed after step 1405, but this is merely an example and various changes may be made. For example, step 1407 may precede step 1405 or step 1405 and step 1407 may be performed simultaneously.

At step 1409, the measurement device may measure an S-parameter regarding the circuit element based on a frequency component signal in the output signal of the first diode and a frequency component signal in the output signal of the second diode. Herein, a frequency of the frequency component signal may be a frequency difference between frequencies which are different from each other. In various embodiments, the S-parameter may include at least one of a size of the S-parameter and a phase of the S-parameter.

In various embodiments, the measurement device may determine the size of the S-parameter regarding the circuit element, based on a ratio of the size of the component signal of the frequency $$\left(\sum_{n=1}^{N-1}\sum_{k=1}^{N-n} f_n - f_{n+k}\right)$$

in the output signal of the second diode to the size of the component signal of the frequency $$\left(\sum_{n=1}^{N-1}\sum_{k=1}^{N-n} f_n - f_{n+k}\right)$$

in the output signal of the first diode. For example, the measurement device may determine the size of the S-parameter regarding the circuit element according to <Equation 18>.

In various embodiments, the measurement device may determine a response speed of the circuit element, based on a difference between the phase of the component signal of the frequency $$\left(\sum_{n=1}^{N-1}\sum_{k=1}^{N-n} f_n - f_{n+k}\right)$$

in the output signal of the first diode, and the phase of the component signal of the frequency $$\left(\sum_{n=1}^{N-1}\sum_{k=1}^{N-n} f_n - f_{n+k}\right)$$

in the output signal of the second diode. For example, the measurement device may determine the response speed of the circuit element according to <Equation 59>.

In various embodiments, the measurement device may further include an RF chain. In other words, the measurement device may be a device that includes an RF chain like a base station and a terminal. The measurement device may measure electrical characteristics of its own RF chain, and may self-calibrate the RF chain based on a result of measuring.

In various embodiments, the measurement device may adjust at least one bit value for calibrating the circuit element, based on the S-parameter regarding the circuit element. For example, the measurement device may calibrate the circuit element by adjusting a bit value of the circuit element to correspond to the S-parameter. In another example, the measurement device may calibrate the circuit element by adjusting the bit value of the circuit element to a value corresponding to the S-parameter.

In various embodiments, the frequency of the inputted test signal may be frequencies in a millimeter wave band, and the frequency detected at the measurement device may be a frequency in a low frequency band. For example, the first frequency $f_1$ may be 59.96 GHz, the second frequency $f_2$ may be 60.06 GHz, and the frequency may satisfy $f_1-f_2=100$ MHz. The above-described frequency values are merely examples and may be changeable.

Figure 15:
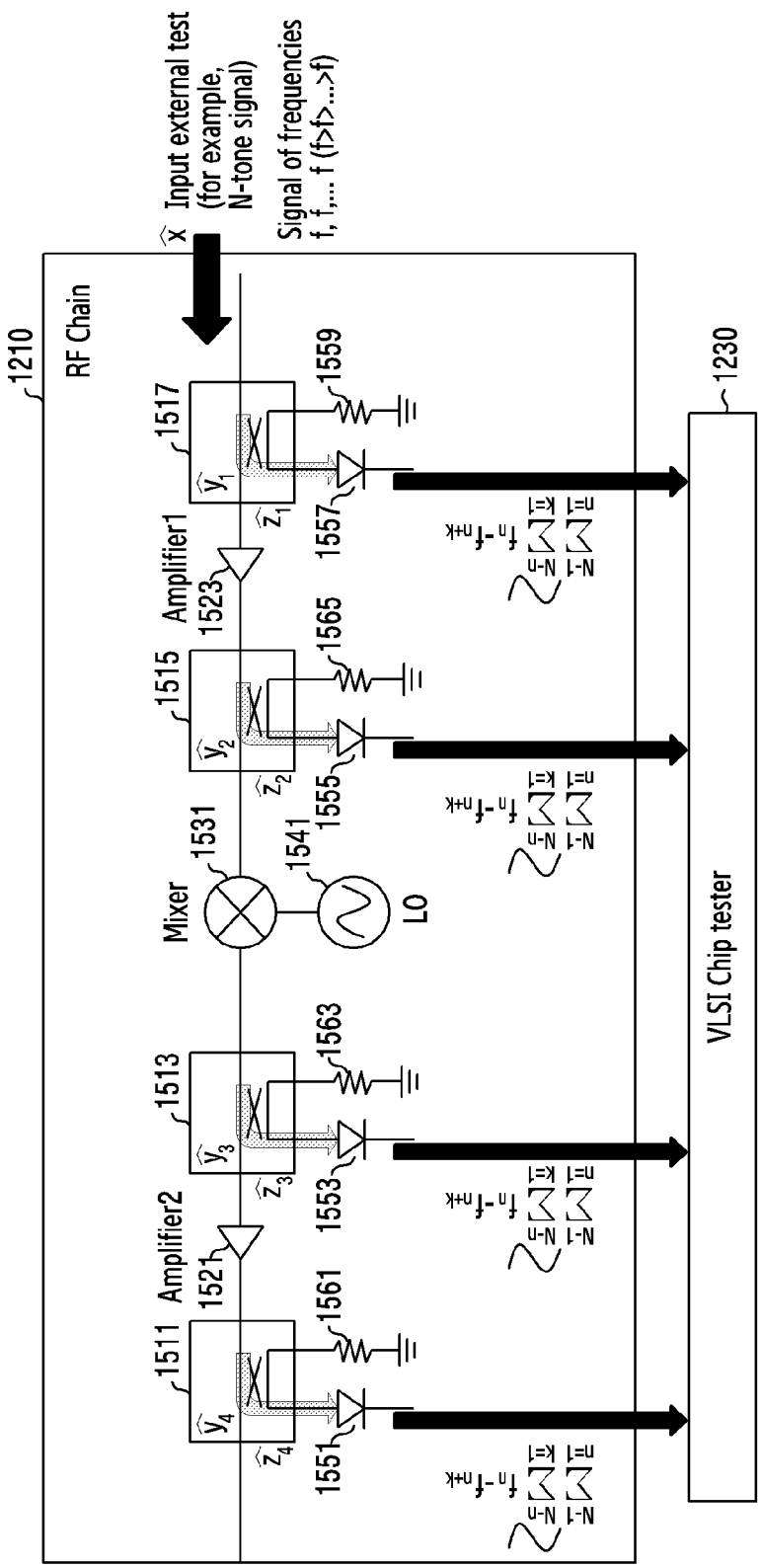
FIG. 15 is a view illustrating examples of configurations for measuring electrical characteristics of an RF chain by using an N-tone test signal according to various embodiments.

FIG. 15 illustrates examples of configurations for measuring electrical characteristics of an RF chain by using an N-tone test signal according to various embodiments. In the disclosure, an operation of measuring characteristics or electrical characteristics of the RF chain may include an operation of measuring characteristics or electrical characteristics of each circuit element constituting the RF chain.

Referring to FIG. 15, the RF chain 210 may include amplifiers 1521, 1523, a mixer 1531, an LO 1541, and a tester. The tester may include couplers 1511, 1513, 1515, 1517, diodes 1551, 1553, 1555, 1557, and resistors 1561, 1563, 1565, 1559. The coupler 1511 may be connected to an output end of the amplifier 1521, an anode of the diode 1551, and the other side of the resistor 1561 having one side connected to the ground. The coupler 1513 may be connected to an input end of the amplifier 1521, an output end of the mixer 1531, and the other side of the resistor 1563 having one side connected to the ground. The coupler 1515 may be connected to an input end of the mixer 1531, an output end of the amplifier 1523, an anode of the diode 1555, and the other side of the resistor 1565 having one side connected to the ground. The coupler 1517 may be connected to an input end of the amplifier 1523, an anode of the diode 1557, and the other side of the resistor 1559 having one side connected to the ground. The mixer 1531 may be connected to the LO 1541.

In various embodiments, a signal generator 1133 of a VLSI chip tester 1230 may input an N-tone test signal for measuring an S-parameter regarding each circuit element of the RF chain 1210 to the RF chain 1210. A circuit element which is a target for measuring the S-parameter may operate in a millimeter wave band, but an operating frequency is not limited to the millimeter wave band. Herein, a waveform of the N-tone test signal may be a cosine waveform, and sizes and phases of signals constituting the N-tone test signal may be the same as one another. The N-tone test signal may be inputted to the coupler 1517, first, and the N-tone test signal $\hat{x}$ may be expressed by <Equation 40> presented below:

$$\hat{x} = \sum_{n=1}^{N} \hat{V}_1 \cos(\omega_n t) \quad \text{Equation 40}$$

where $\hat{x}$ is an N-tone test signal, $\hat{V}_1$ is a complex value of the N-tone test signal $\hat{x}$, $\omega_n$ is frequencies of signals, and it is assumed that $\omega_1 > \omega_2 > \omega_N$ and $\approx \omega_1 \approx \omega_2 \ldots \approx \omega_N$.

Signals $\widehat{y_1}$, $\widehat{z_1}$ passing through the coupler 1517 may satisfy <Equation 41> presented below:

$$P(\widehat{y_1}) + P(\widehat{z_1}) = P(\hat{x}) \quad \text{Equation 41}$$

where $P(a)$ is power of a signal a, $\widehat{y_1}$ is a signal inputted to the amplifier 1523 among signals passing through the coupler 1517, $\widehat{z_1}$ is a signal inputted to the diode 1557 among signals passing through the coupler 1517, and $\hat{x}$ is an N-tone test signal. In addition, $|\widehat{y_1}| \approx |\widehat{x_1}|$ and $|\widehat{y_1}| >> |\widehat{z_1}|$. Herein, it is assumed that an insertion loss of a coupler is similar to 0 dB for convenience of calculation.

Similarly, signals $\widehat{y_n}$, $\widehat{z_m}$ passing through the coupler 1517, 1515, 1513 or 1511 may be expressed by <Equation 42> presented below:

$$P(\widehat{y_n}) + P(\widehat{z_m}) = |S_{mn}|^2 P(\widehat{y_n}), (n=m-1) \quad \text{Equation 42}$$

where $P(a)$ is power of a signal a, $\widehat{y_{n-1}}$ is an input signal regarding the coupler 1517, 1511, 1513 or 1515, $S_{nm}$ is an S-parameter of the amplifier 1521, 1523 or the mixer 1531, $\widehat{z_n}$ is a signal inputted to a diode among output signals of the coupler 1517, 1511, 1513 or 1515, and $\widehat{y_n}$ is the other signal components. The N-tone test signal $\hat{x}$ may be expressed by $\widehat{y_0}$, and $|\widehat{y_n}| \approx |S_{nm}|*\widehat{y_{n-1}}|$ and $\widehat{y_n} >> |\widehat{z_n}|$.

When the N-tone test signal $\hat{x}$ is inputted to the RF chain 1210, the signal $\widehat{y_n}$ which passes through each circuit element or is reflected on each circuit element may be expressed by <Equation 43> presented below according to electrical characteristics of the circuit element:

$$\widehat{y_n} = \sum_{n=1}^{N} \widehat{V_{yn}^m} \cos(\omega_n t) \quad \text{Equation 43}$$

where $\widehat{y_m}$ is a signal changed from the N-tone test signal $\hat{x}$ by each circuit element, $\omega_n$ is respective frequencies of signals, $\widehat{V_{yn}^m}$ is a complex value of an input signal the frequency of which is $w_n$ in a signal changed by a transmission end, and t is a time variable.

In <Equation 43>, $\widehat{V_{yn}^m}$ may be expressed by <Equation 44>:

$$(\widehat{V_{yn}^m} = \hat{V}_1 * (1 + \Delta_{yn}^m) \measuredangle \theta_{yn}^m, m=1,2,3,4) \quad \text{Equation 44}$$

where $\widehat{V_{yn}^m}$ is a complex value of an input signal the frequency of which is $w_n$ in a signal changed by a transmission end, $\hat{V}_1$ is a complex value of the N-tone test signal $\hat{x}$, $\Delta_{yn}$ is a change in the size of an input signal, and $\theta_{yn}$ is a change in the phase of the input signal.

Accordingly, S-parameters of the amplifier 1523 and the mixer 1531 may be expressed by <Equation 45> presented below:

$$S_{21} = \frac{(1+\Delta_{yn}^2)}{(1+\Delta_{yn}^1)} \measuredangle (\theta_{yn}^2 - \theta_{yn}^1) \text{ at } f_n$$

$$S_{32} = \frac{(1+\Delta_{yn}^3)}{(1+\Delta_{yn}^2)} \measuredangle (\theta_{yn}^3 - \theta_{yn}^2) \text{ at } f_n \quad \text{Equation 45}$$

$$S_{43} = \frac{(1+\Delta_{yn}^4)}{(1+\Delta_{yn}^3)} \measuredangle (\theta_{yn}^4 - \theta_{yn}^3) \text{ at } f_n$$

where $S_{21}$ is an S-parameter of the amplifier 1523, $S_{32}$ is an S-parameter of the mixer 1531, $S_{43}$ is an S-parameter of the amplifier 1521, $\Delta_{yn}$ is a change in the size of an input signal, $\theta_{yn}$ is a change in the phase of the input signal, and $f_1$ is a frequency satisfying $$f_1 = \frac{w_1}{2\pi},$$

$f_2$ is a frequency satisfying $$f_2 = \frac{w_2}{2\pi},$$

$f_3$ is a frequency satisfying $$f_3 = \frac{w_3}{2\pi},$$

and $f_4$ is a frequency satisfying $$f_4 = \frac{w_4}{2\pi}.$$

That is, $S_{21}$ is an S-parameter indicating passing characteristics of the amplifier 1523, $S_{32}$ is an S-parameter indicating passing characteristics of the mixer 1531, and $S_{43}$ is an S-parameter indicating passing characteristics of the amplifier 1521.

A signal component $\widehat{z_n}$ inputted to a diode in a signal passing through a coupler may satisfy <Equation 46> presented below according to a response speed and a combining factor of the coupler:

$$\widehat{z_m} = \sum_{n=1}^{N} \widehat{V_{zn}^m} \cos(\omega_n t) \qquad \text{Equation 46}$$

where $\widehat{z_m}$ is a component of a signal coupled by the signal $\widehat{y_n}$ which is changed from the N-tone test signal by the circuit element, through a coupler, $\widehat{V_{zn}^m}$ is a complex value of an input signal in which each frequency changed according to characteristics of the coupler is $w_n$, and t is a time variable.

In <Equation 46>, $\widehat{V_{zn}^m}$ may be expressed by <Equation 47> presented below:

$$\left(\widehat{V_{zn}^m} = \widehat{V_{yn}^m} * (1 + \Delta_{zn}^m) \angle \theta_{zn}^m\right) \qquad \text{Equation 47}$$

where $\widehat{V_{zn}^m}$ is a complex value of an input signal in which each frequency changed according to characteristics of a coupler is $w_n$, $\widehat{V_{yn}^m}$ is a complex value of an input signal the frequency of which is $w_n$ in a signal changed by a transmission end, $\Delta_{zn}^m$ is a change in the size of the signal $\widehat{y_n}$, and $\angle\theta_{zn}^m$ is a change in the phase of the signal $\widehat{y_n}$.

Meanwhile, current-voltage characteristics of each diode may satisfy <Equation 48> presented below:

$$y(x) = e^{\frac{x}{c}} \qquad \text{Equation 48}$$

where y is an output current of a diode, x is an input voltage of a diode, and c is a calibration coefficient.

The Maclaurin series expression of <Equation 48> may be expressed by <Equation 49> presented below:

$$y(x) = e^{\frac{x}{c}} - 1 \approx \frac{x}{c} + \frac{x^2}{2c^2} + \dots \quad (x < c) \qquad \text{Equation 49}$$

where y is an output current of a diode, x is an input voltage of a diode, and c is a calibration coefficient.

Accordingly, a signal passing through a diode may be expressed by <Equation 50> presented below:

$$y(\widehat{z_m}) \approx \frac{\sum_{n=1}^{N} \widehat{v_{zn}^m} \cos(\omega_n t)}{c} + \frac{1}{2c^2} * \left(\sum_{n=1}^{N} \widehat{v_{zn}^m}{}^2 \cos(2\omega_n t)\right) +$$
$$\frac{1}{2c^2} * \left(\sum_{n=1}^{N-1}\sum_{k=1}^{N-n} \widehat{v_{zn}^m} * \widehat{v_{z(n+k)}^m} \cos((\omega_n + \omega_{n+k})t)\right) +$$
$$\frac{1}{2c^2} * \left(\sum_{n=1}^{N-1}\sum_{k=1}^{N-n} \widehat{v_{zn}^m} * \widehat{v_{z(n+k)}^m} \cos((\omega_n - \omega_{n+k})t)\right)$$

Equation 50 where $\widehat{z_m}$ is a component of a signal coupled by the signal $\widehat{y_m}$ through a coupler, $y(\widehat{y_m})$ is a signal of $\widehat{z_m}$ passing through a diode, $\omega_n$, $\omega_{n+k}$ are respective frequencies, $\widehat{V_{zn}^m}$ is a complex value of an input signal in which each frequency changed according to characteristics of a coupler is $w_n$, $\widehat{V_{z(n+k)}^m}$ is a complex value of an input signal in which each frequency changed according to characteristics of a coupler is $w_{n+k}$, t is a time variable, and c is a calibration coefficient of a diode.

According to <Equation 50>, a signal passing through a diode may include signals including $\omega_n$ and other frequency components due to an inter modulation phenomenon.

Comparing <Equation 46> and <Equation 50>, a complex value $\widehat{V_{zn}^m} * \widehat{V_{z(n+k)}^m}$ of each frequency $(\omega_n - \omega_{n+k})$ signal of a signal $y(\widehat{z_m})$ passing through a diode may be expressed by a product of a complex value $\widehat{V_{zn}^m}$ of each frequency $\omega_n$ signal and a complex value $\widehat{V_{z(n+k)}^m}$ of each frequency $\omega_{n+k}$ signal in the signal $\widehat{z_m}$ before passing through the diode. Accordingly, electrical characteristics (that is, an S-parameter) of each circuit element may be measured by using a signal component having each frequency $(\omega_n - \omega_{n+k})$ among signals passing through a diode.

When a signal having N-tone is inputted to the RF chain, a complex value $$\frac{1}{2c^2} * \widehat{V_{zn}^m} * \widehat{V_{z(n+k)}^m}$$

of a signal the frequency of which is $(\omega_n - \omega_{n+k})$ according to <Equation 50> may be expressed by <Equation 51> presented below:

$$\frac{1}{2c^2} * \widehat{V_{zn}^m} * \widehat{V_{z(n+k)}^m} = \frac{1}{2c^2} * \hat{V}_1^2 * (1 + \Delta_n^m)(1 + \Delta_{n+k}^m) \angle (\theta_n^m - \theta_{n+k}^m) \qquad \text{Equation 51}$$

where $\widehat{V_{zn}}^m$ is a complex value of an input signal in which each frequency changed according to characteristics of a coupler is $\widehat{V_{z(n+k)}}^m$ is a complex value of an input signal in which each frequency changed according to characteristics of a coupler is $w_{n+k}$, c is a calibration coefficient of a diode, $\hat{V}_1$ is a complex value of the N-tone test signal $\hat{x}$, $\Delta_n^m$ is a variable satisfying $(1+\Delta_n^m)=(1+\Delta_{yn}^m)(1+\Delta_{zn}^m)$, $\Delta_{yn}^m$ is a change in the size of $\widehat{y_n}$ at $\omega_n$, $\Delta_{zn}^m$ is a change in the size of $\widehat{z_n}$ at $\omega_n$, $\Delta_{n+k}^m$ is a variable satisfying $1+\Delta_{n+k}^m = (+\Delta_{y(n+k)}^m)(1+\Delta_{z(n+k)}^m)$, $\Delta_{y(n+k)}^m$ is a change in the size of $\widehat{y_{n+k}}$, $\Delta_{z(n+k)}^m$ is a change in the size of $\widehat{z_{n+k}}$, $\theta_n^m$ is a variable satisfying $\measuredangle\theta_n^m = \measuredangle\theta_{yn}^m + \measuredangle\theta_{zn}^m$, $\theta_{yn}^m$ is a change in the phase of $\widehat{y_n}$ at the $\omega_n$ frequency, $\theta_{zn}^m$ is a change in the phase of $\widehat{z_n}$ at $\omega_n$, $\measuredangle\theta_{n+k}^m$ is a variable satisfying $\measuredangle\theta_{n+k}^m = \measuredangle\theta_{y(n+k)}^m + \measuredangle\theta_{z(n+k)}^m$, $\theta_{y(n+k)}^m$ is a change in the phase of $\widehat{y_{n+k}}$, and $\theta_{z(n+k)}^m$ is a change in the phase of $\widehat{z_{n+k}}$.

According to <Equation 51>, $$\frac{1+\Delta_n^2}{1+\Delta_n^1}$$

may be defined as shown in <Equation 52> presented below:

$$\frac{1+\Delta_n^2}{1+\Delta_n^1} = \frac{(1+\Delta_{yn}^2)(1+\Delta_{zn}^2)}{(1+\Delta_{yn}^1)(1+\Delta_{zn}^1)} \quad \text{Equation 52}$$

where $\Delta_n^1$ is a variable satisfying $1+\Delta_n^1=(1+\Delta_{yn}^1)(1+\Delta_{zn}^1)$, $\Delta_{yn}^1$ is a change in the size of $\widehat{y_n}$ passing through a coupler, $\Delta_{zn}^1$ is a change in the size of $\widehat{z_n}$ passing through a coupler, $\Delta_n^2$ is a variable satisfying $(1+\Delta_n^2)=(1+\Delta_{yn}^2)(1+\Delta_{zn}^2)$, $\Delta_{yn}^2$ is a change in the size of $\widehat{y_n}$ passing through a coupler, and $\Delta_{zn}^2$ is a change in the size of $\widehat{z_n}$ passing through a coupler.

If the couplers 1511, 1513, 1515, and 1517 are the same as one another, the change in the size $\Delta_{zn}$ and the change in the phase $\theta_{zn}$ of signals passing through the couplers are all the same, and accordingly, <Equation 53> and <Equation 54> may be established.

$$(1+\Delta_{zn}^1)=(1+\Delta_{zn}^2)=(1+\Delta_{zn}^3)=(1+\Delta_{zn}^4) \quad \text{Equation 53}$$

where $\Delta_{zn}^1$ is a change in the size of a signal passing through the coupler 1517, $\Delta_{zn}^2$ is a change in the size of a signal passing through the coupler 1515, $\Delta_{zn}^3$ is a change in the size of a signal passing through the coupler 1513, and $\Delta_{zn}^4$ is a change in the size of a signal passing through the coupler 1511.

$$\theta_{zn}^1=\theta_{zn}^2=\theta_{zn}^3=\theta_{zn}^4 \quad \text{Equation 54}$$

where $\theta_{zn}^1$ is a change in the phase of a signal passing through the coupler 1517, $\theta_{zn}^2$ is a change in the phase of a signal passing through the coupler 1515, $\theta_{zn}^3$ is a change in the phase of a signal passing through the coupler 1513, and $\theta_{zn}^4$ is a change in the phase of a signal passing through the coupler 1511.

Accordingly, <Equation 52> may be expressed by <Equation 55> presented below:

$$\frac{1+\Delta_n^2}{1+\Delta_n^1} = \frac{(1+\Delta_{yn}^2)(1+\Delta_{zn}^2)}{(1+\Delta_{yn}^1)(1+\Delta_{zn}^1)} = \frac{(1+\Delta_{yn}^2)}{(1+\Delta_{yn}^1)} = |S_{21}| \text{ at } f_n \quad \text{Equation 55}$$

where $\Delta_n^1$ is a variable satisfying $1+\Delta_n^1=(1+\Delta_{yn}^1)(1+\Delta_{zn}^1)$, $\Delta_{yn}^1$ is a change in the size of $\widehat{y_n}$ passing through a coupler, $\Delta_{zn}^1$ is a change in the size of $\widehat{z_n}$ passing through a coupler, $\Delta_n^2$ is a variable satisfying $1+\Delta_n^2=(1+\Delta_{yn}^2)(1+\Delta_{zn}^2)$, $\Delta_{yn}^2$ a change in the size of $\widehat{y_n}$ passing through a coupler, $\Delta_{zn}^2$ a change in the size of $\widehat{z_n}$ passing through a coupler, and $|S_{21}|$ at $f_1$ is a size of an S-parameter regarding an amplifier at a frequency $$f_n = \frac{w_n}{2\pi}.$$

Similarly, $$\frac{1+\Delta_2'}{1+\Delta_1'}$$

may be expressed by <Equation 56> presented below:

$$\frac{1+\Delta_{n+k}^2}{1+\Delta_{n+k}^1} = \quad \text{Equation 56}$$

$$\frac{(1+\Delta_{y(n+k)}^2)(1+\Delta_{z(n+k)}^2)}{(1+\Delta_{y(n+k)}^1)(1+\Delta_{z(n+k)}^1)} = \frac{(1+\Delta_{y(n+k)}^2)}{(1+\Delta_{y(n+k)}^1)} = |S_{21}| \text{ at } f_{n+k}$$

where $\Delta_{n+k}^1$ is a variable satisfying $(1+\Delta_{y(n+k)}^1)(1+\Delta_{z(n+k)}^1)$, $\Delta_{y(n+k)}^1$ is a change in the size of $\widehat{y_{n+k}}$ passing through a coupler, $\Delta_{z(n+k)}^1$ is a change in the size of $\widehat{z_{n+k}}$ passing through a coupler, $\Delta_{n+k}^2$ is a variable satisfying $(1+\Delta_{y(n+k)}^2)(1+\Delta_{z(n+k)}^2)$, $\Delta_{y(n+k)}^2$ is a change in the size of $\widehat{y_{n+k}}$ passing through a coupler, $\Delta_{z(n+k)}^2$ is a change in the size of $\widehat{z_{n+k}}$ passing through a coupler, and $|S_{21}|$ at $f_{n+k}$ is a size of an S-parameter regarding an amplifier at a frequency $$f_{n+k} = \frac{w_{n+k}}{2\pi}.$$

According to <Equation 55> and <Equation 56>, on the assumption that $$\frac{(1+\Delta_2)(1+\Delta_2')}{(1+\Delta_1)(1+\Delta_1')}$$

is a product of sizes of $S_{21}$ at $f_n$, $f_{n+k}$ and $f_n \approx f_{n+k}$ (that is, $\omega_n \approx \omega_{n+k}$), S-parameter characteristics may indicate a continuous function regarding frequencies. Accordingly, the size of the S-parameter regarding the amplifier 1523, $|S_{21}|$, may be expressed by <Equation 57> presented below:

$$|S_{21}| \approx \sqrt{\frac{(1+\Delta_n^2)}{(1+\Delta_n^1)} \frac{(1+\Delta_{n+k}^2)}{(1+\Delta_{n+k}^1)}} \text{ at } \frac{f_n+f_{n+k}}{2} \quad \text{Equation 57}$$

where $|S_{21}|$ is a size of an S-parameter, $\Delta_n^1$ is a variable satisfying $1+\Delta_n^1=(1+\Delta_{yn}^1)(1+\Delta_{zn}^1)$, $\Delta_n^2$ is a variable satisfying $1+\Delta_n^2=(1+\Delta_{yn}^2)(1+\Delta_{zn}^2)$, $\Delta_{n+k}^1$ is a variable satisfying $(1+\Delta_{y(n+k)}^1)(1+\Delta_{z(n+k)}^1)$, and $\Delta_{n+k}^2$ is a variable satisfying $(1+\Delta_{y(n+k)}^2)(1+\Delta_{z(n+k)}^2)$.

Similarly, a size of an S-parameter regarding the mixer 1531 and a size of an S-parameter regarding the amplifier 1521 may also be measured.

As a result, according to various embodiments, the VLSI chip tester 1230 may measure a size of an S-parameter of each circuit element by measuring a size of a signal the frequency of which is $\omega_n$-$\omega_{n+k}$ in an output signal of a diode.

In addition, according to various embodiments, the VLSI chip tester 1230 may measure a phase of an S-parameter of each circuit element by measuring a phase of a signal the frequency of which is $\omega_n$-$\omega_{n+k}$ in an output signal of a diode.

For example, when a response speed of the amplifier 1523 is $\tau_1$, <Equation 58> presented below may be satisfied.

$$(\theta_n^2 - \theta_{n+k}^2) - (\theta_n^1 - \theta_{n+k}^1) = -(\omega_n - \omega_{n+k})\tau_1 \quad \text{Equation 58}$$

where $\theta_n^2$ is a variable satisfying $\angle \theta_n^2 = \angle \theta_{yn}^2 + \angle \theta_{zn}^2$, $\theta_{n+k}^2$ is a variable satisfying $\angle \theta_{n+k}^2 = \angle \theta_{y(n+k)}^2 + \angle \theta_{z(n+k)}^2$, $\theta_n^1$ is a variable satisfying $\angle \theta_n^1 = \angle \theta_{yn}^1 + \angle \theta_{zn}^1$, $\theta_{n+k}^1$ is a variable satisfying $\angle \theta_{n+k}^1 = \angle \theta_{y(n+k)}^1 + \angle \theta_{z(n+k)}^1$, and $\tau_1$ is a response speed of the amplifier 1523.

According to <Equation 58>, the response speed of the amplifier 1523, $\tau_1$, may be expressed by <Equation 59> presented below:

$$\tau_1 = -\frac{(\theta_n^2 - \theta_{n+k}^2) - (\theta_n^1 - \theta_{n+k}^1)}{(\omega_n - \omega_{n+k})} \text{ at } \frac{f_n + f_{n+k}}{2} \quad \text{Equation 59}$$

where $\tau_1$ is a response speed of an amplifier, $\theta_n^2$ is a variable satisfying $\angle \theta_n^2 = \angle \theta_{yn}^2 + \angle \theta_{zn}^2$, $\theta_{n+k}^2$ is a variable satisfying $\angle \theta_{n+k}^2 = \angle \theta_{y(n+k)}^2 + \angle \theta_{z(n+k)}^2$, $\theta_n^1$ is a variable satisfying $\angle \theta_n^1 = \angle \theta_{yn}^1 + \angle \theta_{zn}^1$, and $\theta_{n+k}^1$ is a variable satisfying $\angle \theta_{n+k}^1 = \angle \theta_{y(n+k)}^1 + \angle \theta_{z(n+k)}^1$.

In <Equation 59>, $\theta_n^2 - \theta_{n+k}^2$ is a phase of a $(\omega_n - \omega_{n+k})$ frequency signal component in an output signal of the diode 1555, and $\theta_n^1 - \theta_{n+k}^1$ is a phase of a $(\omega_n - \omega_{n+k})$ frequency signal component in an output signal of the diode 1557.

Accordingly, the VLSI chip tester 1230 may measure a response speed of the amplifier 1523 by measuring a phase of a signal the frequency of which is $(\omega_n - \omega_{n+k})$ in the output signal of the diode 1555 and the output signal of the diode 1557. Similarly, the VLSI chip tester 1230 may measure a response speed of the mixer 1531 and/or the amplifier 1521 by measuring a phase of a signal the frequency of which is $\omega_1$-$\omega_2$ in the output signal of a diode.

However, if a difference between two frequencies among N frequencies (N is an integer satisfying N≥3) is the same as a difference between other two frequencies, <Equation 57> and <Equation 59> may not be established. For example, if $f_1$-$f_2$=$f_2$-$f_3$ when 3-tone frequencies ($f_1$, $f_2$, $f_3$) are used, different signals may be mixed in the same frequency ($f_1$-$f_2$) and a measurement error may increase. Accordingly, when N frequencies are used, a condition as shown in <Equation 60> may be required:

$$f_a - f_b \neq f_c - f_d (a<b, c<d) \quad \text{Equation 60}$$

where $f_a$, $f_b$, $f_c$, $f_d$ may indicate certain frequencies which are different from one another. a may be determined by any one of 1 to N−1, and b may be determined by any one of 2 to N, c may be determined by any one of 1 to N−1, and d may be determined by any one of 2 to N.

Figure 16:
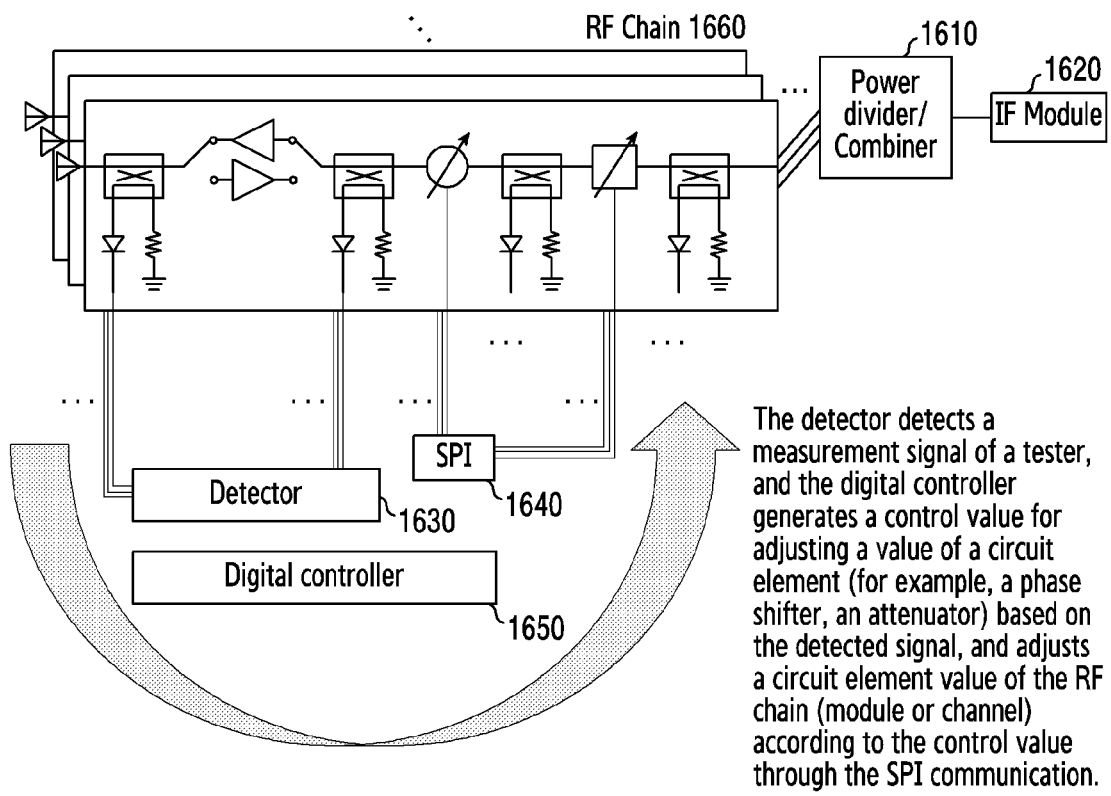
FIG. 16 is a view illustrating a circuit structure for self-calibration according to various embodiments.

FIG. 16 illustrates a circuit structure for self-calibration according to various embodiments.

Referring to FIG. 16, the circuit for self-calibration may include a power divider/combiner 1610, an IF module 1620, a detector 1630, an SPI 1640, a digital controller 1650, and RF chains 1660. In various embodiments, the power divider/combiner 1610, the IF module 1620, the detector 1630, the SPI 1640, the digital controller 1650, and the RF chains 1660 may be included in the measurement device 100. For example, the detector 1630, the SPI 1640, the digital controller 1650 may be included in the measurement controller 1131, and the power divider/combiner 1610, the IF module 1620, and the RF chains 1660 may be included in the communication unit 110. The power divider/combiner 1610 may be included in the test circuit 111.

In various embodiments, the detector 1630 may detect a measurement signal of a tester of the RF chains 1660 and/or the power divider/combiner 1610. The digital controller 1650 may generate a control value for adjusting a value of a circuit element (for example, a phase shifter, an attenuator) based on the detected signal. Furthermore, the digital controller 1650 may adjust a circuit element value of the RF chains 1660 (a module or a channel) through the SPI 1640 according to the control value.

In other words, in an active analogue beamforming structure as shown in FIG. 16, a self-calibration function may be implemented to reduce a relative error between channels (that is, the RF chains). For example, the digital controller 1650 may perform the self-calibration function by measuring an S-parameter between channels, and controlling a value of the phase shifter and/or the attenuator on a bit basis in order to reduce an error between channels.

The device and the method according to various embodiments of the disclosure may measure electrical characteristics (for example, an S-parameter) of an individual circuit, which operates in a millimeter wave band, in a low-frequency band, by using an inter modulation phenomenon of a diode. Accordingly, according to various embodiments of the disclosure, functions necessary for measuring a circuit operating in a high frequency band may be included in a chip, and a cost required to measure and test may be noticeably reduced.

When a measurement circuit according to various embodiments of the disclosure is used for designing a multiple input, multiple output (MIMO) antenna system, a test using a probe may not be required for every channel, and a time required to measure and test may be noticeably reduced. In addition, since a plurality of channels are measured simultaneously according to various embodiments of the disclosure, the measurement device and/or the method according to various embodiments of the disclosure may be utilized as a self-calibration function for reducing a relative error between channels. For example, by reducing a relative error between channels, exact and precise analogue beamforming and/or beam tracing is possible, and a problem of nonuniformity of performance that a millimeter wave application system has may be solved.

Methods based on the claims or the embodiments disclosed in the disclosure may be implemented in hardware, software, or a combination of both.

When implemented in software, a computer readable storage medium for storing one or more programs (software modules) may be provided. The one or more programs stored in the computer readable storage medium are configured for execution performed by one or more processors in an electronic device. The one or more programs include instructions for allowing the electronic device to execute the methods based on the claims or the embodiments disclosed in the disclosure.

The program (the software module or software) may be stored in a random access memory, a non-volatile memory including a flash memory, a read only memory (ROM), an electrically erasable programmable read only memory (EEPROM), a magnetic disc storage device, a compact disc-ROM (CD-ROM), digital versatile discs (DVDs) or other forms of optical storage devices, and a magnetic cassette. Alternatively, the program may be stored in a memory configured in combination of all or some of these storage media. In addition, the configured memory may be plural in number.

Further, the program may be stored in an attachable storage device capable of accessing the electronic device through a communication network such as the Internet, an Intranet, a local area network (LAN), a wide LAN (WLAN), or a storage area network (SAN) or a communication network configured by combining the networks. The storage device may access via an external port to a device which performs the embodiments of the disclosure. In addition, an additional storage device on a communication network may access to a device which performs the embodiments of the disclosure.

In the above-described specific embodiments of the disclosure, elements included in the disclosure are expressed in singular or plural forms according to specific embodiments. However, singular or plural forms are appropriately selected according to suggested situations for convenience of explanation, and the disclosure is not limited to a single element or plural elements. An element which is expressed in a plural form may be configured in a singular form or an element which is expressed in a singular form may be configured in plural number.

While specific embodiments have been described in the detailed descriptions of the disclosure, it will be understood by those skilled in the art that various changes may be made therein without departing from the spirit and scope of the disclosure. Therefore, the scope of the disclosure should be defined not by the described embodiments but by the appended claims or the equivalents to the claims.

The invention claimed is:

1. A measurement device comprising:
a signal generator configured to generate a test signal comprising a component signal of a first frequency and a component signal of a second frequency; and
a measurement controller configured to: input the generated test signal to a radio frequency (RF) chain comprising at least one circuit element; detect output signals of a first diode, a second diode, and a third diode which receive, as input signals, signals generated based on a coupled signal regarding an input test signal of a circuit element of the at least one circuit element, and based on a coupled signal regarding an output test signal of the circuit element; and measure an S-parameter regarding the circuit element, based on a component signal of a third frequency in the output signal of the first diode, a component signal of the third frequency in the output signal of the third diode, and the output signal of the second diode,
wherein the coupled signal regarding the input test signal of the circuit element is divided into the input signal of the first diode and a first input signal by a first power divider,
wherein the coupled signal regarding the output test signal of the circuit element is divided into the input signal of the third diode and a second input signal by a second power divider,
wherein the input signal of the second diode is a combined signal that is generated by a power combiner based on the first input signal and the second input signal,
wherein the third frequency is a difference between the first frequency and the second frequency.

2. The measurement device of claim 1, wherein the measurement controller is configured to determine a size of the S-parameter of the circuit element, based on a ratio of a size of the component signal of the third frequency in the output signal of the third diode to a size of the component signal of the third frequency in the output signal of the first diode.

3. The measurement device of claim 2, wherein the first input signal and the second input signal are combined by the power combiner to form the input signal of the second diode, and
wherein the measurement controller is configured to: determine a phase of the component signal of the third frequency in the output signal of the first diode and a phase of the component signal of the third frequency in the output signal of the third diode; determine a ratio between a size of an in-phase component signal of the third frequency in the output signal of the second diode and a size of a quadrature phase component signal of the third frequency, based on the size of the S-parameter regarding the circuit element, the phase of the component signal of the third frequency in the output signal of the first diode, and the phase of the component signal of the third frequency in the output signal of the third diode; and determine a phase of the S-parameter regarding the circuit element, based on the ratio between the size of the in-phase component signal of the third frequency in the output signal of the second diode and the size of the quadrature phase component signal of the third frequency.

4. The measurement device of claim 1, wherein the component signal of the first frequency in the first input signal and the component signal of the second frequency in the second input signal are combined by the power combiner to form the input signal of the second diode, and
wherein the measurement controller is configured to: determine a phase of the component signal of the third frequency in the output signal of the first diode or a phase of the component signal of the third frequency in the output signal of the third diode; and determine a phase of the S-parameter regarding the circuit element, by subtracting the phase of the component signal of the third frequency in the output signal of the first diode or the phase of the component signal of the third frequency in the output signal of the third diode, from the phase of the component signal of the third frequency in the output signal of the second diode.

5. The measurement device of claim 4, wherein the component signal of the first frequency in the first input signal is acquired by a band pass filter (BPF) which allows a signal of the first frequency to pass therethrough and rejects a signal of the second frequency, and
wherein the component signal of the second frequency in the second input signal is acquired by a band pass filter which rejects the signal of the first frequency and allows the signal of the second frequency to pass therethrough.

6. The measurement device of claim 1, wherein power of the coupled signal regarding the input test signal of the circuit element is a sum of power of the input signal of the first diode and power of the first input signal, and
wherein power of the coupled signal regarding the output test signal of the circuit element is a sum of power of the input signal of the third diode and power of the second input signal.

7. The measurement device of claim 1, wherein each of the first diode, the second diode, and the third diode is configured to inter-modulate the component signal of the first frequency and the component signal of the second frequency and to generate an output signal comprising the component signal of the third frequency.

8. The measurement device of claim 1, further comprising the RF chain.

9. The measurement device of claim 1, wherein the measurement controller is configured to adjust at least one bit value for calibrating the circuit element, based on the S-parameter regarding the circuit element.

10. The measurement device of claim 1, wherein the first frequency and the second frequency are frequencies in a millimeter wave band, and
wherein the third frequency is a frequency in a low-frequency band.

11. An operating method of a measurement device, the method comprising:
generating a test signal comprising a component signal of a first frequency and a component signal of a second frequency;
inputting the generated test signal to a radio frequency (RF) chain comprising at least one circuit element;
detecting output signals of a first diode, a second diode, and a third diode which receive, as input signals, signals generated based on a coupled signal regarding an input test signal of a circuit element of the at least one circuit element, and based on a coupled signal regarding an output test signal of the circuit element; and
measuring an S-parameter regarding the circuit element, based on a component signal of a third frequency in the output signal of the first diode, a component signal of the third frequency in the output signal of the third diode, and the output signal of the second diode,
wherein the coupled signal regarding the input test signal of the circuit element is divided into the input signal of the first diode and a first input signal by a first power divider,
wherein the coupled signal regarding the output test signal of the circuit element is divided into the input signal of the third diode and a second input signal by a second power divider,
wherein the input signal of the second diode is a combined signal that is generated by a power combiner based on the first input signal and the second input signal,
wherein the third frequency is a difference between the first frequency and the second frequency.

12. The method of claim 11, wherein determining the S-parameter comprises determining a size of the S-parameter of the circuit element, based on a ratio of a size of the component signal of the third frequency in the output signal of the third diode to a size of the component signal of the third frequency in the output signal of the first diode.

13. The method of claim 12, wherein the first input signal and the second input signal are combined by the power combiner to form the input signal of the second diode, and
wherein measuring the S-parameter comprises:
determining a phase of the component signal of the third frequency in the output signal of the first diode and a phase of the component signal of the third frequency in the output signal of the third diode;
determining a ratio between a size of an in-phase component signal of the third frequency in the output signal of the second diode and a size of a quadrature phase component signal of the third frequency, based on the size of the S-parameter regarding the circuit element, the phase of the component signal of the third frequency in the output signal of the first diode, and the phase of the component signal of the third frequency in the output signal of the third diode; and
determining a phase of the S-parameter regarding the circuit element, based on the ratio between the size of the in-phase component signal of the third frequency in the output signal of the second diode and the size of the quadrature phase component signal of the third frequency.

14. The method of claim 11, wherein the component signal of the first frequency in the first input signal and the component signal of the second frequency in the second input signal are combined by the power combiner to form the input signal of the second diode, and
wherein determining the S-parameter comprises:
determining a phase of the component signal of the third frequency in the output signal of the first diode or a phase of the component signal of the third frequency in the output signal of the third diode; and
determining a phase of the S-parameter regarding the circuit element, by subtracting the phase of the component signal of the third frequency in the output signal of the first diode or the phase of the component signal of the third frequency in the output signal of the third diode, from the phase of the component signal of the third frequency in the output signal of the second diode.

15. The method of claim 14, wherein the component signal of the first frequency in the first input signal is acquired by a band pass filter (BPF) which allows a signal of the first frequency to pass therethrough and rejects a signal of the second frequency, and
wherein the component signal of the second frequency in the second input signal is acquired by a band pass filter which rejects the signal of the first frequency and allows the signal of the second frequency to pass therethrough.

16. The method of claim 11, wherein power of the coupled signal regarding the input test signal of the circuit element is a sum of power of the input signal of the first diode and power of the first input signal, and
wherein power of the coupled signal regarding the output test signal of the circuit element is a sum of power of the input signal of the third diode and power of the second input signal.

17. The method of claim 11, wherein each of the first diode, the second diode, and the third diode is configured to inter-modulate the component signal of the first frequency and the component signal of the second frequency and to generate an output signal comprising the component signal of the third frequency.

18. The method of claim 11, further comprising the RF chain.

19. The method of claim 11, further comprising adjusting at least one bit value for calibrating the circuit element, based on the S-parameter regarding the circuit element.

20. The method of claim 11, wherein the first frequency and the second frequency are frequencies in a millimeter wave band, and
wherein the third frequency is a frequency in a low-frequency band.

* * * * *